(12) United States Patent
Shinohara

(10) Patent No.: US 6,998,565 B2
(45) Date of Patent: Feb. 14, 2006

(54) PLASMA PROCESSING APPARATUS

(75) Inventor: Toshikuni Shinohara, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 82 days.

(21) Appl. No.: 10/707,989

(22) Filed: Jan. 30, 2004

(65) Prior Publication Data

US 2004/0206729 A1 Oct. 21, 2004

(30) Foreign Application Priority Data

| Jan. 30, 2003 | (JP) | ........................... | 2003-022072 |
| Jan. 30, 2003 | (JP) | ........................... | 2003-022073 |
| Jan. 30, 2003 | (JP) | ........................... | 2003-022074 |
| Jan. 30, 2003 | (JP) | ........................... | 2003-022075 |
| Jan. 30, 2003 | (JP) | ........................... | 2003-022076 |

(51) Int. Cl.
*B23K 9/00* (2006.01)

(52) U.S. Cl. ..................... 219/121.43; 219/121.59; 219/680

(58) Field of Classification Search ............ 219/121.41, 219/121.43, 121.59, 678–680; 118/723 MW, 118/723 AN, 723 E, 723 ME, 723 MP, 723 R, 118/723 ER, 723 MR, 723 MA, 718, 719; 156/345

See application file for complete search history.

(56) References Cited

U.S. PATENT DOCUMENTS

| 5,647,944 | A | * | 7/1997 | Tsubaki et al. | ........ | 156/345.41 |
| 5,698,036 | A | | 12/1997 | Ishii et al. | | |
| 6,043,608 | A | * | 3/2000 | Samukawa et al. | ..... | 315/111.51 |
| 6,101,970 | A | * | 8/2000 | Koshimizu | .............. | 118/723 E |
| 6,325,018 | B1 | | 12/2001 | Hongoh | | |
| 6,677,549 | B1 | * | 1/2004 | Suzuki et al. | .......... | 219/121.41 |
| 2001/0050058 | A1 | | 12/2001 | Yamamoto et al. | | |
| 2002/0079294 | A1 | | 6/2002 | Tadera et al. | | |
| 2002/0123200 | A1 | | 9/2002 | Yamamoto et al. | | |
| 2004/0071613 | A1 | * | 4/2004 | Goto et al. | ............ | 422/186.04 |

FOREIGN PATENT DOCUMENTS

| JP | H05-129095 A | 5/1993 |
| JP | H08-241797 A | 9/1996 |
| JP | H08-274083 A | 10/1996 |
| JP | H8-316198 | 11/1996 |
| JP | H10-255998 A | 9/1998 |
| JP | H10-275696 A | 10/1998 |
| JP | H11-26190 A | 1/1999 |
| JP | H11-067492 A | 3/1999 |
| JP | 2002-50615 A | 2/2002 |

\* cited by examiner

*Primary Examiner*—Tu Hoang
(74) *Attorney, Agent, or Firm*—Shijjyu Global IP

(57) ABSTRACT

A plasma processing apparatus includes a first dielectric that is connected to a microwave generating unit, the first dielectric having a section that extends along a surface of a rectangular sample, and that makes an electric field strength distribution of the microwaves generated from the microwave generating unit substantially uniform along the surface of the sample; a slot plate that is provided below the first dielectric and in which a plurality of first slots are formed, the slot plate retaining or further enhancing the uniformity of the electric field strength distribution of the microwaves in the first dielectric; a second dielectric that is provided below the slot plate and that retains or further enhances the uniformity of the electric field strength distribution of the microwaves supplied from the slot plate; and a processing unit that processes the sample using a plasma generated in the reaction vessel by the microwaves.

49 Claims, 46 Drawing Sheets

PLASMA PROCESSING APPARATUS

BACKGROUND OF INVENTION

1. Field of the Invention

The present invention relates to a plasma processing apparatus utilizing plasma generated by microwaves.

2. Description of the Related Art

In recent years, ICs (integrated circuits) have become smaller and smaller and the diameter of wafers have become larger and larger, which requires formation of uniform thin films having a large diameter. In particular, gate oxide films should be formed so as to be thin and uniform, because they affect the characteristics of ICs. Therefore, thin films such as gate oxide films are formed with a plasma processing apparatus using microwaves (e.g., 2.45 GHz). In a plasma processing apparatus that uses microwaves, plasma having a high density and a low electron temperature can be obtained with high frequency microwaves. This allows the effects of thin films such as gate oxide films on electrical breakdown or physical breakdown to be suppressed. Thus, when microwaves are used, thin films causing little damage can be formed efficiently. However, the wavelength of the microwaves is about the same size as the wafer diameter, so that when forming uniform thin films having a large diameter using microwaves, the films are susceptible to the properties of the waves (as described below).

Furthermore, in order to uniformly form thin films having a large diameter, a method is used that utilizes the ability of microwaves to be reflected and absorbed by plasma in order to makes the plasma reflect and absorb non-uniform microwaves. In this method, for example, a uniform thin film is formed by introducing microwaves only from the outside of a round or cylindrical processing chamber to introduce non-uniform microwaves, and plasma is allowed to absorb the non-uniform microwaves in order to obtain balance. In addition, another method is disclosed in which an introduction window from which microwaves are introduce is branched, and microwaves are introduced uniformly to a dielectric in a processing apparatus in order to form thin films having a large diameter (e.g., see JP 8-316198A).

Furthermore, in order to form uniform thin films having a large diameter, a slot plate for uniformly introducing microwaves to a dielectric is used in such a plasma apparatus. By using the slot plate, the microwaves become uniform, and the plasma generated by the microwaves becomes uniform. This uniform plasma makes it possible for the gas to be separated and excited uniformly so that a uniform thin film can be formed. For the slot plate, a thin metal plate is used in order to prevent protrusions that may be produced when forming a rectangular slot that serves as an introduction window for microwaves, prevent disturbances in the electric field strength distribution of the microwaves due to the thickness of the slot plate, and the like. In situations in which a thin metal plate is used, when the degree of coupling of the microwaves introduced from the thin metal plate is too large, electric sparks, anomalous discharges, or other problems will be produced. Therefore, the length of the long sides of the slots (hereinafter referred to as slot length) of the slot plate is set to be sufficiently shorter than half of the wavelength of the microwaves above the slot plate.

In situations in which microwaves are introduced to a dielectric from the slots of an antenna, a technique for reducing the thickness of the antenna is disclosed in order to increase the electric field strength of the microwaves introduced to a dielectric from slots having a slot length sufficiently shorter than a half of the wavelength of the microwaves propagating in the antenna (e.g., see JP 2002-50615A).

In the plasma processing apparatus, a dielectric or the like that is a region in which microwaves for generating plasma propagation is formed in a cylindrical or a round shape that matches the shape of a sample (e.g., silicon wafer). For this reason, as shown in FIG. 46, the microwaves are reflected from a wall surface 14 in the cylindrical propagation region in a direction in which the microwaves gather or are distributed. This is because the wave properties of the microwaves are dominant. FIG. 47 is the electric field strength distribution of the microwaves in the cylindrical propagation region, showing that the electric field strength distribution of the microwaves non-uniformly concentrates on the central portion in the cylindrical region. Therefore, the microwaves that are non-uniform in the cylindrical propagation region result in a non-uniform plasma, and a thin film is formed by this non-uniform plasma. This makes it difficult to form a uniform thin film. Moreover, as the diameter of the wafer is increased, the propagation region of the microwaves that generate plasma is increased, so that the concentration of the electric field strength distribution of the microwaves becomes significant, which makes it more difficult to generate a uniform plasma.

Furthermore, in the aforementioned method in which the non-uniform microwaves are uniformalized by a plasma absorption, it is difficult to maintain a balance between changes in the process conditions such as the flow rate and the composition ratio of gas, the pressure, and the sample temperature. Therefore, it is necessary to set the process conditions in accordance with the processing procedure, and difficult to maintain microwave uniformity. In addition, the process margins are small, that is, for example, even a small change in conditions caused by, for example, maintenance can change the process conditions.

In the method disclosed in JP 8-316198A, microwaves are introduced to a dielectric inside one processing chamber via a plurality of introduction windows, and therefore the microwaves introduced from each introduction window interfere with each other and become non-uniform. Such non-uniform microwaves generates a non-uniform plasma, which makes it difficult to perform uniform processing with respect to a sample surface because gas molecules are excited and activated by the non-uniform plasma.

In the method of uniformly introducing microwaves in a plasma apparatus to a dielectric with a slot plate, a thin slot plate or antenna that is formed with metal is used, and therefore heat generated during plasma generation is easily dissipated, so that the temperature in the plasma apparatus is increased and the slot plate is deformed by heat, resulting in distortion. Thus, a change in the characteristics such as a change in the transmission of the microwaves and deterioration of the uniformity of the microwaves will be caused by the slots.

Furthermore, there is an additional problem with respect to the recent demand for the miniaturization of ICs and an increase in the diameter of wafers. It is difficult to perform uniform processes with respect to a sample when performing processes such as film-formation, etching, ashing, sputtering, or cleaning in a conventional gas supply system. For example, when performing a film formation process or the like, a processing gas is introduced from a gas introduction portion to a processing chamber. At this point, microwaves enter the gas introduction portion from the processing chamber, and anomalous discharge or abnormal growth of films occurs in the gas introduction portion. Furthermore, since the gas introduction portion is formed by providing openings in the processing chamber, the microwaves in the processing chamber become non-uniform because of the non-uniform supply of gas, resulting in non-uniform plasma. This makes it difficult to perform uniform processing with respect to a sample.

SUMMARY OF INVENTION

It is an object of the present invention to provide a plasma processing apparatus that can perform uniform processing with respect to a surface of a sample to be processed.

It is another object of the present invention to provide a plasma processing apparatus that can increase process margins.

It is yet another object of the present invention to provide a plasma processing apparatus having a slot plate that prevents the characteristics of the microwaves from being changed while reducing heat deformation distortion caused by heat.

It is yet another object of the present invention to provide a plasma generating apparatus that can uniformly introduce gas.

It is yet another object of the present invention to provide a plasma generating apparatus that can prevent the occurrence of anomalous discharge or abnormal growth of films.

In order to achieve the aforementioned objects, a first aspect of the present invention is a plasma processing apparatus for performing plasma processing with respect to a sample in a reaction vessel, comprising:

microwave generating means that generate microwaves;

a first dielectric that is connected to the microwave generating means, the first dielectric having a rectangular section that extends along the surface of the sample to be processed, and which makes an electric field strength distribution of the microwaves generated from the microwave generating means substantially uniform along the surface of the sample to be processed;

a slot plate that is provided between the reaction vessel and the first dielectric and having a plurality of first slots formed therein, the slot plate maintaining or further enhancing the uniformity of the electric field strength distribution of the microwaves in the first dielectric;

a second dielectric that is provided between the slot plate and the reaction vessel and which retains or further enhances the uniformity of the electric field strength distribution of the microwaves supplied from the slot plate; and processing means that processes the sample using plasma generated in the reaction vessel by the microwaves.

In this plasma processing apparatus, a section of the first dielectric in which microwaves propagate is rectangular, and thus the electric field strength distribution of the microwaves is substantially uniform as a whole along the surface of the sample to be processed (hereinafter referred to as simply uniform), and a uniform plasma will be generated. Thus, gas molecules excited and activated by this plasma allow uniform thin film formation or etching. Furthermore, even if process conditions such as the flow rate or the composition ratio of the gas are changed or the process conditions are changed by maintenance or the like, it will be rare for the electric field strength distribution of the microwaves to concentrate in a particular portion because the region in which the microwaves propagate is rectangular. Therefore, process margins can be increased.

A second aspect of the present invention is the plasma processing apparatus of the first aspect, wherein a section of the second dielectric that extends along the surface of the sample to be processed is rectangular. The microwaves can be easily made uniform by forming the second dielectric into a rectangular shape.

A third aspect of the present invention is the plasma processing apparatus of the first aspect, wherein a section of the reaction vessel that extends along the surface of the sample to be processed is formed into a rectangular shape. The electric field strength distribution of the microwaves introduced from the second dielectric and propagating in the reaction vessel without being absorbed by the plasma can be made uniform by forming the reaction vessel into a rectangular shape. Thus, disturbances in the plasma due to non-uniform microwaves can be reduced.

A fourth aspect of the present invention is the plasma processing apparatus of the first aspect, wherein the microwave generating means include an antenna in which a section thereof that extends along the surface of the sample to be processed is rectangular, and the antenna is in contact with the first dielectric. When a rectangular antenna is used, a large amount of power will not be concentrated on one point, and thus changes in characteristics such as heat generation or anomalous discharge will rarely occur and stable attachment can be achieved.

A fifth aspect of the present invention is the plasma processing apparatus of the first aspect, wherein the first slots have substantially the same size and the same shape and are arranged in substantially the same direction, and the distance $L_1$ between the centers of adjacent first slots substantially satisfies Equation 1 below.

$$L_1 = n_{L1} \lambda_1 \quad \text{Equation 1}$$

where $\lambda_1$: wavelength of microwaves in the first dielectric, and $n_{L1}$: an integer of 1 or more.

When microwaves having a wavelength $\lambda_1$ in the first dielectric are introduced to the second dielectric from the first slots whose centers are separated from each other by distance of a multiple of $\lambda_1$, microwaves loss can be minimized and the excitation of uniform plasma can be achieved because the phases of the microwaves in the second dielectric are matched to each other with respect to the central positions of the first slots.

A sixth aspect of the present invention is the plasma processing apparatus of the first aspect, wherein the first slots have substantially the same size and the same shape, and are arranged in a linearly symmetrical manner with respect to either one of the axes that extend along the slot plate and orthogonal to each other, and the distance $L_2$ between the centers of adjacent first slots substantially satisfies Equation 2 below.

$$L_2 = n_{L2}(\lambda_1/2) \quad \text{Equation 2}$$

where $\lambda_1$: wavelength of microwaves in the first dielectric, and $n_{L2}$: an integer of 1 or more Like the fifth aspect, microwaves loss can be minimized, and the excitation of a uniform plasma can be achieved. Furthermore, the mounting density of the first slots can be increased.

A seventh aspect of the present invention is the plasma processing apparatus of the first aspect, wherein two opposing sides of the first dielectric are parallel in a direction that extends along the surface of the sample to be processed, and the distance $L_{d1}$ between the two opposing sides of the first dielectric substantially satisfies Equation 3 below.

$$L_{d1}=n_{d1}(\lambda_1/2) \quad\quad \text{Equation 3}$$

where $\lambda_1$: wavelength of microwaves in the first dielectric, and $n_{d1}$: an integer of 1 or more.

With this configuration, the standing wave condition of the microwaves is satisfied, and the microwaves in the first dielectric are stabilized, in the direction in the first dielectric that extends along the surface of the sample to be processed. Therefore, wave cancellation due to multiple reflection at the wall faces of the microwave propagation region can be reduced, and a uniform plasma can be efficiently generated.

An eighth aspect of the present invention is the plasma processing apparatus of the second aspect, wherein two opposing sides of the second dielectric are parallel in a direction that extends along the surface of the sample to be processed, and the distance $L_{d2}$ between the two opposing sides of the second dielectric substantially satisfies Equation 4 below.

$$L_{d2}=n_{d2}(\lambda_2/2) \quad\quad \text{Equation 4}$$

where $\lambda_2$: wavelength of microwaves in the second dielectric, and $n_{d2}$: an integer of 1 or more.

With this configuration, like that of the seventh aspect, the microwaves in the second dielectric are stabilized, and a uniform plasma can be generated.

A ninth aspect of the present invention is the plasma processing apparatus of the seventh or the eighth aspect, wherein the dielectric constant of the first dielectric is substantially the same as that of the second dielectric. When the dielectric constants are substantially the same, the lengths of the first dielectric and the second dielectric can be matched to each other in the direction that extends along the surface of the sample to be processed, so that a more practical design can be achieved.

A tenth aspect of the present invention is the plasma processing apparatus of the third aspect, wherein two opposing sides of the reaction vessel are parallel in a direction that extends along the surface of the sample to be processed, and the length $L_{p1}$ of the two opposing sides of the reaction vessel substantially satisfies Equation 5 below.

$$L_{p1}=n_{p1}(\lambda_p/2) \quad\quad \text{Equation 5}$$

where $\lambda_p$: wavelength of microwaves in the reaction vessel, and $n_{p1}$: an integer of 1 or more.

With this configuration, like that of the seventh aspect, the microwaves in the reaction vessel are stabilized, and a uniform plasma can be generated.

An eleventh aspect of the present invention is the plasma processing apparatus of the second aspect, wherein two opposing sides of an introduction surface that is in contact with the first dielectric of the microwave generating means are parallel, a plurality of second slots through which the microwaves are introduced from the microwave generating means to the first dielectric are provided in the introduction surface, the central positions of the second slots are alternately arranged on two axes along the two opposing sides of the introduction surface, and the distance $L_5$ between the two axes substantially satisfies Equation 6 below.

$$L_5=n_{L5}(\lambda_1/2) \quad\quad \text{Equation 6}$$

where $\lambda_1$: wavelength of microwaves in the first dielectric, and $n_{L5}$: an integer of 1 or more.

With this configuration, the distance between the central positions of the second slots in the introduction surface of the microwave generating means and the wavelength of the microwaves in the first dielectric can be matched to each other, and the degree of coupling can be increased. Thus, interference such as the canceling of the microwaves introduced to the dielectric via the second slots on the axes can be reduced, the microwaves can be easily made uniform, and a uniform plasma can be generated.

Furthermore, when the axes are linearly symmetrical with respect to the central axis that extends in the direction of the sides of the introduction surface, the degree of coupling between the microwaves introduced from the second slots and the microwaves in the first dielectric is about the same, and thus the microwaves can be easily made uniform.

Furthermore, it is preferable to set the width $W_a$ of the microwave generating means in a direction orthogonal to the axes so as to be substantially equal to the distance $L_5$ between the axes. By setting the width $W_a$ as above, the degree of coupling between the microwaves introduced from the introduction portion and the microwaves in the first dielectric can be increased.

A twelfth aspect of the present invention is the plasma processing apparatus of the eleventh aspect, wherein the distance $L_4$ in the axial direction between the centers of the second slots that are alternately arranged on the two axes substantially satisfies Equation 7 below.

$$L_4=n_{L4}(\lambda_1/2) \quad\quad \text{Equation 7}$$

where $\lambda_1$: wavelength of microwaves in the first dielectric, and $n_{L4}$: an integer of 1 or more.

With this configuration, the phases and the degrees of coupling of the microwaves introduced from the second slots alternately arranged on the two axes to the first dielectric can be matched to each other.

A thirteenth aspect of the present invention is the plasma processing apparatus of the eleventh or the twelfth aspect, wherein the distance D1 between the end faces that extend along the two opposing sides of the introduction surface of the first dielectric and the two axes substantially satisfies Equation 8 below.

$$D1=n_{D1}(1/4)\lambda_1 \quad\quad \text{Equation 8}$$

where $\lambda_1$: wavelength of microwaves in the first dielectric, and $n_{D1}$: an integer of 1 or more.

With this configuration, the coupled portion of the first dielectric and the microwave generating means can have a relationship opposite to choke, and thus a higher degree of coupling therebetween can be obtained. Thus, the microwaves can be easily made uniform.

A fourteenth aspect of the present invention is the plasma processing apparatus of the first aspect, wherein the thickness of the slot plate is 1 mm or more. A slot plate having a thickness of at least 1 mm makes it possible to improve the rigidity thereof and to dissipate heat produced during plasma generation, and to prevent the characteristics thereof from being changed by heat deformation or the like. In addition, the concentration of an electric field in the first slots in the slot plate is reduced, so that problems such as electric sparks or anomalous discharge can be reduced.

A fifteenth aspect of the present invention is the plasma processing apparatus of the fourteenth aspect, wherein the thickness of the slot plate is 3 mm or more. A slot plate having a thickness of at least 3 mm makes it possible to further improve the heat dissipation characteristics and the stiffness thereof, so that more stable device characteristics can be obtained.

A sixteenth aspect of the present invention is the plasma processing apparatus of the fourteenth or the fifteenth aspect, in which the first slots of the slot plate are rectangular, and the length $L_7$ of the longer sides of the first slots substantially satisfies Equation 9 below.

$$L_7 \geq (3/8)\lambda_1 \qquad \text{Equation 9}$$

where $\lambda_1$: wavelength of microwaves in the first dielectric.

With this configuration, even if the thickness of the slot plate is large, dampening of the microwaves by the first slots can be prevented, and the degree of coupling between the microwaves in the first dielectric that have passed through the slot plate and the microwaves in the second dielectric can be improved.

A seventeenth aspect of the present invention is the plasma processing apparatus of the sixteenth aspect, wherein the length $L_7$ of the longer sides of the first slots substantially satisfies Equation 10 below.

$$L_7 \geq (1/2)\lambda_1 \qquad \text{Equation 10}$$

where $\lambda_1$: wavelength of microwaves introduced to the slot plate.

With this configuration, even if the thickness of the slot plate is large, dampening of the microwaves by the first slots can be prevented, and the transmission characteristics of the microwaves can be improved. Therefore, the degree of coupling between the microwaves in the first dielectric that have passed through the slot plate and the microwaves in the second dielectric can be further improved.

An eighteenth aspect of the present invention is the plasma processing apparatus of the seventeenth aspect, wherein the length $L_7$ of the longer sides of the first slots substantially satisfies Equation 11 below.

$$L_7 = (1/2)\lambda_1 \qquad \text{Equation 11}$$

where $\lambda_1$: wavelength of microwaves introduced to the slot plate.

With this configuration, the length of the longer sides of the first slots become substantially the resonance length of the wavelength of the microwaves introduced to the slot plate. Therefore, even if the length of the shorter sides of the first slots is small, a higher degree of coupling can be obtained without disturbing the distribution of the microwaves while efficiently increasing the transmission of the microwaves. Moreover, it is more preferable that the distance $L_{77}$ between adjacent first slots in the longer side direction of the first slots substantially satisfies the equation $L_{77}=\lambda_1$, because the phases of the microwaves introduced from each of the first slots to the second dielectric are matched to those from other first slots.

A nineteenth aspect of the present invention is a plasma processing apparatus for performing plasma processing with respect to a sample in a reaction vessel, comprising:

microwave generating means that generate microwaves;

a first dielectric that is connected to the microwave generating means, the first dielectric having a section that is a rectangular shape in which two opposing sides thereof are parallel to each other, and extends along a surface of a sample to be processed and makes the electric field strength distribution of the microwaves generated from the microwave generating means substantially uniform along the surface of the sample to be processed of the sample; and processing means that processes the sample using plasma generated in the reaction vessel by the microwaves.

The distance $L_{d11}$ between the two opposing sides of the first dielectric in a direction that extends along the surface of the sample to be processed substantially satisfies Equation 12 below.

$$L_{d11}=n_{d11}(\lambda_1/2) \qquad \text{Equation 12}$$

where $\lambda_1$: wavelength of microwaves in the first dielectric, and $n_{d11}$: an integer of 1 or more.

In the above-described plasma processing apparatus, a section of the first dielectric in which the microwaves propagate is rectangular and two opposing sides thereof are parallel to each other, the length thereof is set as above, and wave cancellation due to multiple reflection at the end faces of the first dielectric is reduced. Therefore, the electric field strength distribution of the microwaves can become substantially uniform (hereinafter referred to as simply uniform) as a whole along the surface of the sample to be processed, and a uniform plasma is generated. Thus, gas molecules excited and activated by this plasma allow uniform thin film formation or etching. Furthermore, even if process conditions such as the flow rate or the composition ratio of the gas are changed or the process conditions are changed by maintenance or the like, the electric field strength distribution of the microwaves will rarely concentrate on a particular portion. Therefore, process margins can be increased.

A twentieth aspect of the present invention is the plasma processing apparatus of the nineteenth aspect, further comprising:

a slot plate that is provided between the reaction vessel and the first dielectric and in which at least one slot is formed, the slot plate maintaining or further enhancing the uniformity of the electric field strength distribution of the microwaves in the first dielectric;

and a second dielectric that is provided between the slot plate and the reaction vessel, the second dielectric having a section that is a rectangular shape in which two opposing sides are parallel to each other, extends along a surface of a sample to be processed, and maintains or further enhances the uniformity of the electric field strength distribution of the microwaves supplied from the slot plate.

The distance $L_{d22}$ between the two opposing sides of the second dielectric in a direction that extends along the surface of the sample to be processed substantially satisfies Equation 13 below.

$$L_{d22}=n_{d22}(\lambda_2/2) \qquad \text{Equation 13}$$

where $\lambda_2$: wavelength of microwaves in the second dielectric, and $n_{d22}$: an integer of 1 or more.

The second dielectric having the length $L_{d22}$ as above provides the same effect as that of the nineteenth aspect. Moreover, the microwaves also are made uniform by the slot plate.

A twenty-first aspect of the present invention is the plasma processing apparatus of the nineteenth or twentieth aspect, wherein a section of the reaction vessel is a rectangular shape that extends along a surface of the sample to be processed and in which two opposing sides of the reaction vessel are parallel to each other, and the length $L_{p2}$ of the two opposing sides of the reaction vessel substantially satisfies Equation 14 below.

$$L_{p2}=n_{p2}(\lambda_p/2) \qquad \text{Equation 14}$$

where $\lambda_p$: wavelength of microwaves in the reaction vessel, and $n_{p2}$: an integer of 1 or more.

With this configuration, the effects of the multiple reflections of the microwaves in the reaction vessel on the plasma can be reduced, and thus plasma can be generated efficiently.

A twenty-second aspect of the present invention is the plasma processing apparatus of the twentieth aspect, wherein the dielectric constant of the first dielectric is substantially the same as that of the second dielectric. When the dielectric constants are the same, a more practical design can be achieved because the lengths of the first dielectric and the second dielectric in the direction along the surface of the sample to be processed can be matched to each other.

A twenty-third aspect of the present invention is the plasma processing apparatus of the twentieth aspect, wherein the wavelength $\lambda_1$ of the microwave in the first dielectric and the wavelength $\lambda_2$ of the microwave in the second dielectric substantially satisfy Equation 15 below.

$$\lambda_1/2 = m(\tfrac{1}{2})\lambda_2 \qquad \text{Equation 15}$$

where $\lambda_1$: wavelength of the microwaves in the first dielectric, $\lambda_2$: wavelength of the microwaves in the second dielectric, and m: an integer of 1 or more.

With this configuration, the phases of the microwaves propagating in the dielectrics are substantially matched to each other, and the microwaves can be prevented from interfering and being dampened, and thus a uniform plasma can be generated.

A twenty-fourth aspect of the present invention is the plasma processing apparatus of the twentieth aspect, wherein the wavelength $\lambda_1$ of the microwave in the first dielectric, the wavelength $\lambda_2$ of the microwave in the second dielectric and the wavelength $\lambda_p$ of the microwave in the reaction vessel substantially satisfy Equations 16 and 17 below.

$$\lambda_1/2 = m(\tfrac{1}{2})\lambda_2 \qquad \text{Equation 16}$$

$$\lambda_1/2 = k(\tfrac{1}{2})\lambda_P \qquad \text{Equation 17}$$

where $\lambda_1$: wavelength of the microwaves in the first dielectric, $\lambda_2$: wavelength of the microwaves in the second dielectric, $\lambda_p$: wavelength of the microwaves in the reaction vessel, and m, k: an integer of 1 or more.

The phases of the microwaves in the first dielectric, the second dielectric and the reaction vessel are substantially matched to each other, and the same effect as that of the twenty-third aspect can be obtained.

A twenty-fifth aspect of the present invention is a plasma processing apparatus for performing plasma processing with respect to a sample in a reaction vessel, comprising:

microwave generating means for generating microwaves;

a dielectric that is connected to the microwave generating means, is formed into a plate-like shape that extends along a surface of the sample to be processed, and makes an electric field strength distribution of the microwaves generated from the microwave generating means substantially uniform along the surface of the sample to be processed; and processing means that processes the sample using plasma generated in the reaction vessel by the microwaves.

A plurality of introduction portions through which the microwaves are introduced from the microwave generating means to the dielectric are provided in a surface that is in contact with the dielectric of the microwave generating means (hereinafter, referred to as the introduction surface), the central positions of the introduction portions are arranged on a plurality of axes on the introduction surface that extend in the same direction, and antinodes or nodes of the microwaves in the dielectric are positioned at each position of the axes.

With this configuration, the phases of the microwaves in the dielectrics can be matched to each other with respect to the central positions of the introduction portions in the introduction surface of the microwave generating means. Thus, interference such as the canceling of the microwaves introduced to the dielectric via the introduction portions on the axes can be reduced, and the microwaves can be easily made uniform (uniform in the following description refers to substantially uniform along the surface of a sample to be processed), and a uniform plasma can be generated. In addition, the degree of coupling between the microwaves introduced from the introduction portions on the axes to the dielectric and the microwaves in the dielectric can be increased.

A twenty-sixth aspect of the present invention is the plasma processing apparatus of the twenty-fifth aspect, wherein the dielectric is formed such that the cross-section thereof that extends along the surface of the sample to be processed is rectangular, and the distance $L_8$ between the axes substantially satisfies Equation 18 below.

$$L_8 = n_{L8}(\lambda_1/2) \qquad \text{Equation 18}$$

where $\lambda_1$: wavelength of the microwaves in the dielectric, and $n_{L8}$: an integer of 1 or more.

When the cross-section of the dielectric in which the microwaves propagate is rectangular as described above, the electric field strength distribution of the microwaves can become substantially uniform as a whole along the surface of the sample to be processed, and a uniform plasma will be generated. Thus, gas molecules excited and activated by this plasma allow uniform thin film formation or etching. Furthermore, even if process conditions such as the flow rate or the composition ratio of the gas are changed or the process conditions are changed by maintenance or the like, the electric field strength distribution of the microwaves will rarely concentrate on a particular portion because the region in which the microwaves propagate is rectangular. Therefore, process margins can be increased.

A twenty-seventh aspect of the present invention is the plasma processing apparatus of the twenty-sixth aspect, wherein the dielectric is formed such that a section thereof that extends along the surface of the sample to be processed is rectangular or square, and the axes extend in a direction along two opposing sides of the dielectric. With this configuration, the microwaves in the dielectric can be more uniform.

A twenty-eighth aspect of the present invention is the plasma processing apparatus of the twenty-seventh aspect, wherein the introduction surface is formed into a rectangular or square shape, and the axes are linearly symmetrical with respect to the central axis that extends toward the sides of the introduction surface.

With this configuration, the degree of coupling between the microwaves introduced from the introduction portions and the microwaves in the dielectric can be about the same, which facilitates uniform microwaves.

In addition, it is preferable that the width $W_b$ of the microwave generating means in the direction orthogonal to the axes is set so as to be substantially equal to $L_8$. By setting the width $W_b$ as above, the degree of coupling between the microwaves introduced from the introduction portions and the microwaves in the dielectric can be increased.

A twenty-ninth aspect of the present invention is the plasma processing apparatus of the twenty-ninth aspect, wherein the distance D2 between an end face of the dielectric and the axes substantially satisfies Equation 19 below.

$$D2 = n_{D2}(1/4)\lambda_1 \quad \text{Equation 19}$$

where $\lambda_1$: wavelength of the microwaves in the dielectric, and $n_{D2}$: an integer of 1 or more.

With this configuration, the coupled portion of the dielectric and the microwave generating means can have a relationship opposite to choke, so that a higher degree of coupling therebetween can be obtained. Thus, the microwaves can be easily made uniform.

A thirtieth aspect of the present invention is the plasma processing apparatus of the twenty-fifth aspect, wherein a section of the dielectric that extends along the surface of the sample to be processed is rectangular, the introduction portions are alternately arranged on the two axes, and the distance $L_9$ in the axial direction between the centers of the introduction portions alternately arranged on the two axes substantially satisfies Equation 20 below.

$$L_9 = n_{L9}(\lambda_1/2) \quad \text{Equation 20}$$

where $\lambda_1$: wavelength of the microwaves in the dielectric, and $n_{L9}$: an integer of 1 or more.

With this configuration, the phases of the microwaves introduced from the introduction portions arranged alternately on the two axes to the dielectric are matched to each other, which facilitates uniform microwaves.

A thirty-first aspect of the present invention is the plasma processing apparatus of the twenty-sixth aspect, wherein an H-branched waveguide is further provided between the microwave generating means and the dielectric, and the introduction surface is divided into at least two. By using the branched waveguide as above, microwaves can be supplied uniformly to even a large processing apparatus.

A thirty-second aspect of the present invention is the plasma processing apparatus of the thirty-first aspect, wherein when the microwaves introduced from each of the at least two divided introduction surfaces to the dielectric have a phase that is identical to the other introduction surfaces, the distance $L_{10}$ between the introduction portions in adjacent introduction planes substantially satisfies Equation 21 below.

$$L_{10} = 2n_{L10}(\lambda_1/2) \quad \text{Equation 21}$$

where $\lambda_1$: wavelength of the microwaves in the dielectric, and $n_{L10}$: an integer of 1 or more With this configuration, the phases of the microwaves in the dielectric are matched with respect to the introduction surfaces, so that interference such as wave cancellation can be reduced.

A thirty-third aspect of the present invention is the plasma processing apparatus of the thirty-first aspect, wherein when the microwaves introduced from each of the at least two divided introduction surfaces to the dielectric have opposite phases, the distance $L_{10}$ between the introduction portions in adjacent introduction surfaces substantially satisfies Equation 22 below.

$$L_{10} = (2n_{L10}+1)(\lambda_1/2) \quad \text{Equation 22}$$

where $\lambda_1$: wavelength of the microwaves in the dielectric, and $n_{L10}$: an integer of 1 or more The same effect as that of the thirty-third aspect can be obtained.

A thirty-fourth aspect of the present invention is the plasma processing apparatus of the twenty-sixth aspect, wherein an E-branched waveguide is further provided between the microwave generating means and the dielectric, and the introduction surface is divided into at least two. The same effect as that of the thirty-second aspect can be obtained.

A thirty-fifth aspect of the present invention is the plasma processing apparatus of the thirty-fourth aspect, wherein when the microwaves introduced from each of the at least two divided introduction surfaces to the dielectric have identical phases, the distance $L_{10}$ between the introduction portions in adjacent introduction surfaces substantially satisfies Equation 23 below.

$$L_{10} = (2n_{L10}+1)(\lambda_1/2) \quad \text{Equation 23}$$

where $\lambda_1$: wavelength of the microwaves in the dielectric, and $n_{L10}$: an integer of 1 or more The same effect as that of the thirty-second aspect can be obtained.

A thirty-sixth aspect of the present invention is the plasma processing apparatus of the thirty-fourth aspect, wherein when the microwaves introduced from each of the at least two divided introduction surfaces to the dielectric have opposite phases, the distance $L_{10}$ between the introduction portions in adjacent introduction surfaces substantially satisfies Equation 24 below.

$$L_{10} = 2n_{L10}(\lambda_1/2) \quad \text{Equation 24}$$

where $\lambda_1$: wavelength of the microwaves in the dielectric, and $n_{L10}$: an integer of 1 or more.

The same effect as that of the thirty-second aspect can be obtained.

A thirty-seventh aspect of the present invention is a plasma processing apparatus for performing plasma processing with respect to a sample in a reaction vessel, comprising:

microwave generating means for generating microwaves;

a slot plate that is provided between the microwave generating means and the reaction vessel and in which a plurality of slots are formed, and that makes the electric field strength distribution of the microwaves generated from the microwave generating means substantially uniform along the surface of the sample to be processed;

a first dielectric that is provided between the slot plate and the reaction vessel, and maintains or further enhances the uniformity of the electric field strength distribution of the microwaves supplied from the slot plate; and processing means that processes the sample using plasma generated in the reaction vessel by the microwaves.

The thickness of the slot plate is 1 mm or more. When the thickness of the slot plate is 1 mm or more, the stiffness thereof as well as the ability thereof to dissipate heat produced during plasma generation can be improved, and thus the microwaves introduced from the slots will be reduced and problems such as electric sparks or anomalous discharge can be reduced, which it turn makes it easy to keep the microwaves substantially uniform along the surface of the sample to be processed. Hereinafter, the microwaves whose electric field strength distribution is substantially uniform will be referred to as uniform microwaves. In addition, uniform in the following description means substantially uniform in the direction along the surface of the sample to be processed.

A thirty-eighth aspect of the present invention is the plasma processing apparatus of the thirty-seventh aspect, wherein a second dielectric is further provided between the microwave generating means and the slot plate. 9The second dielectric, the slot plate, and the first dielectric reduce the non-uniform microwaves, which facilitates uniform microwaves.

A thirty-ninth aspect of the present invention is the plasma processing apparatus of the thirty-seventh aspect, wherein the thickness of the slot plate is 3 mm or more. A slot plate having a thickness of 3 mm or more can further improve the heat dissipation characteristics and the stiffness thereof.

A fortieth aspect of the present invention is the plasma processing apparatus of the thirty-seventh aspect, wherein the slots of the slot plate are rectangular, and the length $L_{11}$ of the longer sides of the slot substantially satisfies Equation 25 below.

$$L_{11} \geq (3/8)\lambda_A \qquad \text{Equation 25}$$

where $\lambda_A$: wavelength of the microwaves introduced to the slot plate.

With this configuration, even if the thickness of the slot plate is large, dampening of the microwaves by the slots can be prevented, and the degree of coupling between the microwaves that have passed through the slot plate and the microwaves in the first dielectric can be improved.

A forty-first aspect of the present invention is the plasma processing apparatus of the fortieth aspect, wherein the length $L_{11}$ of the longer sides of the slot substantially satisfies Equation 26 below.

$$L_{11} \geq (1/2)\lambda_A \qquad \text{Equation 26}$$

where $\lambda_A$: wavelength of the microwaves introduced to the slot plate.

With this configuration, even if the thickness of the slot plate is large, dampening of the microwaves by the slot can be prevented, and the transmission characteristics of the microwaves can be improved. Therefore, the degree of coupling between the microwaves that have passed through the slot plate and the microwaves in the first dielectric can be improved.

A forty-second aspect of the present invention is the plasma processing apparatus of the forty-first aspect, wherein the length $L_{11}$ of the longer side of the slot substantially satisfies Equation 27 below.

$$L_{11} = (1/2)\lambda_A \qquad \text{Equation 27}$$

where $\lambda_A$: wavelength of the microwaves introduced to the slot plate.

With this configuration, the length of the longer sides of the slots will be substantially the resonance length of the wavelength of the microwaves introduced to the slot plate. Therefore, even if the length of the shorter sides is small, a higher degree of coupling can be obtained without disturbing the distribution of the microwaves while increasing the transmission of the microwaves. Moreover, it is more preferable that the distance $L_{12}$ between the centers of adjacent slots of the longer sides of the slots satisfies substantially the equation $L_{12} = \lambda_A$, because the phases of the microwave introduced from each slot to the first dielectric will be matched to each other.

A forty-third aspect of the present invention is the plasma processing apparatus of the thirty-eighth aspect, wherein sections of the first dielectric and the second dielectric that extend along the surface of the sample to be processed are rectangular.

When sections of the first dielectric and the second dielectric along the surface of the sample to be processed are rectangular, the electric field strength distribution of the microwaves can become substantially uniform as a whole along the surface of the sample to be processed, and a uniform plasma will be generated by the uniform microwaves. Thus, gas molecules excited and activated by this plasma allow uniform thin film formation. Furthermore, even if process conditions such as the flow rate or the composition ratio of the gas are changed or the process conditions are changed by maintenance or the like, the electric field strength distribution of the microwaves will rarely concentrate on a particular portion because the region in which the microwaves propagate is rectangular. Therefore, process margins can be increased.

A forty-fourth aspect of the present invention is the plasma processing apparatus of the forty-third aspect, wherein the slots have substantially the same size and the same shape and are arranged in substantially the same direction, and the distance $L_{13}$ between the centers of adjacent slots substantially satisfies Equation 28 below.

$$L_{13} = n_{L13}\lambda_2 \qquad \text{Equation 28}$$

where $\lambda_2$: wavelength of the microwaves in the second dielectric, and $n_{L13}$: an integer of 1 or more.

When microwaves having a wavelength $\lambda_2$ in the second dielectric are introduced to the first dielectric from the rectangular slots whose centers are separated from each other by a distance of a multiple of $\lambda_2$ and which have the same size and are arranged in the same direction, the phases of the microwaves will be matched in the central positions of the slots in the first dielectric. Therefore, the degree of coupling between the microwaves introduced to the first dielectric and the microwaves propagating in the first dielectric can be increased.

A forty-fifth aspect of the present invention is the plasma processing apparatus of the forty-third aspect, in which the slots have substantially the same size and the same shape and are arranged in a linearly symmetrical manner with respect to either one of the axes that are along the slot plate and orthogonal to each other, and the distance $L_{14}$ between the centers of adjacent slots substantially satisfies Equation 29 below.

$$L_{14} = n_{L14}(\lambda_2/2) \qquad \text{Equation 29}$$

where $\lambda_2$: wavelength of the microwaves in the second dielectric, and $n_{L14}$: an integer of 1 or more.

Like the forty-fifth aspect, the degree of coupling between the microwaves introduced to the first dielectric and the microwaves that propagate in the first dielectric can be increased, and moreover the mounting density of the slots can be increased.

A forty-sixth aspect of the present invention is a plasma processing apparatus comprising:

microwave generating means;

a reaction vessel that is connected to the microwave generating means and in which a plasma is generated by microwaves generated from the microwave generating means;

an introduction channel through which a gas is supplied to the reaction vessel; and at least one nozzle connecting the reaction vessel and the introduction channel.

The transmission T of the microwaves from the reaction vessel to the nozzle substantially satisfies Equation 30 below.

$$L_{g1} \geq -\frac{\ln T}{2\pi\sqrt{\left(\frac{1}{2\alpha_1}\right)^2 - \left(\frac{1}{\lambda_{308}}\right)^2}} \quad \text{Equation 30}$$

where $L_{g1}$: the length of the nozzle in the direction that the gas therein travels, $\alpha_1$: the outer diameter of the nozzle in the direction perpendicular to the direction that the gas therein travels, and $\lambda$: wavelength of the microwaves in the reaction vessel, and lnT: the natural logarithm of T.

When the gas introduction nozzle is designed such that the transmission T satisfies Equation 30, the microwaves are prevented from entering the introduction portion. Therefore, problems such as the occurrence of anomalous discharge or abnormal growth of films in the introduction portion can be reduced, and uniform gas supply can be achieved (uniform in the following description refers to substantially uniform).

A forty-seventh aspect of the present invention is the plasma processing apparatus of the forty-sixth aspect, wherein the ratio of the conductance $C_1$ of a gas in the nozzle and the conductance $C_2$ of a gas in the introduction channel substantially satisfies Equation 31 below.

$$\frac{C_2}{C_1} \geq X \quad \text{Equation 31}$$

where X is the number of the nozzles connected to the introduction channel.

When the ratio of the conductance of gas in the introduction channel and the nozzle is equal to at least the number of nozzles connected to the introduction channel, substantially uniform gas can be supplied from the introduction channel to the reaction vessel via the nozzles.

A forty-eighth aspect of the present invention is the plasma processing apparatus of the forty-seventh aspect, wherein the transmission T is 1% or less. When a microwave blocking structure is achieved in which the transmission T of the microwaves introduced from the reaction vessel via the nozzles is 1% or less, anomalous discharge or abnormal growth of films can be further reduced.

A fourth-ninth aspect of the present invention is the plasma processing apparatus of the forty-sixth aspect, further comprising:

a first dielectric that is connected to the microwave generating means, the first dielectric having a section that extends along a surface of the sample to be processed that is rectangular, and that makes an electric field strength distribution of the microwaves generated from the microwave generating means substantially uniform along the surface of the sample to be subjected to plasma processing in the reaction vessel; and processing means that processes the sample using the plasma.

Since the first dielectric is rectangular, the electric field strength distribution of the microwaves can become substantially uniform as a whole along the surface of the sample to be processed. Therefore, a uniform plasma is generated by the uniform microwaves, and gas molecules excited and activated by this plasma allow uniform thin film formation or etching. Furthermore, even if process conditions such as the flow rate or the composition ratio of the gas are changed or the process conditions are changed by maintenance or the like, the electric field strength distribution of the microwaves will rarely concentrate on a particular portion because the region in which the microwaves propagate is rectangular. Therefore, process margins can be increased.

A fiftieth aspect of the present invention is the plasma processing apparatus of the fortieth aspect, further comprising:

a slot plate that is provided below the first dielectric and in which at least one slot is formed, and that retains or further enhances the uniformity of the electric field strength distribution of the microwaves in the first dielectric; and a second dielectric having a rectangular section that extends along a surface of the sample to be processed, is provided between the slot plate and the reaction vessel, and which maintains or further enhances the uniformity of the electric field strength distribution of the microwaves supplied from the slot plate.

Since the second dielectric is rectangular, plasma can be generated more uniformly. The first dielectric, the slot plate and the second dielectric increase uniformity, so that the uniformity of the microwaves can be easily maintained.

BRIEF DESCRIPTION OF DRAWINGS

FIG. 40 is a perspective view of a rectangular slot plate 736 having a plurality of slots 736a;

DETAILED DESCRIPTION

DESCRIPTION OF THE PREFERRED EMBODIMENTS

Plasma Processing Apparatus

The plasma processing apparatus has a microwave generator, a processing chamber and a microwave propagation region above the processing chamber, and the following processes are performed.

The microwaves generated by the microwave generator propagate in the microwave propagation region, and an electric field is formed in the processing chamber with a gas atmosphere. This electric field and the gas generate a plasma, and using a chemical species generated by the plasma, processes such as film formation, etching, and gas-phase cleaning are performed with respect to a sample in the processing chamber.

Examples of such a plasma processing apparatus utilizing plasma include apparatuses performing oxidation and nitriding with plasma (hereinafter referred to as plasma oxidizing and nitriding apparatus), plasma CVD (chemical vapor deposition) apparatuses, plasma etching apparatuses, plasma ashing apparatuses, plasma cleaning apparatuses, and plasma annealing apparatuses.

Hereinafter, the plasma processing apparatus of the present invention will be described by using a plasma oxidizing and nitriding apparatus as an example.

First Embodiment

Figure 1:
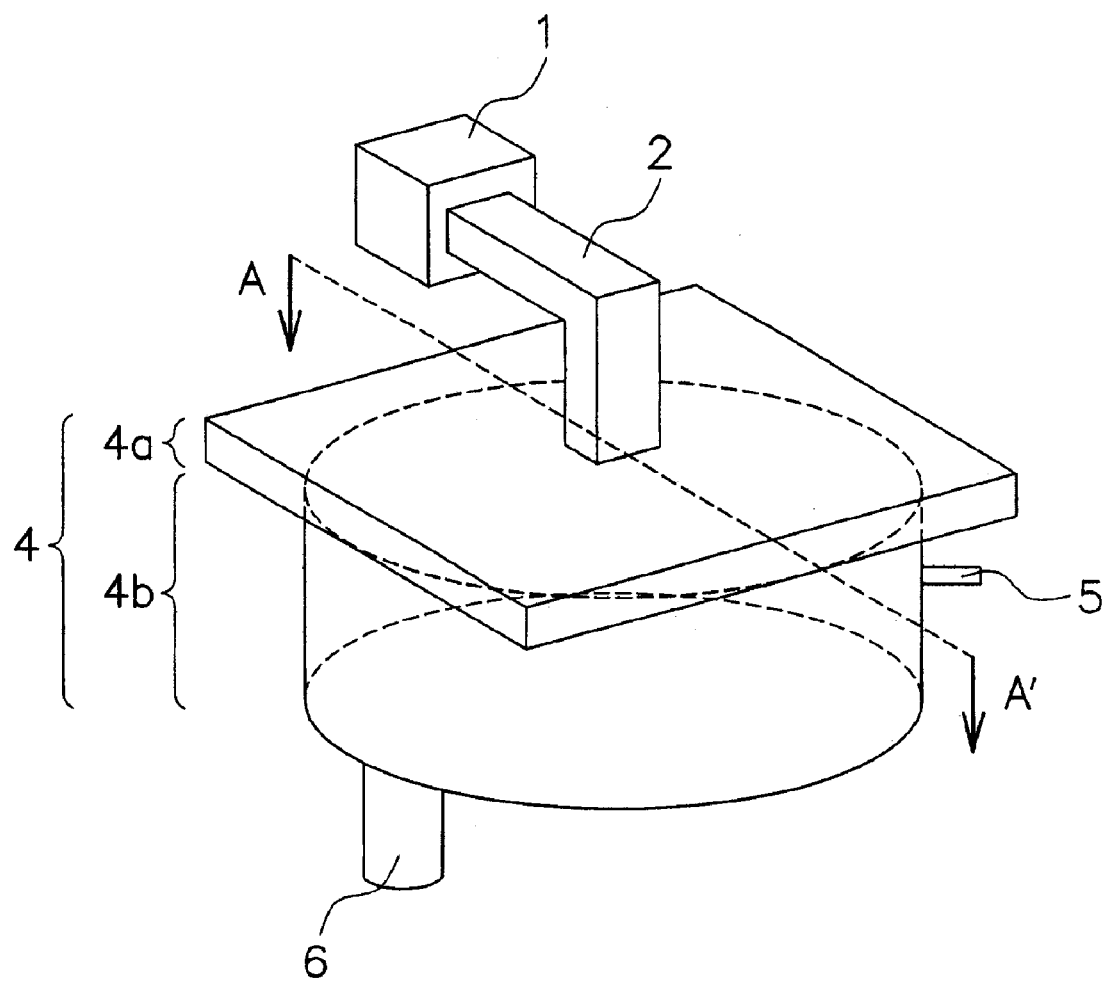
FIG. 1 is an external view of a plasma oxidizing and nitriding apparatus according to a first embodiment of the present invention.
Figure 2:
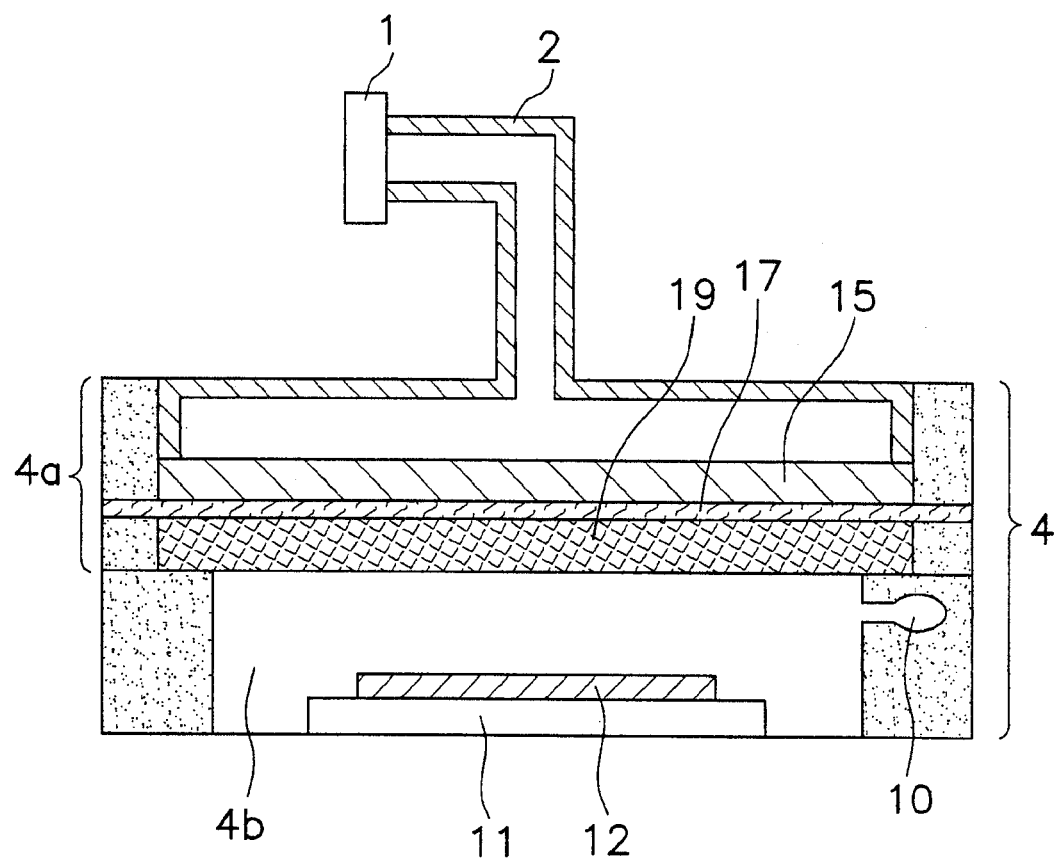
FIG. 2 is a cross-sectional view of the apparatus of FIG. 1 in a direction perpendicular to the surface of a sample to be processed taken along A–A' of FIG. 1.
Figure 3:
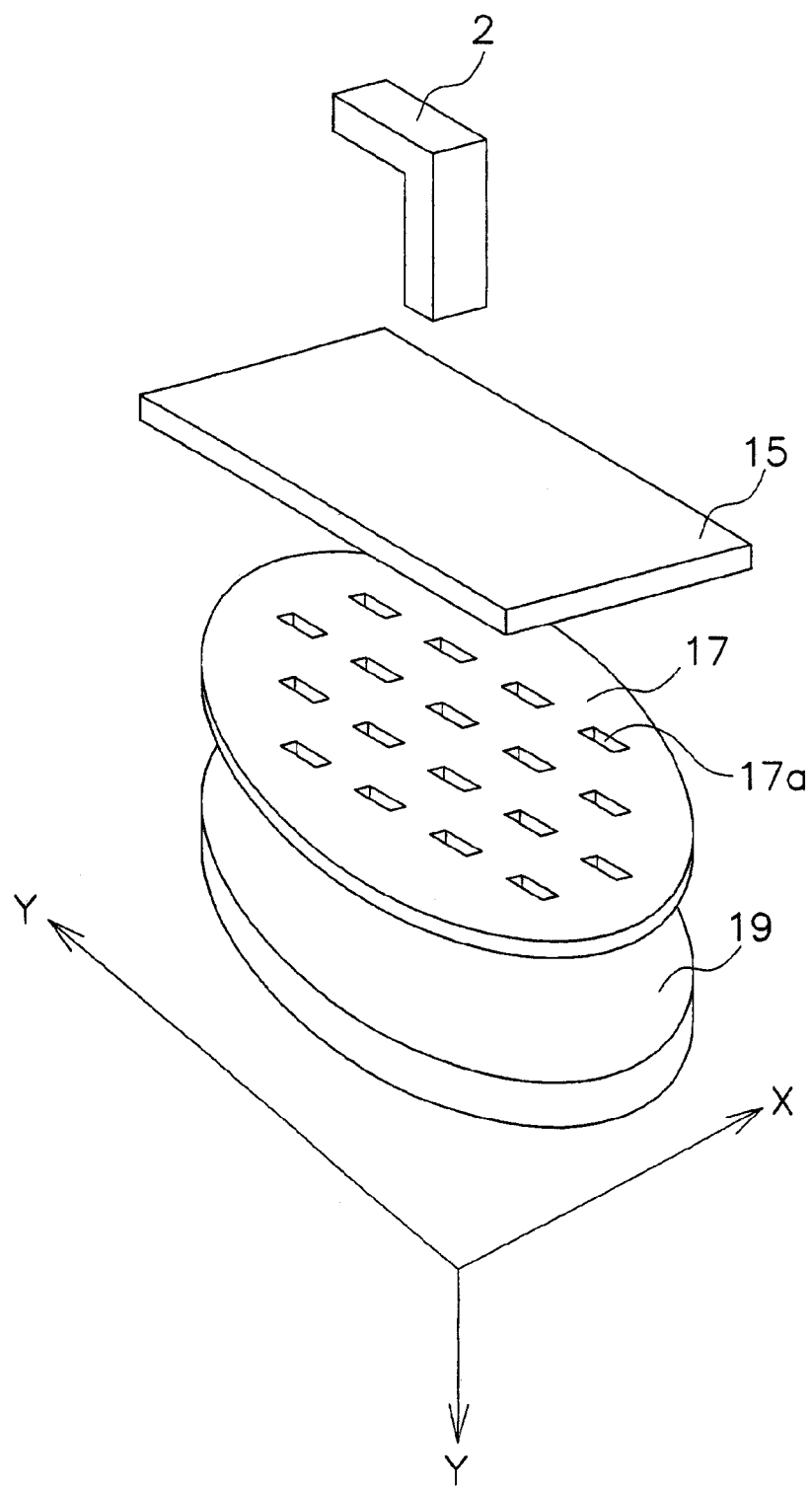
FIG. 3 is an exploded perspective view of portions of the plasma oxidizing and nitriding apparatus shown in FIG. 1.

FIG. 1 is a view showing the external appearance of a plasma oxidizing and nitriding apparatus of a first embodiment. FIG. 2 is a cross-sectional view of the apparatus of FIG. 1 in a direction perpendicular to the surface of a sample to be processed and taken along line A–A' of FIG. 1. FIG. 3 is an exploded perspective view of portions of the plasma oxidizing and nitriding apparatus shown in FIG. 1.

The plasma oxidizing and nitriding apparatus of the first embodiment has a microwave generator 1, a rectangular waveguide 2 and a chamber 4. The chamber 4 is provided with a gas inlet port 5 from which a gas such as a film-forming gas is introduced, and a gas outlet port 6 from which the gas is discharged. The chamber 4 also has a chamber lid having a rectangular shape (hereinafter, referred to as rectangular chamber lid) 4a and a processing chamber having a cylindrical shape (hereinafter, referred to as round processing chamber) 4b. The round processing chamber 4b is provided with a sample platform 11 on which a sample 12 is processed in a position opposite to the rectangular chamber lid 4a. A gas introduction portion 10 through which a gas such as film-forming gas is supplied from the gas inlet port 5 to the round processing chamber 4b is provided in the side face of the round processing chamber 4b. The rectangular chamber lid 4a includes a rectangular dielectric 15 whose cross-section along the surface of the sample 12 to be processed is rectangular (hereinafter, referred to as rectangular antenna dielectric), a slot plate 17 and a sealing dielectric 19 arranged in this order and which cover the round processing chamber 4b from above. The rectangular waveguide 2 and the microwave generator 1 connected to the rectangular waveguide 2 are provided above the chamber 4.

In place of the rectangular waveguide 2, a slot antenna, a coaxial antenna or other antennas can be provided.

The rectangular antenna dielectric 15 is a dielectric for making the electric field strength distribution of microwaves inside thereof substantially uniform in the direction along the surface of the sample 12 to be processed (hereinafter, the phrase microwaves whose electric field strength distribution is substantially uniform are referred to as uniform microwaves. In addition, the term uniform in the following description means substantially uniform in the direction along the surface of the sample 12 to be processed.) In the slot plate 17 below the rectangular antenna dielectric 15, uniform microwaves are introduced uniformly to the sealing dielectric 19 via slots 17a. Furthermore, the slot plate 17 separates the rectangular antenna dielectric 15 from the plasma in the round processing chamber 4b and prevents the plasma from interfering with the microwaves. The sealing dielectric 19 is a dielectric for isolating the round processing chamber 4b (which has a vacuum) from the air. When the cross-section of the sealing dielectric 19 taken along the surface of the sample 12 to be processed is rectangular, the electric field strength distribution of the microwaves easily can be made more uniform.

For the above dielectrics, substances that causes little dielectric loss such as quartz, fluorocarbon resin, polyethylene, and polystyrene are preferable. The dielectric includes those in which the dielectric constant is 1, such as vacuum, air and gas, and also includes those in which at least a part of the surface of the dielectric is covered with a conductor. The slot plate can be formed of a plate of metal such as Cu or Al. In this plasma oxidizing and nitriding apparatus, the film formation process is performed, for example, in the following manner.

First, the round processing chamber 4b is evacuated through the gas outlet port 6 to a predetermined degree of vacuum, and a gas is introduced to the round processing chamber 4b through the gas inlet port 5 and the gas introduction portion 10. Next, the microwaves generated by the microwave generator 1 are introduced to the rectangular antenna dielectric 15 via the rectangular waveguide 2 to make the electric field strength distribution thereof uniform. The microwaves that have been made uniform by the rectangular antenna dielectric 15 are introduced to the sealing dielectric 19 while the uniformity is retained or even enhanced by the slot plate 17. The sealing dielectric 19 introduces the introduced microwaves to the round processing chamber 4b while retaining or even enhancing their uniformity. A plasma generated by the introduced microwaves excites and activates gas molecules, and generates a chemical species so that a thin film is formed on the surface of the sample 12.

Figure 4:
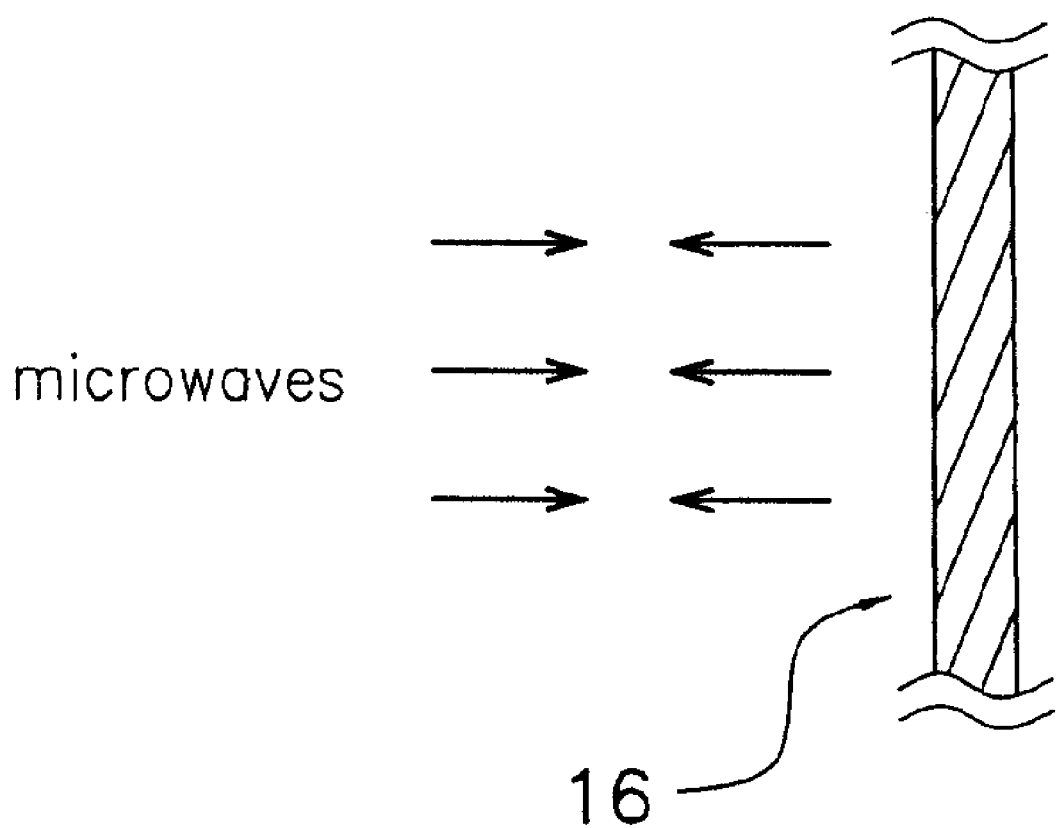
FIG. 4 is a diagram showing the direction in which microwaves travel to and from a vertical wall surface.
Figure 5:
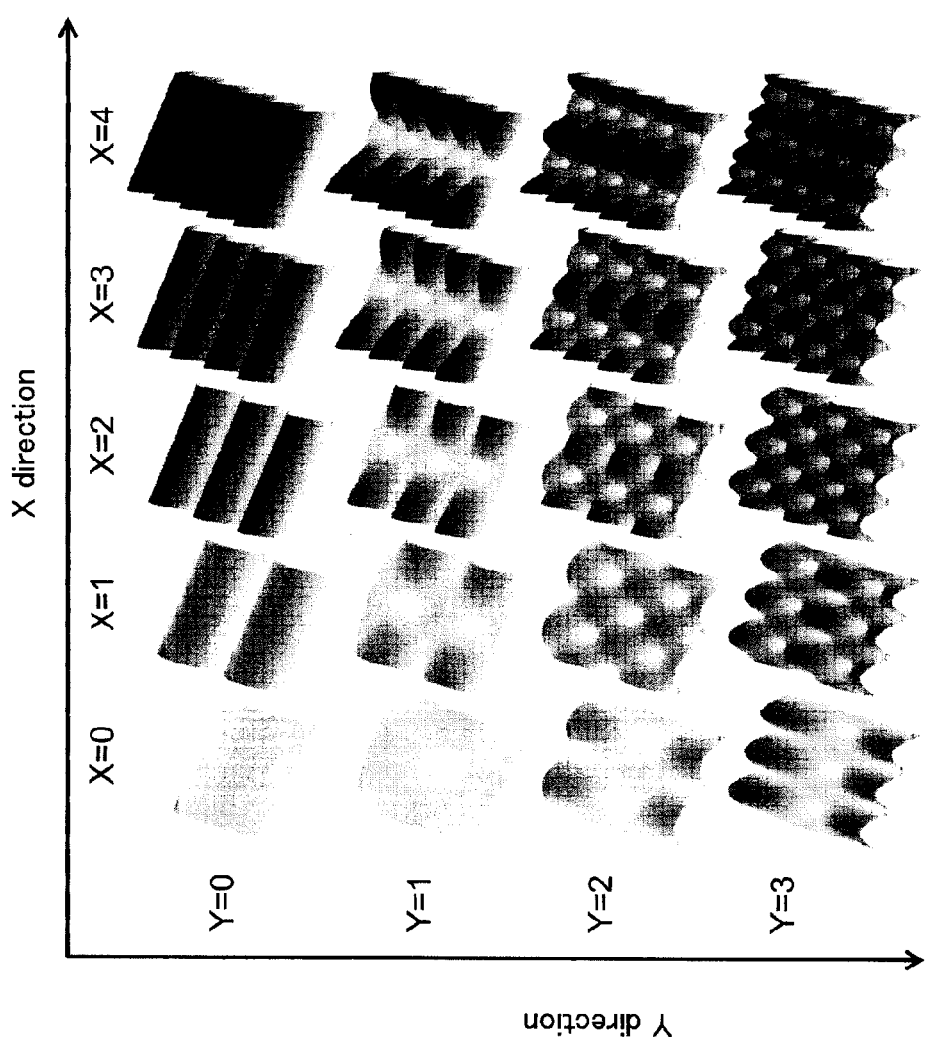
FIG. 5 shows an electric field strength distribution of microwaves in a rectangular propagation region.

In this plasma oxidizing and nitriding apparatus, the region in which the microwaves propagate in the direction along the surface of the sample 12 to be processed, that is, the cross-section along the surface of the sample 12 to be processed of the rectangular antenna dielectric region 15 is rectangular. Therefore, as shown in FIG. 4, the microwaves are reflected in the mirror direction of the direction from which they are incident at a wall surface 16 perpendicular to their traveling direction. FIG. 5 is the electric field strength distribution of the microwaves in such a propagation region having a rectangular cross-section. FIG. 5 shows an electric field strength distribution that is uniform as a whole, in which the microwaves reflected at the wall surface 16 perpendicular to their traveling direction are not concentrated on the center.

Therefore, when the cross-section along the surface of the sample 12 to be processed of the rectangular antenna dielectric 15 of the plasma oxidizing and nitriding apparatus is rectangular, the electric field strength distribution of the microwaves becomes uniform as a whole along the surface to be processed of the sample. The uniform microwaves generate plasma uniformly so that a uniform thin film can be formed. In addition, even if process conditions such as the flow rate or the composition ratio of the gas are changed or the process conditions are changed by maintenance or the like, the electric field strength distribution of the microwaves will rarely concentrate on a particular portion, because the region in which the microwaves propagate is rectangular. Therefore, process margins can be increased.

Figure 6:
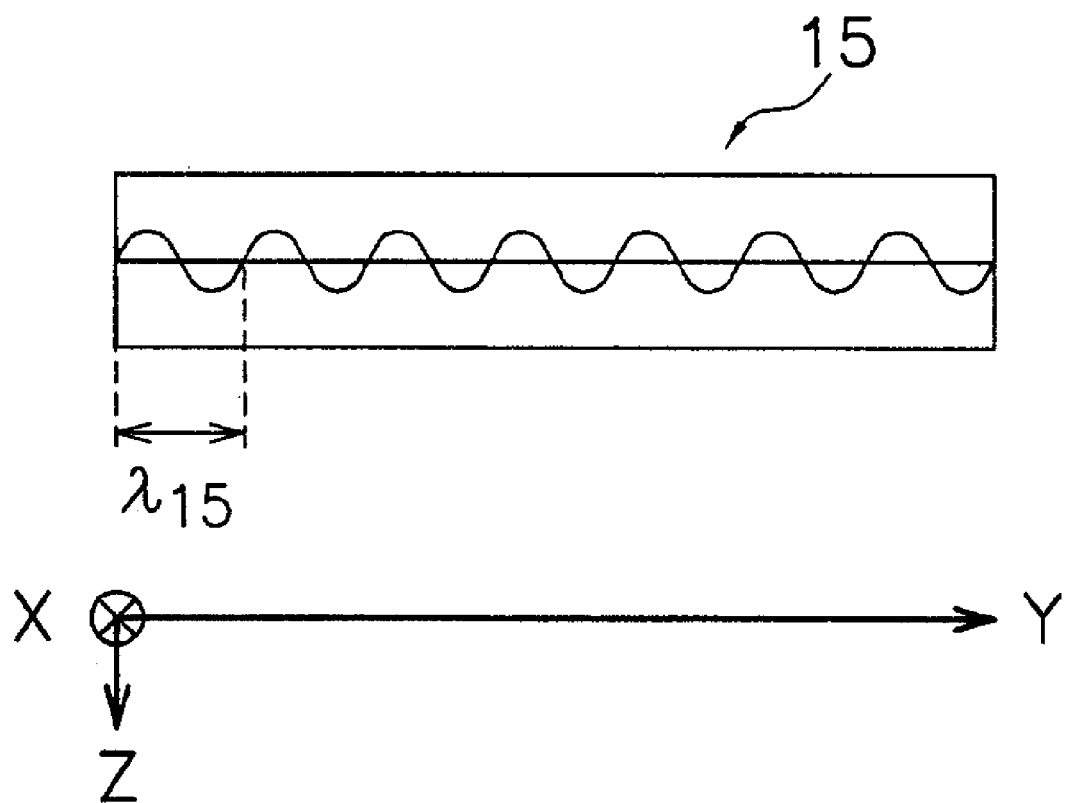
FIG. 6 shows the wavelength of microwaves in a rectangular antenna dielectric.

In FIG. 3, the two opposing sides of the cross-section along the surface of the sample 12 to be processed of the rectangular antenna dielectric 15 are parallel, and the same directions as those of two pairs of two opposing and parallel sides are taken as X direction and Y direction, and the direction perpendicular to the X and Y directions is taken as Z direction. In this situation, it is preferable to set the length in the rectangular antenna dielectric 15 as follows. FIG. 6 is a view illustrating the wavelength of the microwaves in the Y direction of the rectangular antenna dielectric 15.

In this situation, the length $L_{15Y}$ in the Y direction of the rectangular antenna dielectric 15 is set so as to substantially satisfy Equation 32 below.

$$L_{15Y} = n_{15Y}(\lambda_{15}/2) \qquad \text{Equation 32}$$

where $\lambda_{15}$ is the wavelength of the microwaves in the rectangular antenna dielectric 15, and $n_{15Y}$ is an integer of 1 or more.

Similarly, the length $L_{15X}$ in the X direction of the rectangular antenna dielectric 15 can be set so as to substantially satisfy Equation 33 below.

$$L_{15X} = n_{15X}(\lambda_{15}/2) \qquad \text{Equation 33}$$

where $n_{15X}$ is an integer of 1 or more.

The wavelength $\lambda_{15}$ of the microwaves in the rectangular antenna dielectric 15 in Equations 32 and 33 is substantially the same wavelength in all the directions such as the X and Y directions when the lengths of the rectangular antenna dielectric 15 in the X and Y directions are sufficiently larger than the wavelength $\lambda_{15}$, and expressed by Equation 34 below.

$$\lambda_{15} = \frac{\lambda}{\sqrt{\varepsilon_{r15}}} \qquad \text{Equation 34}$$

where $\lambda$=free space wavelength, and $\in_{r15}$=relative dielectric constant of the rectangular antenna dielectric 15.

For the design in the rectangular antenna dielectric 15, the lengths in the X and/or Y directions are set by considering the components in the propagating direction of the microwaves in the rectangular antenna dielectric 15. Furthermore, it is preferable to set the length in the Z direction in the same manner.

The standing wave condition of the microwaves is satisfied by setting the lengths of the rectangular antenna dielectric 15 in the X and/or Y directions to be a multiple of the half-wavelength in the rectangular antenna dielectric 15, so that the microwaves in the rectangular antenna dielectric 15 can be stabilized. Therefore, wave cancellation due to multiple reflection at the end faces of the rectangular antenna dielectric 15 is reduced, and a uniform plasma can be generated efficiently. For this reason, the electric field strength distribution of the microwaves can be uniform as a whole along the surface of the sample 12 to be processed. These uniform microwaves generate plasma uniformly, so that a uniform thin film can be formed with this plasma. In addition, even if process conditions such as the flow rate or the composition ratio of the gas are changed or the process conditions are varied by maintenance or the like, the electric field strength distribution of the microwaves will rarely concentrate on a particular portion, because the region in which the microwaves propagate has a rectangular shape in which two opposing sides are parallel, and the lengths in the Y direction and/or X direction satisfy the standing wave condition. Therefore, process margins can be increased.

Second Embodiment

Figure 7:
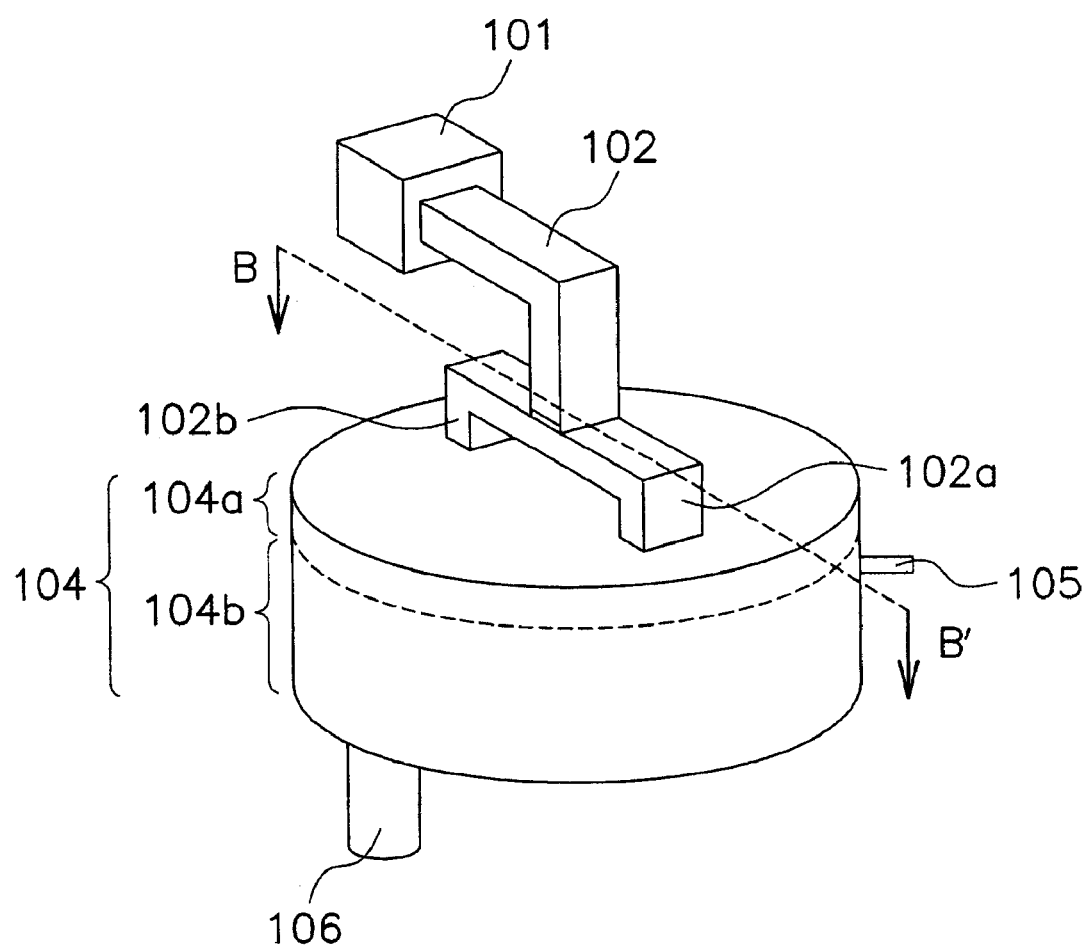
FIG. 7 shows the external appearance of a plasma oxidizing and nitriding apparatus according to a second embodiment of the present invention.
Figure 8:
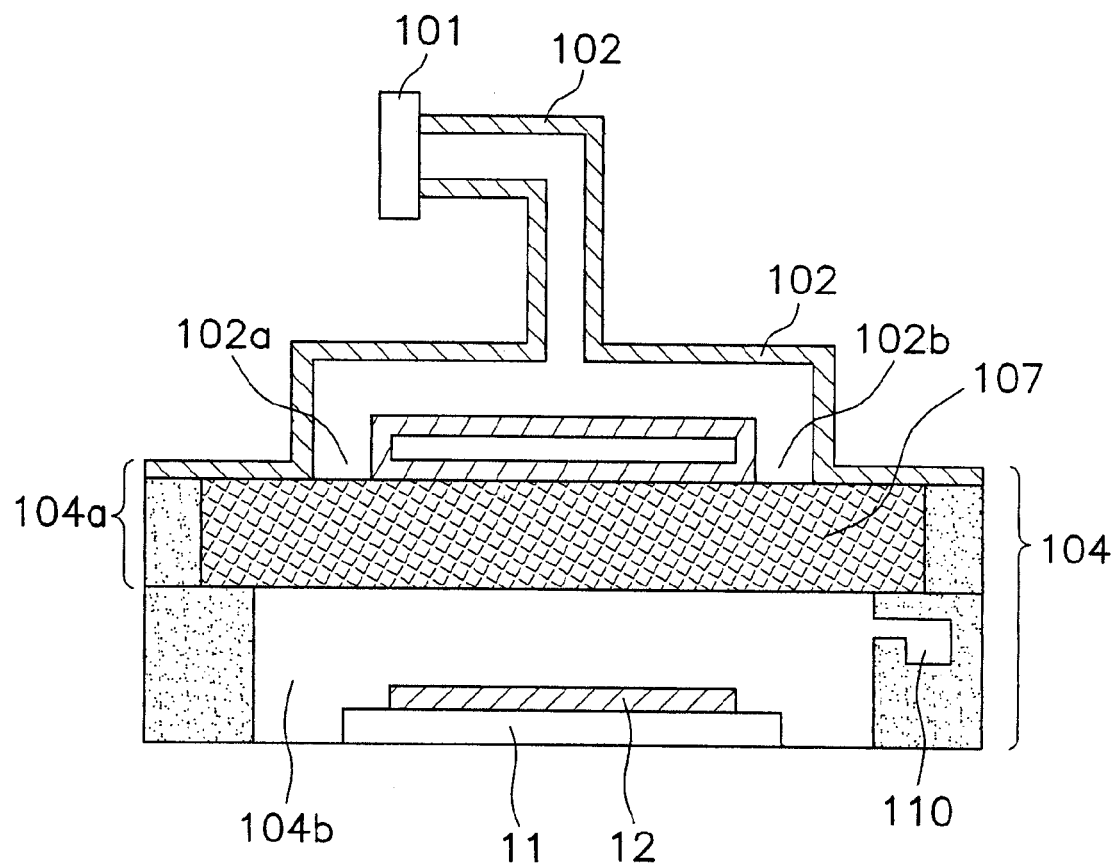
FIG. 8 is a cross-sectional view of the apparatus of FIG. 7 in a direction perpendicular to the surface of a sample to be processed taken along line B–B' of FIG. 7.
Figure 9:
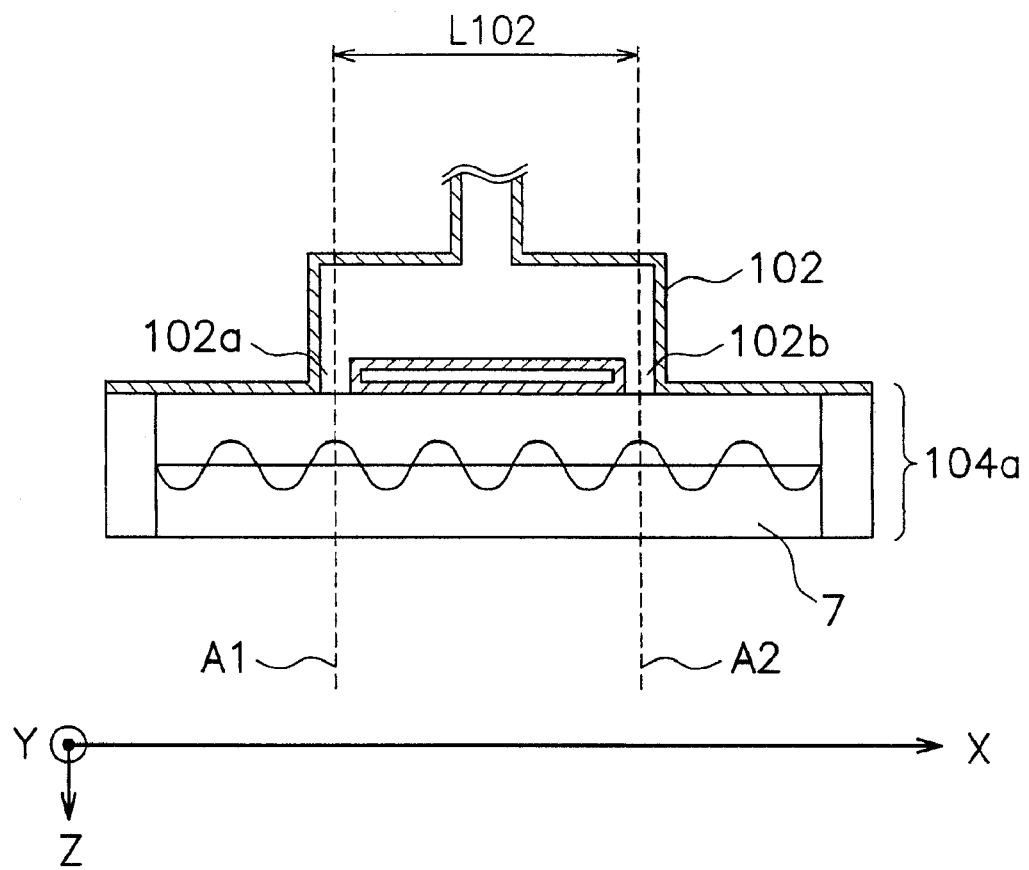
FIG. 9 is a view showing the relationship between the rectangular waveguide and the wavelength of microwaves at the cross-section shown in FIG. 8.

FIG. 7 is a view showing the appearance of a plasma oxidizing and nitriding apparatus of a second embodiment. FIG. 8 is a cross-sectional view of the apparatus of FIG. 7 in a direction perpendicular to the surface of a sample to be processed taken along line B–B' of FIG. 7. FIG. 9 is a view illustrating the relationship between a rectangular waveguide and the wavelength of the microwaves in a round dielectric in the cross-section in FIG. 8.

The plasma oxidizing and nitriding apparatus of the second embodiment has a microwave generator 101, a rectangular waveguide 102 provided with two branched portions 102*a* and 102*b* and a chamber 104. The chamber 104 is provided with a gas inlet port 105 from which a gas such as a film-forming gas is introduced, and a gas outlet port 106 from which the gas is discharged. The chamber 104 also has a chamber lid having a cylindrical shape (hereinafter, referred to as round chamber lid) 104*a* and a processing chamber having a cylindrical shape (hereinafter, referred to as round processing chamber) 104*b*. The round processing chamber 104*b* is provided with a sample platform 11 on which a sample 12 is processed in a position opposite to the round chamber lid 104*a*. A gas introduction portion 110 through which a gas such as film-forming gas is supplied from the gas inlet port 105 to the round processing chamber 104*b* is provided in the side face of the round processing chamber 104*b*. The round chamber lid 104*a* is provided with a dielectric whose cross-section along the surface of the sample 12 to be processed is round (hereinafter, referred to as round dielectric) 107 so as to cover the round processing chamber 104*b* from above. The rectangular waveguide 102 and the microwave generator 101 connected to the rectangular waveguide 102 are provided above the chamber 104.

The relationship between the positions of the branched portions 102*a* and 102*b* and the wavelength of the microwaves in the round dielectric 107 is set as follows.

As shown in FIG. 9, the distance $L_{102}$ between an axis A1 and an axis A2 on which the centers of the branched portions 102*a* and 102*b* are positioned, respectively, is set or the material of the round dielectric 107 is selected such that the phases of the microwaves in the round dielectric 107 in the positions on the axes A1 and A2 are matched to each other. In other words, the distance $L_{102}$ is set according to Equation 35 so as to satisfy a multiple of the half-wavelength of the microwaves in the round dielectric 107.

$$L_{102} = n_{L102} \times (\lambda_{107}/2) \qquad \text{Equation 35}$$

where $\lambda_{107}$ is the wavelength of the microwave in the round dielectric 107, and $n_{L102}$ is an integer of 1 or more.

Thus, it is preferable that the distance is set such that the antinodes or the nodes of the microwaves in the round dielectric 107 are positioned on the axes A1 and A2, because the degree of coupling between the microwaves introduced from the branched portions 102*a* and 102*b* positioned on the axes A1 and A2, respectively, to the round dielectric 107 and the microwaves in the round dielectric 107 can be further increased. Thus, by setting the positions of the axes A1 and A2 in this manner, the phases of the microwaves in the round dielectric 107 can be matched to each other between the branched portions 102*a* and 102*b* shown in FIG. 8. Therefore, interference such as the cancellation of the microwaves introduced from the branched portions 102*a* and 102*b* positioned on the axes to the round dielectric 107 can be reduced, and the microwaves can be made substantially uniform in the direction along the surface of the sample 12 to be processed (hereinafter, the microwaves whose electric field strength distribution is substantially uniform are referred to as uniform microwaves. In addition, uniform in the following description means substantially uniform in the direction along the surface of the sample 12 to be processed.) For this reason, the uniform microwaves generate plasma uniformly, and a uniform thin film can be formed with gas molecules that are excited and activated by this plasma.

In place of the rectangular waveguide 102, a slot antenna or other antennas can be provided.

For the above dielectrics, substances that causes little dielectric loss such as quartz, fluorocarbon resin, polyethylene, and polystyrene are preferable. The dielectric includes those in which the dielectric constant is 1, such as vacuum, air and gas, and also includes those in which at least a part of the surface of the dielectric is covered with a conductor. In this plasma oxidizing and nitriding apparatus, the film formation process is performed, for example, in the following manner.

First, the round processing chamber 104*b* is evacuated through the gas outlet port 106 to a predetermined degree of vacuum, and a gas is introduced to the round processing chamber 104*b* through the gas inlet port 105 and the gas introduction portion 110. Next, the microwaves generated by the microwave generator 101 are introduced to the round dielectric 107 via the branched portions 102*a* and 102*b* of the rectangular waveguide 102, and the electric field strength distribution thereof is made uniform. The microwaves are introduced to the round processing chamber 104*b* to generate a plasma. The generated plasma excites and activates gas molecules and generates a chemical species so that a thin film is formed on the surface of the sample 12.

In this embodiment, the round dielectric 107 is used as the dielectric. However, when a dielectric is used whose cross-section along the surface of the sample 12 to be processed is rectangular, an electric field strength distribution that is uniform as a whole can be obtained in which the microwaves reflected at the wall surface perpendicular to their traveling direction of the microwaves are not concentrated on the center. These uniform microwaves make it possible to generate a uniform plasma and thus form a uniform thin film. In addition, even if process conditions such as the flow rate or the composition ratio of the gas are changed or the process conditions are changed by maintenance or the like, the electric field strength distribution of the microwaves will rarely concentrate on a particular portion, because the region in which the microwaves propagate is rectangular. Thus, process margins such as the flow rate or the composition rate of the gas can be increased.

The material of the round dielectric 107 is selected such that the phase of the microwaves in the rectangular waveguide 102 is substantially matched to the phase of the microwaves in the round dielectric 107. The shape or the structure of the rectangular waveguide 102 can be changed such that their phases are matched.

It is preferable that the setting is such that the position of the antinodes or the nodes of the microwaves in the rectangular waveguide 102 is matched to the position of the antinodes or the nodes of the microwaves in the round dielectric 107, because the microwaves in the rectangular waveguide 102 and the round dielectric 107 are prevented from interfering with each other. With this setting, the microwaves in the rectangular waveguide 102 and the round dielectric 107 can satisfy the standing wave condition at the same time. Therefore, the microwaves propagating in the respective propagation regions interfere less with each other, leading to reduced disturbance of the standing wave condition. Thus, dampening of microwaves is suppressed, and a uniform distribution of microwaves is formed so that a uniform thin film can be produced by a uniform plasma.

In this embodiment, the rectangular waveguide 102 that is branched into two has been used as an example. However, it can be branched into more than two. When the rectangular waveguide 102 is branched into more than two, the distance between the axes A1, A2, A3, . . . on which the centers of the branched portions 102a, 102b, 102c . . . , for example, are positioned is set in the same manner as described above. In other words, the distance between the axes A1 and A2, the distance between the axes A2 and A3, the distance between the axes A1 and A3, etc. are set so as to be substantially a multiple of the half-wavelength of the microwave in the round dielectric 107.

Third Embodiment

Figure 10:
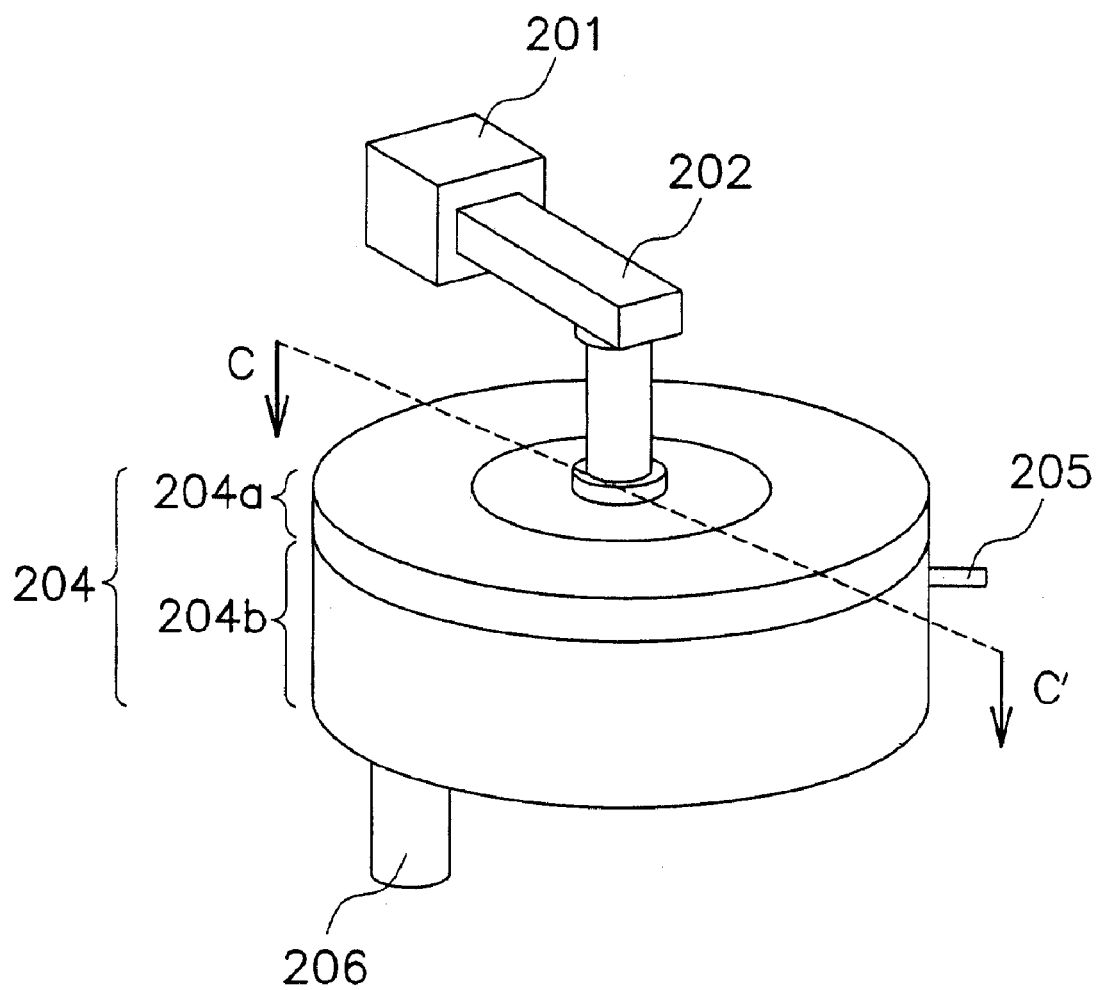
FIG. 10 shows the external appearance of a plasma oxidizing and nitriding apparatus according to a third embodiment of the present invention.
Figure 11:
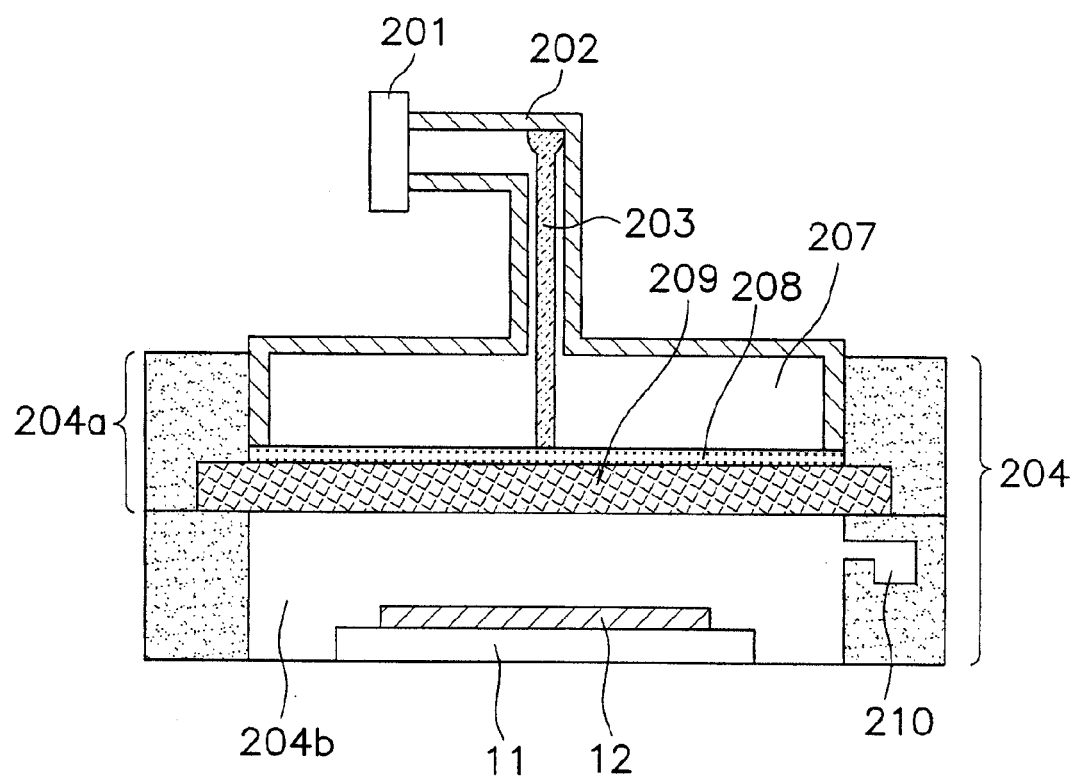
FIG. 11 is a cross-sectional view of the apparatus of FIG. 10 in a direction perpendicular to the surface of a sample to be processed taken along line C–C' of FIG. 10.
Figure 12:
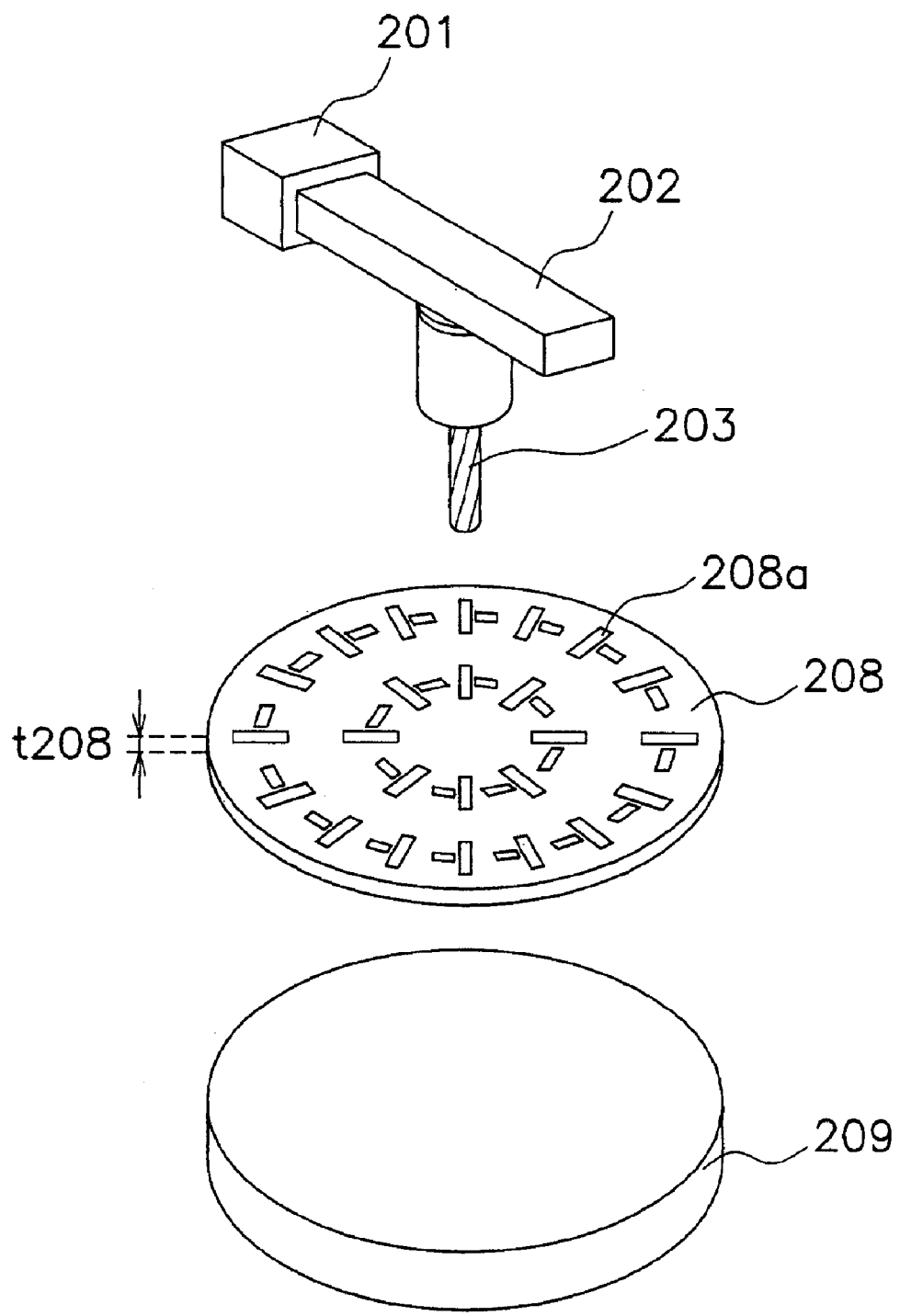
FIG. 12 is an exploded perspective view of portions of the plasma oxidizing and nitriding apparatus shown in FIG. 10.
Figure 13A:
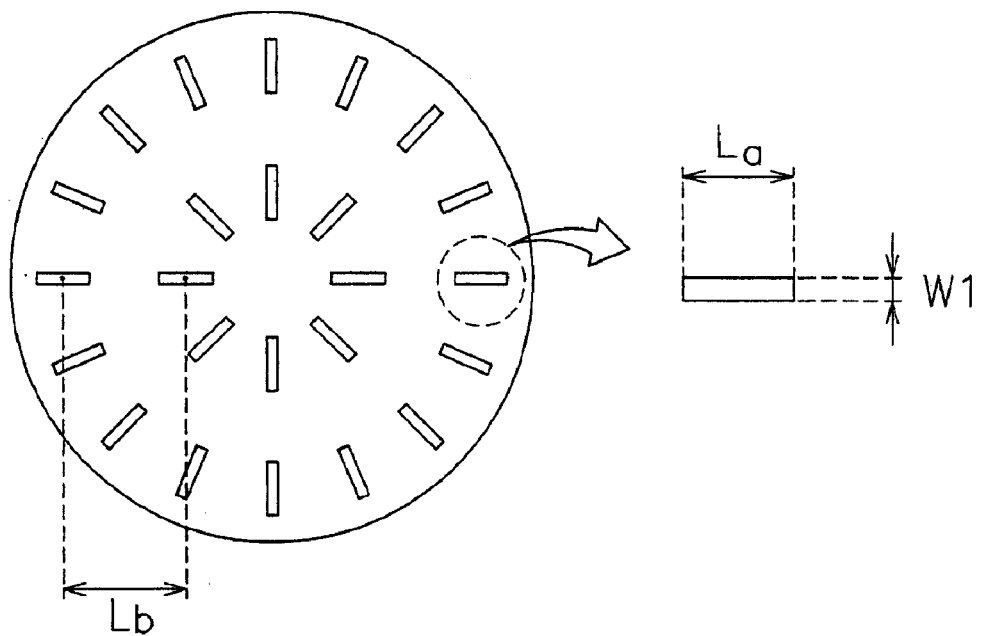
FIG. 13A shows a slot shape (1) of a slot plate.
Figure 13B:
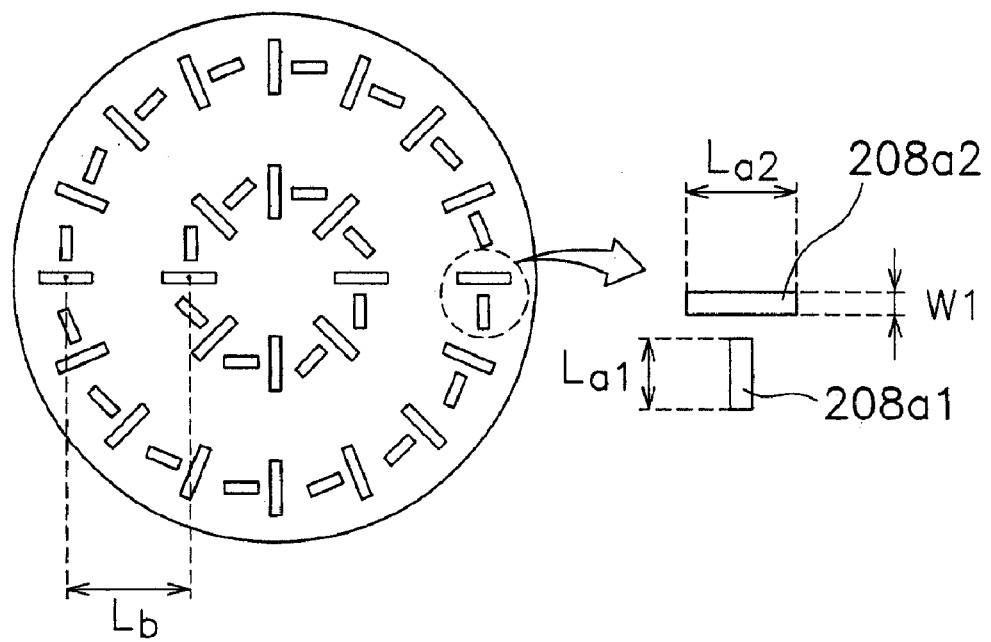
FIG. 13B shows a slot shape (2) of a slot plate.

FIG. 10 is a view showing the appearance of a plasma oxidizing and nitriding apparatus of a third embodiment. FIG. 11 is a cross-sectional view of the apparatus of FIG. 10 in a direction perpendicular to the surface of a sample to be processed taken along line C–C' of FIG. 10. FIG. 12 is an exploded perspective view of portions of the plasma oxidizing and nitriding apparatus shown in FIG. 10. FIGS. 13A and 13B show the slot shape of a slot plate.

The plasma oxidizing and nitriding apparatus of the third embodiment has a microwave generator 201, a waveguide 202 and a chamber 204. The chamber 204 is provided with a gas inlet port 205 from which a gas such as a film-forming gas is introduced, and a gas outlet port 206. The chamber 204 also has a chamber lid having a cylindrical shape (hereinafter, referred to as round chamber lid) 204a and a processing chamber having a cylindrical shape (hereinafter, referred to as round processing chamber) 204b. The round processing chamber 204b is provided with a sample platform 11 on which a sample 12 is processed in a position opposite to the round chamber lid 204a. A gas introduction portion 210 through which a gas such as film-forming gas is supplied from the gas inlet port 205 to the round processing chamber 204b is provided in the side face of the round processing chamber 204b. The round chamber lid 204a includes a resonator 207, a cylindrical slot plate (round slot plate) 208, and a cylindrical sealing dielectric (hereinafter referred to as round sealing dielectric) 209 in this order so that they cover the round processing chamber 204b from above. The round slot plate 208 is provided with radially arranged rectangular slots 208a, as shown in FIG. 13A. The length $W_1$ of the short side of each slot 208a is sufficiently shorter than the length $L_a$ of each of the longer sides. Furthermore, a radial line slot antenna as shown in FIG. 13B can be used as the round slot plate 208. Here, the total of a length $L_{a1}$ of the long side of each slot 208a1 and a length $L_{a2}$ of the long side of each slot 208a2 in FIG. 13B is represented by $L_a = L_{a1} + L_{a2}$. A coaxial antenna 203 provided in the waveguide 202 is provided above the chamber 204.

It is preferable that the thickness $t_{208}$ of the round slot plate 208 is at least 1 mm in terms of the stiffness and the heat dissipation characteristics. When the thickness of the round slot plate 208 is 1 mm or more, its stiffness and its ability to dissipate heat generated when generating plasma can be improved and the microwaves introduced from the slot 208a will be reduced, so that problems such as electric sparks or anomalous discharge can be reduced. Thus, the uniformity of the microwaves tends to be maintained. A thickness $t_{208}$ of 3 mm or more is more preferable because the above-described problems can be further reduced.

Furthermore, the slot length $L_a$ of the longer side of each of the slots 208a is set so as to preferably satisfy $L_a \geq (\frac{3}{8}) \lambda_{207}$, and more preferably $L_a \geq (\frac{1}{2}) \lambda_{207}$. Here, $\lambda_{207}$ is the wavelength of the microwaves in the resonator 207. By setting the slot length $L_a$ as above, even if the thickness $t_{208}$ of the slot plate is large, the dampening of the microwaves due to the slots 208a can be easily prevented, and the degree of coupling between the microwaves in the resonator 207 that have passed through the round slot plate 208 and the microwaves in the round sealing dielectric 209 can be satisfactory. More preferably, it is set to $L_a = (\frac{1}{2}) \lambda_{207}$. This makes it possible that the slot length $L_a$ is substantially the resonance length of the wavelength $\lambda_{207}$, so that even if the round slot plate 208 has a thickness $t_{208}$ of 1 mm or more, or the length $W_1$ of the shorter sides of the slots 208a are small, the transmission of the microwaves to the round sealing dielectric 209 is sufficient, and the damping of the microwaves due to the round slot plate 208 can be prevented. Moreover, a high degree of coupling between the microwaves introduced to the round sealing dielectric 209 via the round slot plate 208 from the resonator 207 and the microwaves in the round sealing dielectric 209 can be obtained. Thus, an even higher degree of coupling can be obtained while reducing occurrence of non-uniform microwaves due to deformation of the slot plate or anomalous discharge, dampening of the microwaves or the like. Therefore, a uniform plasma can be generated efficiently and a uniform thin film can be generated efficiently on a large diameter wafer. (Hereinafter, the microwaves whose electric field strength distribution is substantially uniform are referred to as uniform microwaves. In addition, uniform in the following description means substantially uniform in the direction along the surface of the sample 12 to be processed.)

Furthermore, as shown in FIGS. 13A and 13B, it is more preferable that a distance $L_b$ between the centers of slots that are adjacent to each other in the radial direction is substantially $L_b=\lambda_7$, because the phases of the microwave introduced to the round sealing dielectric 209 from each slot 208a are matched to each other. Furthermore, it is preferable that the dielectric constant in the slots 208a is about the same as the dielectric constant in the round sealing dielectric 209, because the reflection of the microwaves when the microwaves pass through the slots 208a can be reduced.

The relationship between the thickness $t_{208}$ of the round slot plate 208 and the heat deformation distortion should be determined depending on the characteristics of the plasma oxidizing and nitriding apparatus, because it is an inverse relationship to the relationship between the thickness $t_{208}$ and the transmission.

Furthermore, when a cylindrical antenna dielectric (hereinafter, referred to as round antenna dielectric) 215 (not shown) is provided above the round slot plate 208, the round antenna dielectric 215, the round slot plate 208 and the round sealing dielectric 209 make the electric field strength distribution of the microwaves in the round sealing dielectric 209 even more uniform. In addition, in place of the coaxial antenna 203, a slot antenna, a rectangular waveguide or other antennas can be provided. For the above dielectrics, substances that cause little dielectric loss such as quartz, fluorocarbon resin, polyethylene, and polystyrene are preferable. The dielectric includes those in which the dielectric constant is 1, such as vacuum, air and gas, and also includes those in which at least a part of the surface of the dielectric is covered with a conductor. The slot plate can be formed of a plate of metal such as Cu or Al.

In this plasma oxidizing and nitriding apparatus, the film formation process is performed, for example, in the following manner.

First, the round processing chamber 204b is evacuated through the gas outlet port 206 to a predetermined degree of vacuum, and a gas is introduced to the round processing chamber 204b through the gas inlet port 205 and the gas introduction portion 210. Next, the microwaves generated by the microwave generator 201 are introduced to the round sealing dielectric 209 via the round slot plate 208 and the electric field strength distribution is made uniform. The microwaves are introduced to the round processing chamber 204b. A plasma generated by the introduced microwaves excites and activates gas molecules, and generates a chemical species so that a thin film is formed on the surface of the sample 12.

Figure 14:
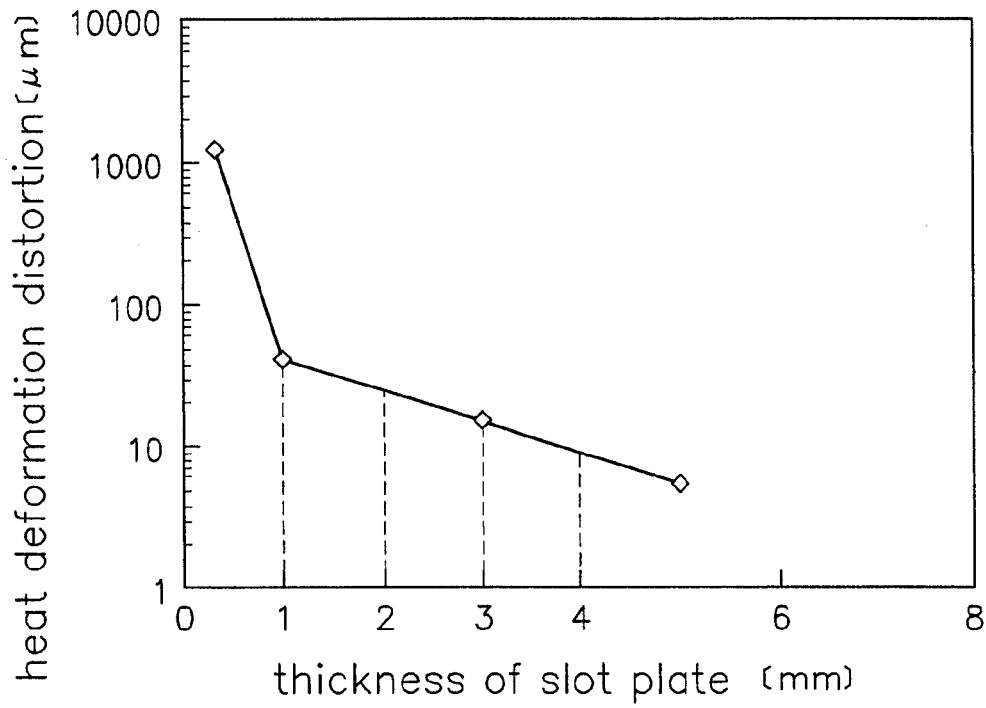
FIG. 14 is a graph showing the relationship between the thickness t of a round slot plate and the distortion cause by heat deformation.
Figure 15:
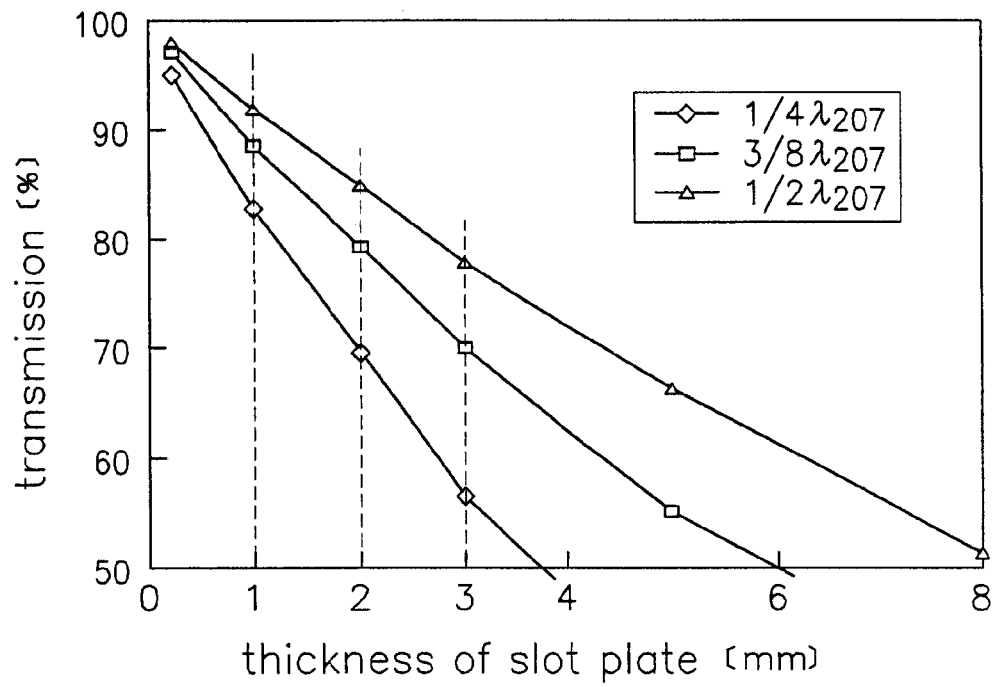
FIG. 15 is a graph showing the relationship between the thickness t of each of three round slot plates having slots with different slot lengths and transmissivity.

Next, the relationships between the thickness $t_{208}$ of the round slot plate 208 and the slot length $L_a$ of the slots 208a and the transmission and the distortion due to heat deformation are shown. FIG. 14 is a graph showing the relationship between the thickness $t_{208}$ of the round slot plate 208 and the distortion due to heat deformation. FIG. 15 is a graph showing the relationship between the thickness $t_{208}$ of the round slot plate 208 having a slot length $L_a=(\frac{1}{4})\lambda_{207}$, $(\frac{3}{8})\lambda_{207}$, or $(\frac{1}{2})\lambda_{207}$ and the transmission.

FIGS. 14 and 15 show the experimental results of a situation in which the wavelength $\lambda_{207}$ inside the resonator 207 has a sufficient magnitude to be a free space wavelength, and the resonator 207 is filled with quartz.

FIG. 14 shows that when the thickness $t_{208}$ of the round slot plate 208 is 1 mm or more, the heat deformation distortion of the round slot plate 208 is about 40 $\mu$m or more. Therefore, when the thickness $t_{208}$ thereof is 1 mm or more, the stiffness thereof can be improved, and good heat dissipation characteristics can be obtained, so that the heat deformation distortion can be as small as $\frac{1}{10}$ or less of the thickness $t_{208}$ of the round slot plate 208, and thus the effect of heat deformation on the microwaves can be reduced. Furthermore, for the thickness $t_{208}$ in the range of $1 \leq t_{208} \leq 3$ (mm), FIG. 14 indicates that the heat deformation distortion is about 20 $\mu$m, and the variation in the antenna characteristics due to deformation can be reduced further. In addition, the dissipation of heat generated during plasma generation can be improved, and the problems such as electric sparks or anomalous discharge can be further reduced.

FIG. 15 shows that the transmission in all the slot lengths $L_a$ at a thickness $t_{208}$ of 1 mm is about 80% or more, and there is no problem in the stiffness and the transmission. In particular, it is preferable that $L_a \geq (\frac{3}{8})_{80\ 207}$, because the transmission is about 90% or more and thus the transmission of the microwaves can be improved. Furthermore, when the thickness $t_{208}$ is in the range of $1 \leq t_{208} \leq 3$ (mm) and $L_a \geq (\frac{3}{8})\lambda_{207}$, the transmission is about 70% or more, and thus the transmission of the microwaves can be sufficiently improved compared to when $L_a \leq (\frac{1}{4})\lambda_{207}$. In addition, when the thickness $t_{208}$ is 3 mm or more, the heat deformation distortion is as small as about 20 $\mu$m or less. Furthermore, when $L_a \geq (\frac{3}{8})\lambda_{207}$, a reduction in the transmission can be prevented. For example, when the thickness $t_{208}$ is 5 mm, the heat deformation distortion is about 5 $\mu$m, and the transmission is about 55% or more.

Fourth Embodiment

Figure 16:
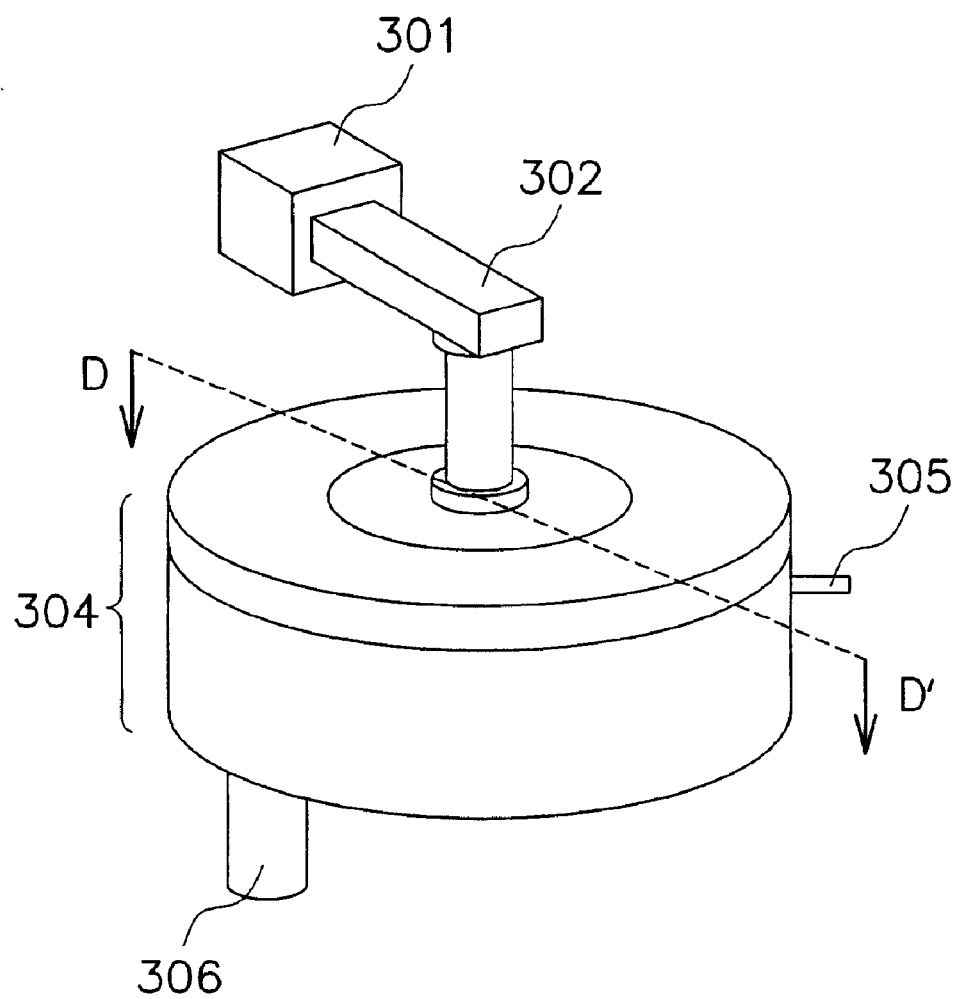
FIG. 16 shows the external appearance of a plasma oxidizing and nitriding apparatus according to a fourth embodiment of the present invention.
Figure 17:
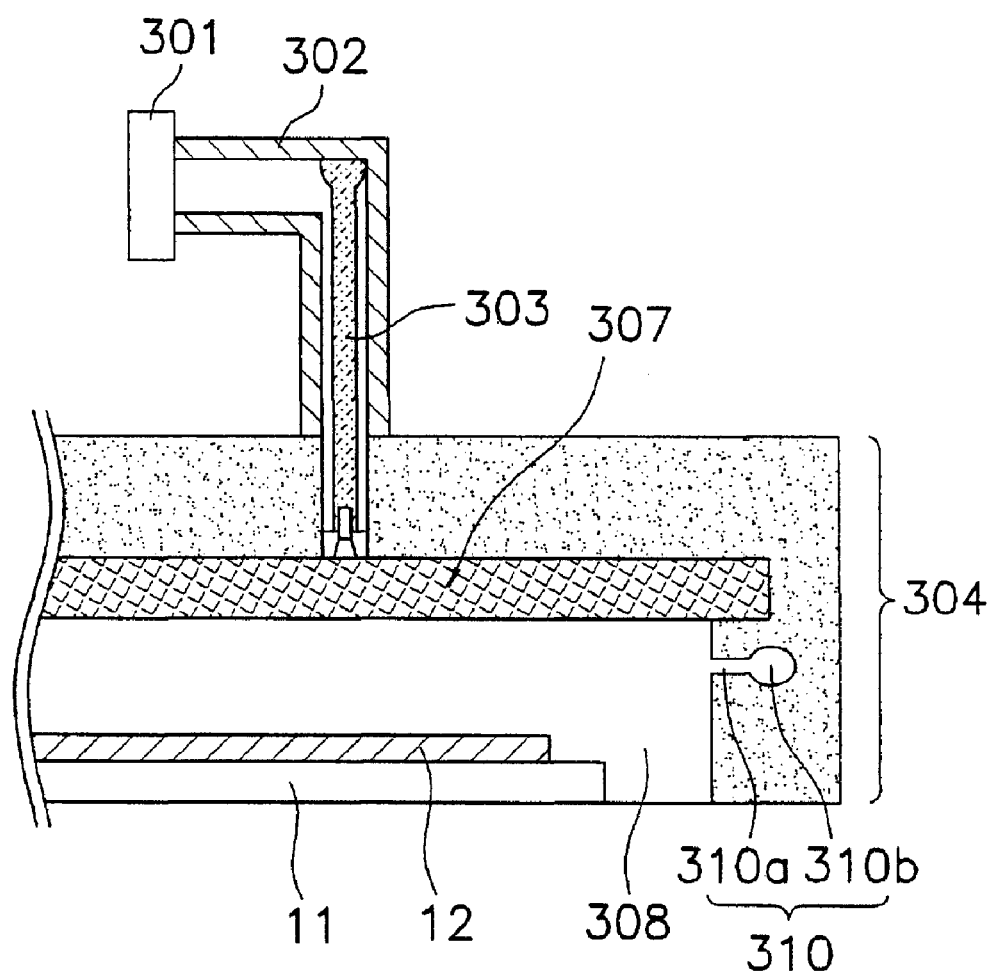
FIG. 17 is a cross-sectional view of the apparatus of FIG. 16 in a direction perpendicular to the surface of a sample to be processed taken along D–D' of FIG. 16.
Figure 18A:
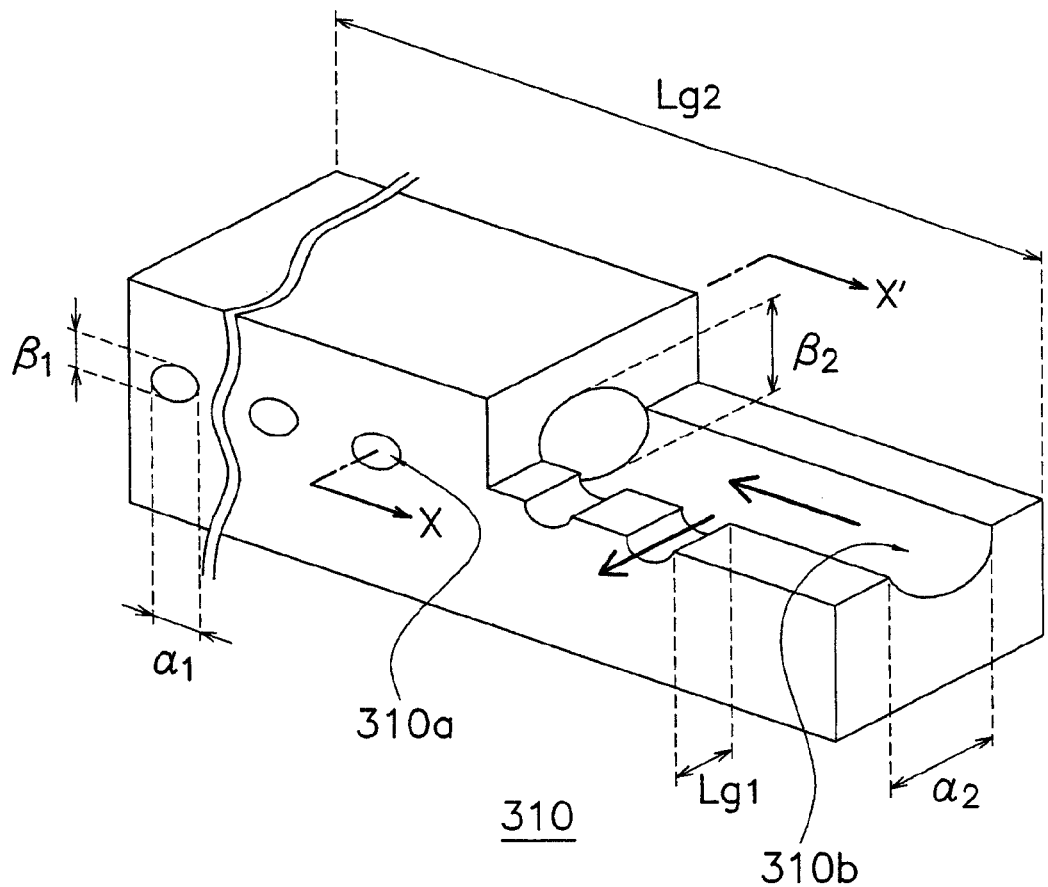
FIG. 18A is an exploded perspective view of the internal structure of a gas introduction portion of the plasma oxidizing and nitriding apparatus shown in FIG. 16.
Figure 18B:
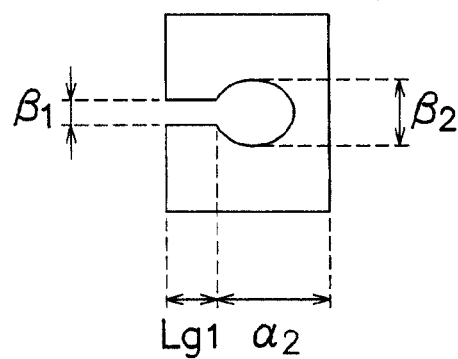
FIG. 18B is a cross-sectional view taken along X–X' of FIG. 18A.

FIG. 16 is a view showing the external appearance of a plasma oxidizing and nitriding apparatus according to a fourth embodiment of the present invention. FIG. 17 is a cross-sectional view of a portion of the apparatus of FIG. 16 that is perpendicular to the surface of a sample to be processed and taken along line D–D' of FIG. 16. FIG. 18A is a partial perspective view of the internal structure of the gas introduction portion of the plasma oxidizing and nitriding apparatus shown in FIG. 16. FIG. 18B is a cross-sectional view of the gas introduction portion taken along line X–X' of FIG. 18A.

As shown in FIGS. 16 and 17, the plasma oxidizing and nitriding apparatus of the fourth embodiment has a microwave generator 301, a waveguide 302, a coaxial antenna 303 and a chamber 304. The chamber 304 is provided with a gas inlet port 305 from which a gas such as a film-forming gas is introduced, and a gas outlet port 306. A dielectric 307, a processing chamber 308 and a gas introduction portion 310 are provided inside the chamber 304. It is preferable that the dielectric 307 is formed of substances that causes little dielectric loss such as quartz, fluorocarbon resin, polyethylene, and polystyrene. The dielectric includes those in which the dielectric constant is 1, such as vacuum, air and gas, and also includes those in which at least a part of the surface of the dielectric is covered with a conductor.

The processing chamber 308 is provided with a sample platform 11 on which a sample 12 is mounted in a position opposing the dielectric 307. The gas introduction portion 310 through which a gas such as film-forming gas is supplied from the gas inlet port 305 to the processing chamber 308 is provided in the side face of the processing chamber 308. The gas introduction portion 310 has a gas introduction nozzle 310a having an opening to the processing chamber 308 and a gas introduction channel 310b connecting the gas inlet port 305 and a plurality of gas introduction nozzles 310a. In place of the rectangular waveguide 302, a slot antenna, a rectangular waveguide, a coaxial antenna or other antennas can be provided.

A microwave blocking structure for preventing the microwaves from entering the gas introduction portion 310 and a gas introduction structure for introducing a gas substantially uniformly to the processing chamber 308 will be described in greater detail below. Hereinafter, uniform in the following description means substantially uniform. First, the microwave blocking structure will be described.

A gas is supplied from the gas introduction channel 310b to the processing chamber 308 through the gas introduction nozzle 310a, as shown by an arrow in FIG. 18. The gas introduction portion 310 is configured so as to satisfy the following conditions. The gas introduction nozzle 310a is formed such that the transmission T of the microwaves introduced from the processing chamber 308 to the gas introduction nozzle 310a substantially satisfies Equation 36 below.

$$L_{g1} \geq -\frac{\ln T}{2\pi \sqrt{\left(\frac{1}{2\alpha_1}\right)^2 - \left(\frac{1}{\lambda_{825}}\right)^2}} \quad \text{Equation 36}$$

where $Lg_1$ represents the length of the gas introduction nozzle 310a in the direction that the gas travels, $\alpha_1$ represents the longer diameter of the gas introduction nozzle 310a in the direction perpendicular to the direction in which the gas travels, lnT represents the natural logarithm of T, and $\lambda_{308}$ represents the wavelength of the microwaves in the processing chamber 308.

When the gas introduction nozzle 310a is designed as above, the microwaves are prevented from entering the gas introduction portion 310. Therefore, problems such as the occurrence of anomalous discharge or abnormal growth of films in the gas introduction portion 310 can be reduced, and uniform gas supply can be achieved. It is preferable to design the gas introduction nozzle 310a such that the transmission T is 1% or less in consideration of the loss of the microwaves. When the transmission is 1% or less, the microwaves can be blocked efficiently and problems such as anomalous discharge or abnormal growth of films can be reduced further.

Next, the gas introduction structure will be described. It is preferable that the easy with which a gas flows through the gas introduction channel 310b and the gas introduction nozzle 310a, that is, the so-called conductance ratio, is set to be at least X. Here, X is the number of the gas introduction nozzles 310a connected to the gas introduction channel 310b. In other words, the ratio of the conductance $C_2$ of the gas introduction channel 310b to the conductance $C_1$ of the gas introduction nozzle 310a satisfies Equation 37 below.

$$\frac{C_2}{C_1} \geq X \quad \text{Equation 37}$$

Here, the conductance $C_1$ of the gas introduction nozzle 310a and the conductance $C_2$ of the gas introduction channel 310b can be expressed by Equations 38 and 39, respectively.

$$C_1 = 1988 \cdot \frac{\alpha_1^2 \cdot \beta_1^2}{L_{g1}} \cdot P_1 \cdot K_1 \quad \text{Equation 38}$$

$$C_2 = 1988 \cdot \frac{\alpha_2^2 \cdot \beta_2^2}{L_{g2}} \cdot P_2 \cdot K_2 \quad \text{Equation 39}$$

where $\alpha_1$ represents the longer diameter of the gas introduction nozzle 310a in the direction perpendicular to the direction that the gas travels;

$\beta_1$ represents the shorter diameter of the gas introduction nozzle 310a in the direction perpendicular to the direction that the gas travels;

$Lg_1$ represents the length of the gas introduction nozzle 310a in the direction that the gas travels;

$P_1$ represents the average pressure in the gas introduction nozzle 310a;

$K_1$ represents the form factor of the gas introduction nozzle 310a;

$\alpha_2$ represents the longer diameter of the gas introduction channel 310b in the direction perpendicular to the direction that the gas travels;

$\beta_2$ represents the shorter diameter of the gas introduction channel 310b in the direction perpendicular to the direction that the gas travels;

$Lg_2$ represents the length of the gas introduction channel 310b in the direction that the gas travels;

$P_2$ represents the average pressure in the gas introduction channel 310b; and $K_2$ represents the form factor of the gas introduction channel 310b.

Thus, when the ratio in the conductance of the gas introduction channel 310b and the gas introduction nozzles 310a is at least X, which is the number of the gas introduction nozzles 310a connected to the gas introduction channel 310b, a gas can be supplied from the gas introduction nozzle 310a to the processing chamber 308 uniformly. A uniform gas supply can form a more uniform plasma, and thus a uniform thin film can be formed. It should be noted that $K_1$ and $K_2$ are a value from 0 to 1, depending on the shape of the gas introduction channel 310b.

The larger the conductance ratio of the gas introduction nozzle 310a and the gas introduction channel 310b is, the more uniformly the gas can be supplied. However, it is preferable to set the ratio in view of the operating pressure, the gas flow rate, and the physical resistance of the gas introduction portion 310.

The equations showing this relationship are not limited to Equations 38 and 39, and appropriate equations can be used depending on differences in the shape of the flow channel.

In this plasma oxidizing and nitriding apparatus, the film formation process is performed, for example, in the following manner.

First, the processing chamber 308 is evacuated through the gas outlet port 306 to a predetermined degree of vacuum, and a gas is introduced to the processing chamber 308 through the gas inlet port 305, the gas introduction channel 310b and the gas introduction nozzle 310a. Next, the microwaves generated by the microwave generator 301 are introduced to the dielectric 307 via the waveguide 302. The dielectric 307 makes the introduced microwaves uniform and the microwaves are introduced to the processing chamber 308. A plasma generated by the introduced microwaves excites and activates gas molecules, and generates a chemical species so that a thin film is formed on the surface of the sample 12.

Fifth Embodiment

Figure 19:
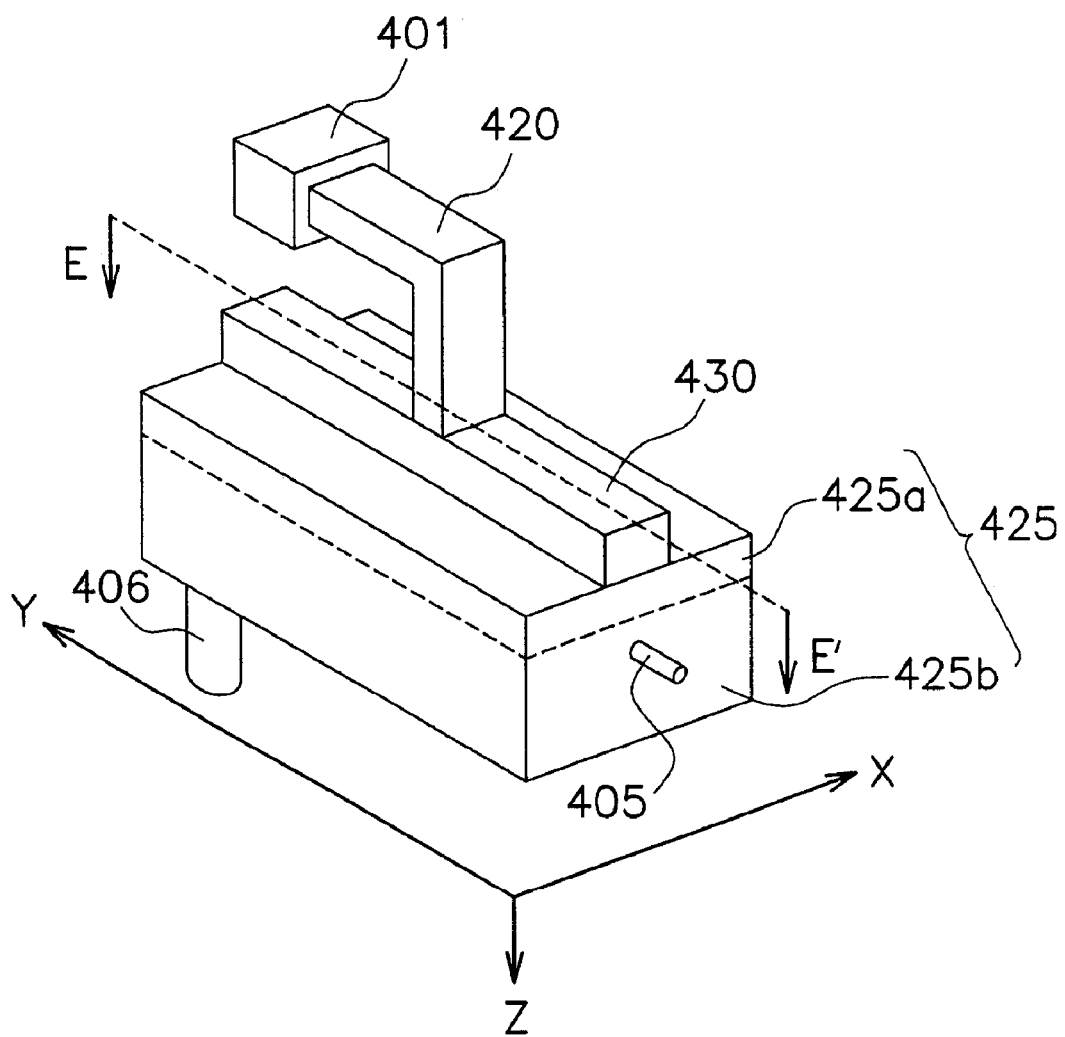
FIG. 19 shows the external appearance of the plasma oxidizing and nitriding apparatus of a fifth embodiment of the present invention.
Figure 20:
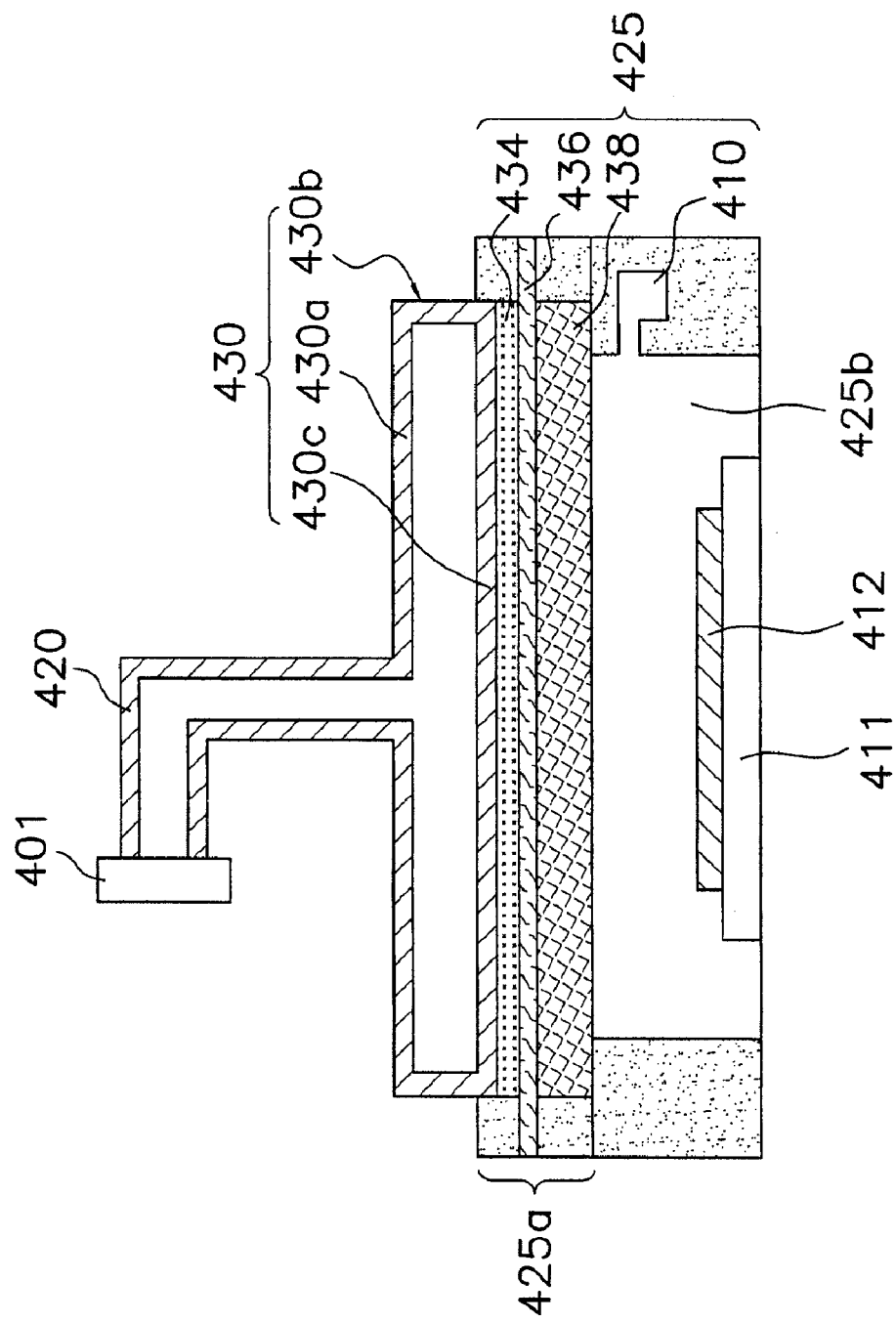
FIG. 20 shows a cross-section of the apparatus of FIG. 19 taken along line E–E' of FIG. 19 and perpendicular to the X axis of FIG. 19.
Figure 21:
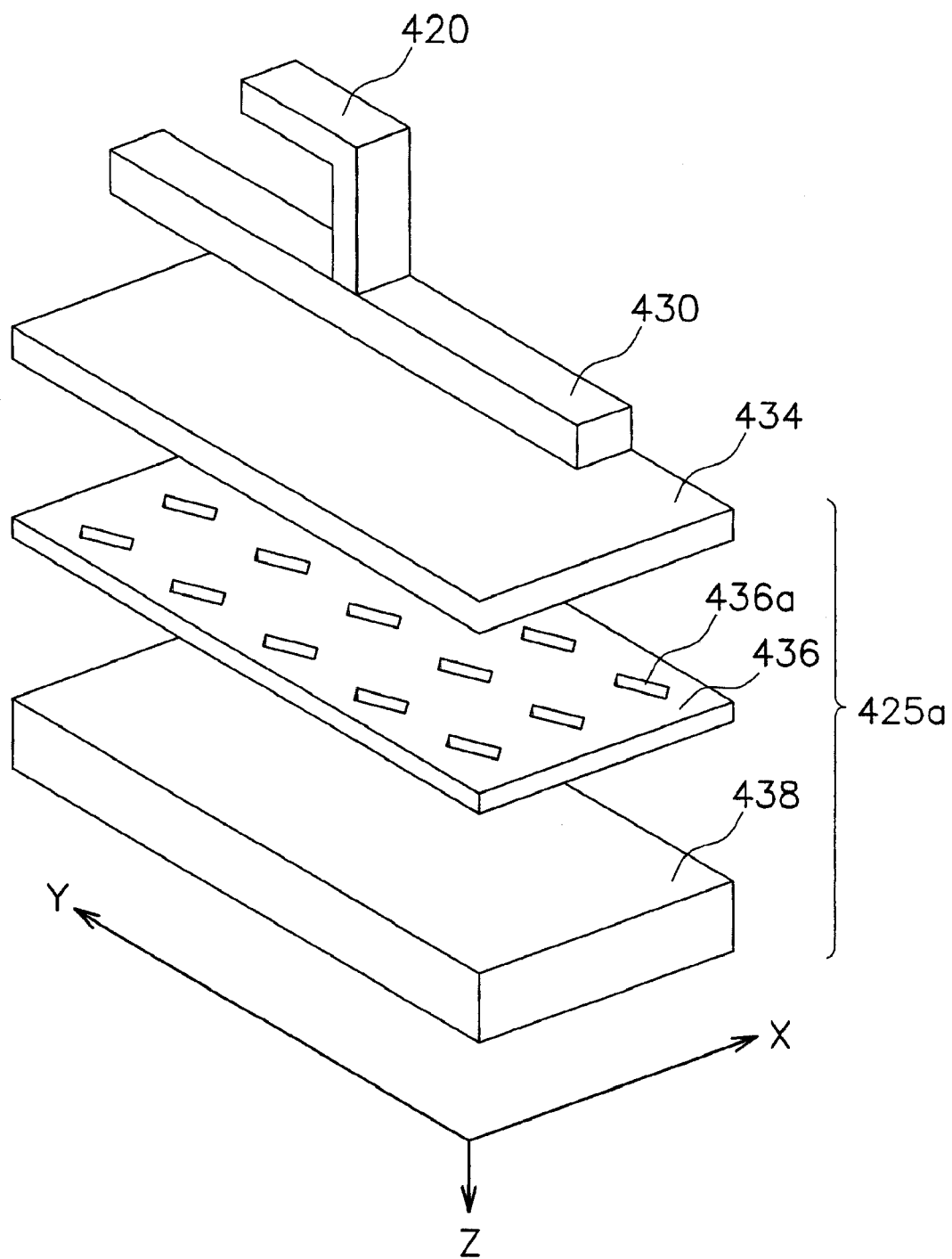
FIG. 21 is an exploded perspective view of portions of the plasma oxidizing and nitriding apparatus shown in FIG. 19.
Figure 22:
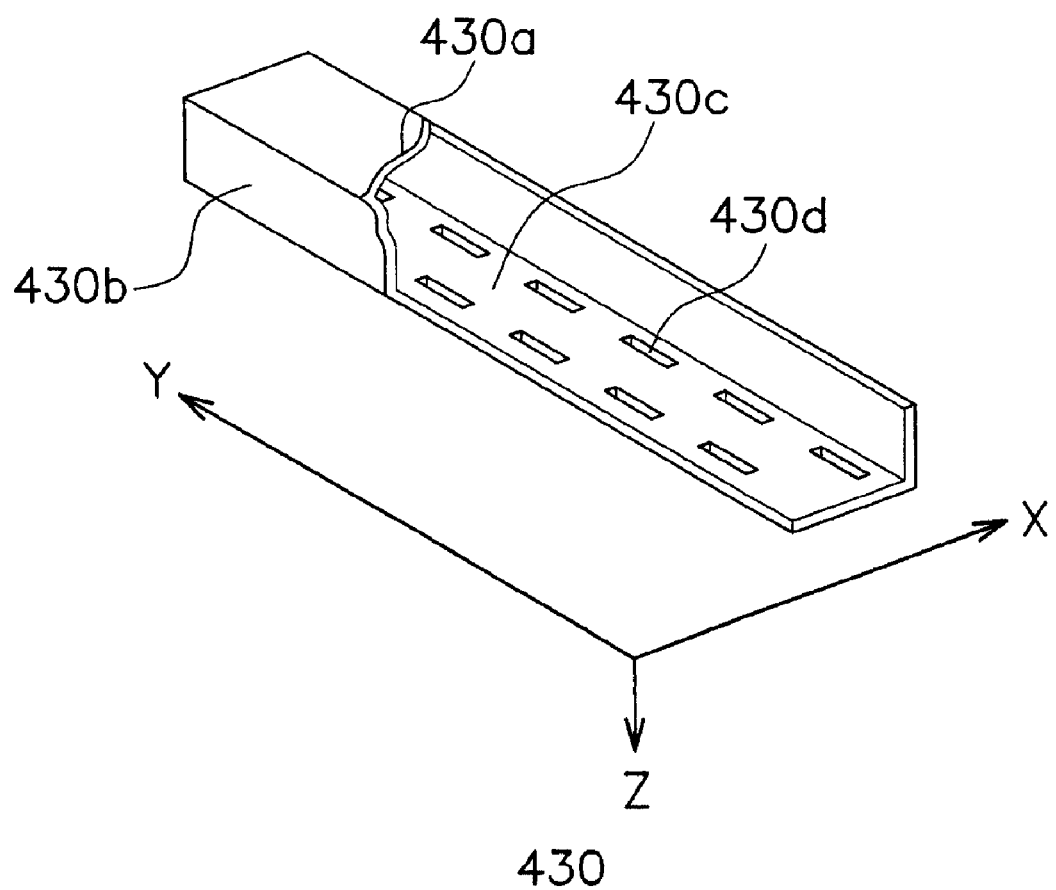
FIG. 22 shows the slot shape of an H-plane slot antenna.
Figure 23A:
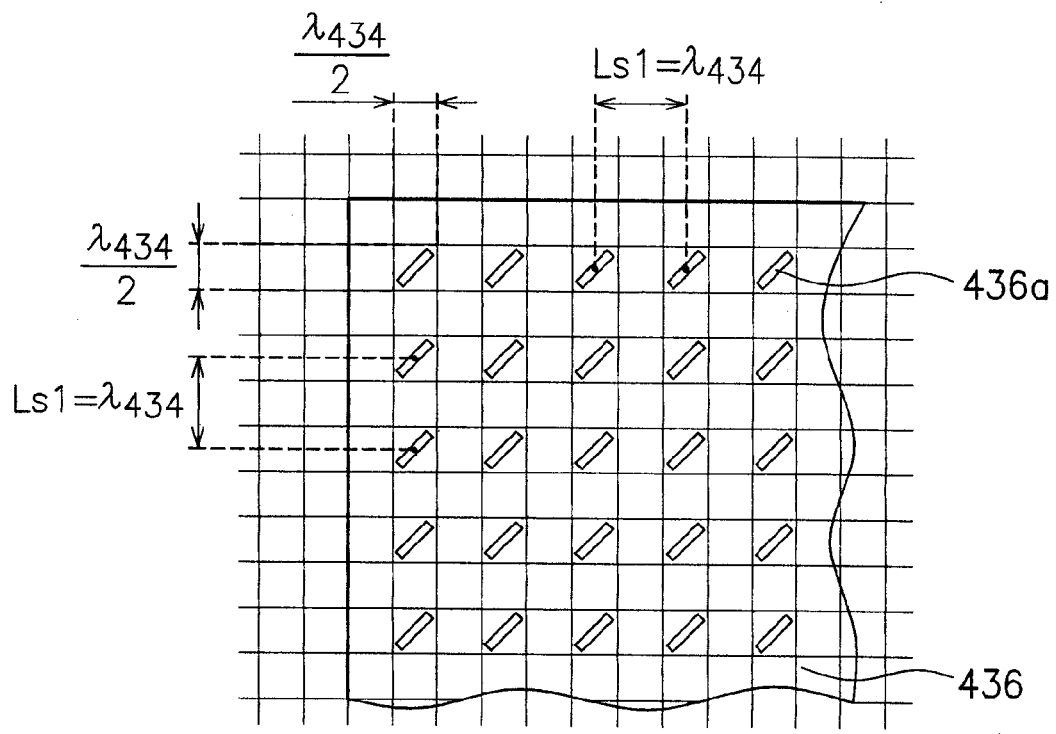
FIG. 23A shows the slot shape (1) of a rectangular slot plate.
Figure 23B:
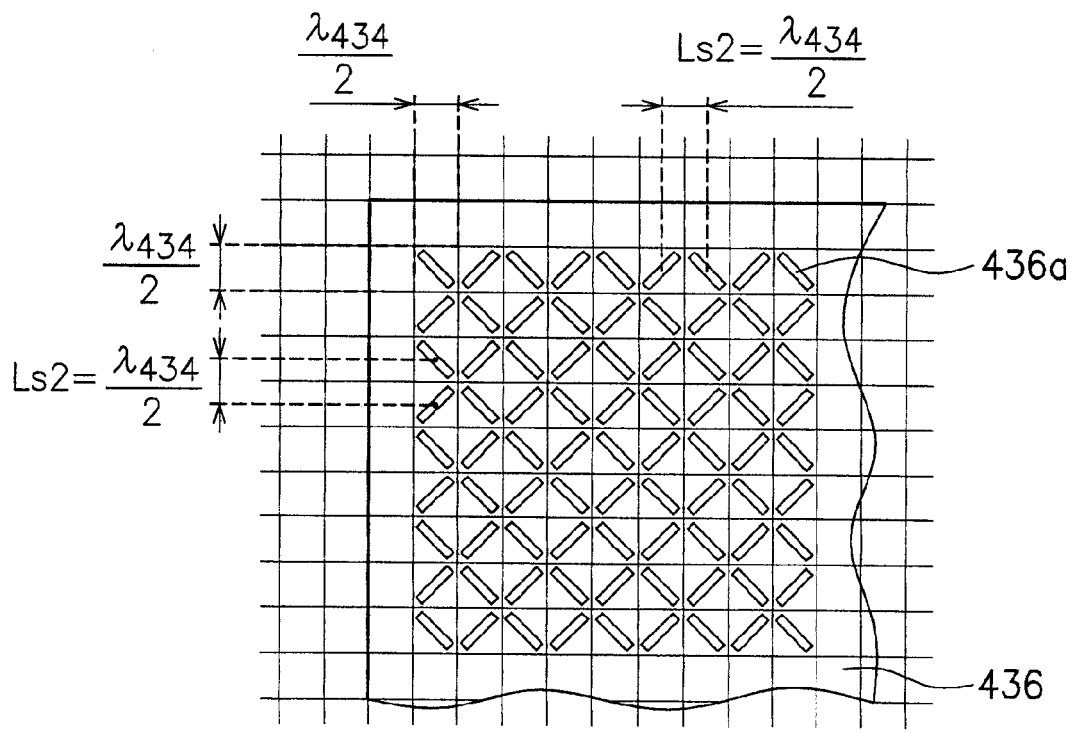
FIG. 23B shows the slot shape (2) of a rectangular slot plate.
Figure 24A:
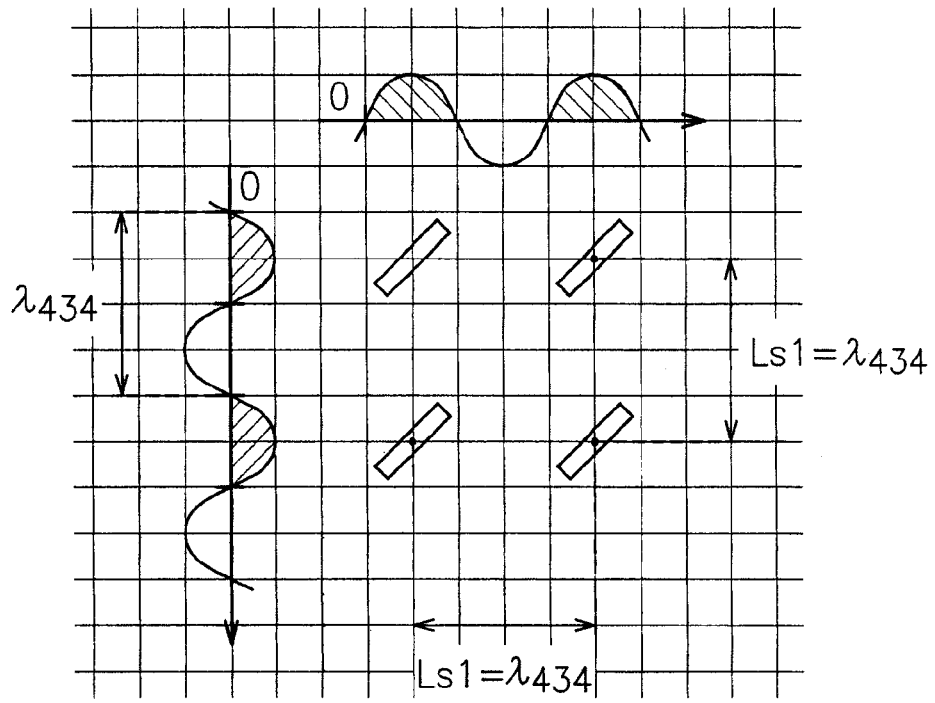
FIG. 24A is a diagram showing the relationship between the slots shown in FIG. 23A and the wavelength of the microwaves propagating in an antenna dielectric in the X and Y directions.
Figure 24B:
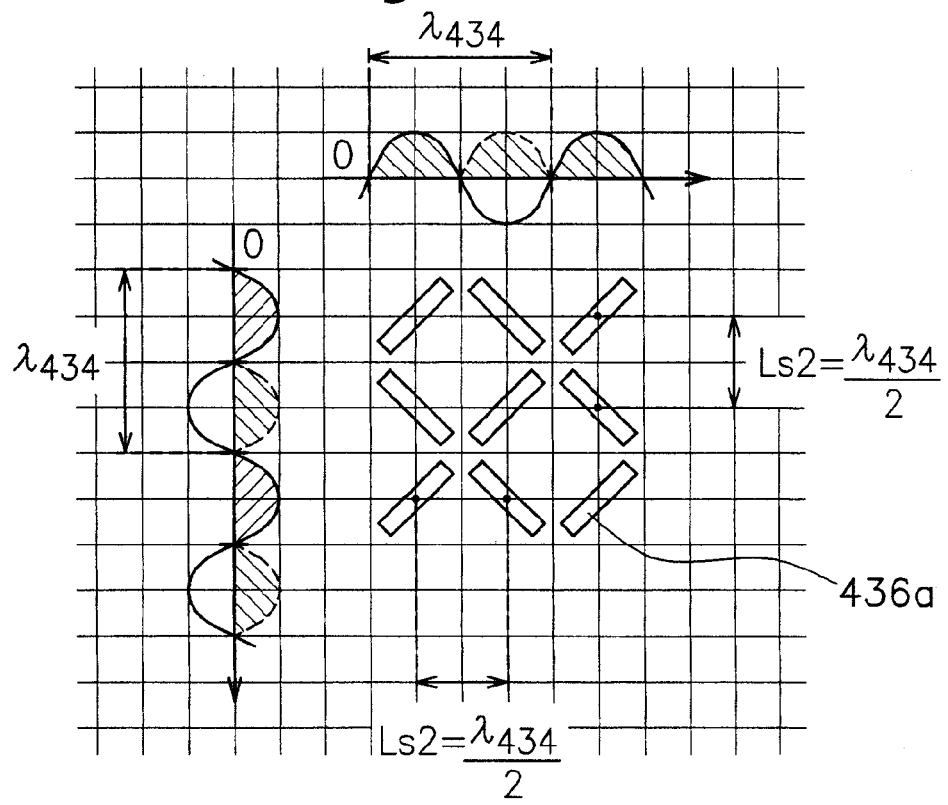
FIG. 24B is a diagram showing the relationship between the slots shown in FIG. 23B and the wavelength of the microwaves propagating in a rectangular antenna dielectric in the X and Y directions.

The plasma oxidizing and nitriding apparatus according to a fifth embodiment of the present invention will be described more specifically with reference to FIGS. 19 to 24. FIG. 19 shows the external appearance of the plasma oxidizing and nitriding apparatus of the fifth embodiment. FIG. 20 is a cross-sectional view of the apparatus of FIG. 19 taken along line E–E' of FIG. 19 and perpendicular to the X axis in FIG. 19. FIG. 21 is an exploded perspective view of portions of the plasma oxidizing and nitriding apparatus shown in FIG. 19. FIG. 22 shows the slot shape of an H-plane slot antenna. FIGS. 23A and 23B show the slot shape of a rectangular slot plate. FIGS. 24A and 24B are diagrams showing the relationship between the slot shapes shown in FIGS. 23A and 23B and the wavelength of the microwaves at a given time while the microwaves propagate in a rectangular antenna dielectric.

The plasma oxidizing and nitriding apparatus of this embodiment includes a rectangular waveguide 420, an H-plane slot antenna 430 and a chamber 425 whose cross-section along the surface of a sample 412 to be processed is rectangular (hereinafter referred to as rectangular chamber 425). The rectangular chamber 425 is provided with a processing chamber 425*b* whose cross-section along the surface of the sample 412 to be processed is rectangular (hereinafter referred to as rectangular processing chamber 425*b*), and a chamber lid 425*a* whose cross-section along the surface of the sample 412 to be processed is rectangular (hereinafter referred to as rectangular chamber lid) and which covers the rectangular processing chamber 425*b*. A gas introduction portion 410 is provided in the rectangular chamber 425.

As shown in FIG. 21, the rectangular chamber lid 425*a* includes a rectangular antenna dielectric 434, a slot plate 436 whose cross-section along the surface of the sample 412 to be processed is rectangular (hereinafter referred to as rectangular slot plate 436) and that is provided with slots 436*a*, and a dielectric 438 whose cross-section along the surface of the sample 412 to be processed is rectangular (hereinafter referred to as rectangular sealing dielectric 438), in this order. The H-plane slot antenna 430 is mounted on the rectangular antenna dielectric 434, and this H-plane slot antenna 430 introduces microwaves from the rectangular waveguide 420 to the rectangular antenna dielectric 434.

The H-plane slot antenna 430 has an upper portion 430*a*, side portions 430*b* and a bottom portion 430*c*. In the bottom portion 430*c*, that is, the H-plane of the H-plane slot antenna 430, rectangular slots 430*d* are formed along the sides of the H-plane slot antenna 430, as shown in FIG. 22. The rectangular waveguide 420 is mounted on the H-plane slot antenna 430. Other aspects of this structure are the same as those of the first embodiment.

Each portion of the plasma oxidizing and nitriding apparatus of this example will be described in greater detail below.

The rectangular antenna dielectric 434 has a cross-section along the surface of the sample 412 to be processed that is rectangular and makes the electric field strength distribution of the microwaves uniform. Furthermore, for the rectangular antenna dielectric 434, the rectangular slot plate 436 provided between the rectangular antenna dielectric 434 and the rectangular processing chamber 425*b* prevents the microwaves in the rectangular antenna dielectric 434 from being coupled to the microwaves reflected by plasma in the rectangular processing chamber 425*b*. Therefore, the microwaves propagating in the rectangular antenna dielectric 434 will rarely be susceptible to the effects of the plasma so that the electric field strength distribution of the microwaves easily can be made uniform.

The rectangular sealing dielectric 438 is formed such that the cross-section thereof along the surface of the sample 412 to be processed is rectangular, and forms an electric field for generating a plasma in the rectangular processing chamber 425*b* below the rectangular sealing dielectric 438 while retaining or further enhancing the uniformity of the electric field strength distribution of the microwaves introduced from the rectangular slot plate 436. Furthermore, the rectangular sealing dielectric 438 isolates the rectangular processing chamber 425*b* (which is a vacuum) and keeps it clean.

In the rectangular processing chamber 425*b*, an electric field is formed by the microwaves in the rectangular sealing dielectric 438. Since uniform microwaves are introduced from the rectangular sealing dielectric 438, a uniform plasma is generated in the rectangular processing chamber 425*b*. This plasma excites and activates gas molecules so that a uniform thin film is formed on the sample 412. In general, the rectangular processing chamber 425*b* is not a region in which microwaves propagate because the microwaves are reflected or absorbed by the plasma generated therein. Therefore, it is not necessary that the cross-section of the rectangular processing chamber 425*b* along the surface of the sample 412 to be processed be rectangular. However, since the microwaves are not completely absorbed and propagate in the rectangular processing chamber 425*b*, it is preferable that the cross-section of the rectangular processing chamber 425*b* along the surface of the sample 412 to be processed be rectangular so that the uniformity of the plasma is not disturbed by non-uniform microwaves. By doing this, the uniformity of the plasma can be enhanced further and a more uniform thin film can be formed.

The rectangular slot plate 436 is formed such that the section thereof that extends along the surface of the sample 412 to be processed is rectangular, and retains or further enhances the uniformity of the electric field strength distribution of the microwaves introduced from the rectangular antenna dielectric 434 by means of the slots 436*a*. Furthermore, the rectangular slot plate 436 prevents the plasma generated in the rectangular processing chamber 425*b* from affecting the rectangular antenna dielectric 434. Furthermore, it is not necessary that the section of the rectangular slot plate 436 that extends along the surface of the sample 412 to be processed be rectangular; any shape can be used so long as it covers the rectangular antenna dielectric 434, the rectangular sealing dielectric 438 and the rectangular processing chamber 425*b*. For example, its section can be circular.

For the shape and the arrangement of the slots 436*a* provided in the rectangular slot plate 436, the patterns shown in FIGS. 23A and 23B can be used, for example, when the wavelength of the microwaves propagating in the rectangular antenna dielectric 434 is assumed to be $\lambda_{434}$. FIGS. 23A and 23B show the slot shape of the rectangular slot plate. FIGS. 24A and 24B are diagrams showing the relationship between the slot shapes shown in FIGS. 23A and 23B and the wavelength of the microwaves at a given time while the microwaves propagate in a rectangular antenna dielectric in the X and Y directions.

In FIG. 23A, a plurality of rectangular slots 436*a* having substantially the same size are provided in substantially the same direction. The distance $Ls_1$ between the centers of adjacent slots 436*a* is set so as to substantially satisfy Equation 40 below.

$$Ls_1 = n_{Ls1} \lambda_{434} \qquad \text{Equation 40}$$

where $\lambda_{434}$ is the wavelength of the microwaves in the rectangular antenna dielectric 434 and $n_{Ls1}$ is an integer of 1 or more. The angle of inclination of the slots 436*a* can be changed depending on the microwave distribution in the rectangular sealing dielectric 438. In other words, the angle of inclination of the slots 436*a* is changed in consideration of the ratio of the propagation component in the X direction and the propagation component in the Y direction of the microwaves in the rectangular sealing dielectric 438, depending on the processing method of the sample 412 or the processing conditions of the apparatus.

When the microwaves having a wavelength $\lambda_{434}$ propagating in the rectangular antenna dielectric 434 shown in FIG. 24A are introduced to the slot plate 436, the microwaves in a hatched portion in FIG. 24A are introduced from each slot 436*a* to the rectangular sealing dielectric 438. Therefore, the phases of the microwaves in the rectangular sealing dielectric 438 are matched to each other in the central positions of the slots 436*a*, so that the degree of coupling between the microwaves introduced to the rectangular sealing dielectric 438 and the microwaves propagating in the rectangular sealing dielectric 438 can be increased.

On the other hand, in FIG. 23B, a plurality of rectangular slots 436*a* having substantially the same size are provided, and are linearly symmetrical with respect to either one of the axes that are orthogonal to each other that extend along the slot plate. The distance $Ls_2$ between the centers of the adjacent slots 436*a* is set so as to substantially satisfy Equation 41.

$$Ls_2 = n_{Ls2}(\lambda_{434}/2) \quad \text{Equation 41}$$

where $\lambda_{434}$ is the wavelength of the rectangular antenna dielectric 434 and $n_{Ls2}$ is an integer of 1 or more. The angle of inclination of the slots 436*a* is such as described above.

When microwaves having a wavelength $\lambda_{434}$ propagating in the rectangular antenna dielectric 434 shown in FIG. 24B are introduced to the slot plate 436, the microwaves in a hatched portion in FIG. 24B are introduced from each slot 436*a* to the rectangular sealing dielectric 438. Therefore, like noted above, the mounting density of the slots can be increased while loss due to interference of the microwaves is suppressed, so that more excitation of a uniform plasma can be achieved.

Furthermore, it is preferable that the dielectric constant in the slots 436*a* is about the same as that of the rectangular antenna dielectric 434, because the reflection of the microwaves when they pass through the slots 436*a* can be reduced, and the design can be simplified.

As shown in FIG. 22, the H-plane slot antenna 430 has rectangular slots 430*d* in a predetermined interval in the bottom portion 430*c* along the sides of the H-plane slot antenna 430. Therefore, this is useful for increasing the uniformity of the electric field strength distribution of the microwaves, together with the rectangular antenna dielectric 434, the rectangular slot plate 436, and the rectangular sealing dielectric 438, which make the microwaves uniform. In this example, the H-plane slot antenna is used as the antenna, but an E-plane slot antenna, a round waveguide, a coaxial waveguide, coupling devices other than slots and the like can be used. When a slot antenna whose section is rectangular is used, in particular, a large amount of power is not concentrated on one point and changes in the characteristics such as heat generation or anomalous discharges rarely occur. Furthermore, since the slot antenna is rectangular, it can be easily fixed to the rectangular antenna dielectric 434, so that the characteristics will rarely change, and thus a uniform plasma can be generated.

It is sufficient to provide the H-plane slot antenna 430 in at least one portion, but a plurality of H-plane slot antennas can be provided to be used in a large apparatus that processes a sample having a large diameter, or the H-plane slot antenna can be branched to introduce the microwaves to the dielectric. In this case, it is preferable to provide an even number thereof for easy design. Furthermore, it is more preferable that the number thereof provided is $2^n$ (where n is a natural number).

It is preferable to form the section of the rectangular chamber 425 that extends along the surface of the sample 412 to be processed into a rectangular shape in accordance with the rectangular antenna dielectric 434, the rectangular sealing dielectric 438 and the like, because there will be little electrical or structural nonconformity. However, when a plasma is generated, the microwaves are reflected or absorbed by the plasma in the rectangular chamber 425, and therefore it is not necessary that the rectangular chamber 425 be rectangular because it is no longer a microwave propagation region.

In the plasma oxidizing and nitriding apparatus of this example, the regions in which the microwaves propagate in a planar direction along the surface of the sample 412 to be processed have a rectangular shape, i.e., the rectangular antenna dielectric 434 and the rectangular sealing dielectric 438, and thus the electric field strength distribution of the microwaves becomes uniform as a whole, and a plasma is generated uniformly. Thus, a uniform thin film can be formed by this plasma, and the process margins of the flow rate or the composition ratio of the gas can be increased.

Furthermore, microwaves whose electric field strength distribution is made uniform by the rectangular antenna dielectric 434 are introduced to the rectangular sealing dielectric 438 uniformly via the rectangular slot plate 436, and the uniformity is further enhanced by the rectangular sealing dielectric 438. Thus, the uniformity of the microwaves can be easily maintained.

In the rectangular antenna dielectric 434 and the rectangular sealing dielectric 438, the uniform microwaves can be dampened by a plasma, and therefore it is not necessary that the standing wave condition is satisfied, and it is sufficient that the microwaves have an approximately uniform electric field strength distribution. However, it is preferable that the standing wave condition is satisfied, because canceling due to multiple reflection can be reduced, and a plasma can be generated more uniformly, so that a thin film can be formed on the surface of the sample 412 more uniformly. For the same reason, it is preferable that the rectangular processing chamber 425*b*, the rectangular slot plate 436, the H-plane slot antenna 430, and the rectangular waveguide 420 satisfy the standing wave condition.

Sixth Embodiment

Figure 25:
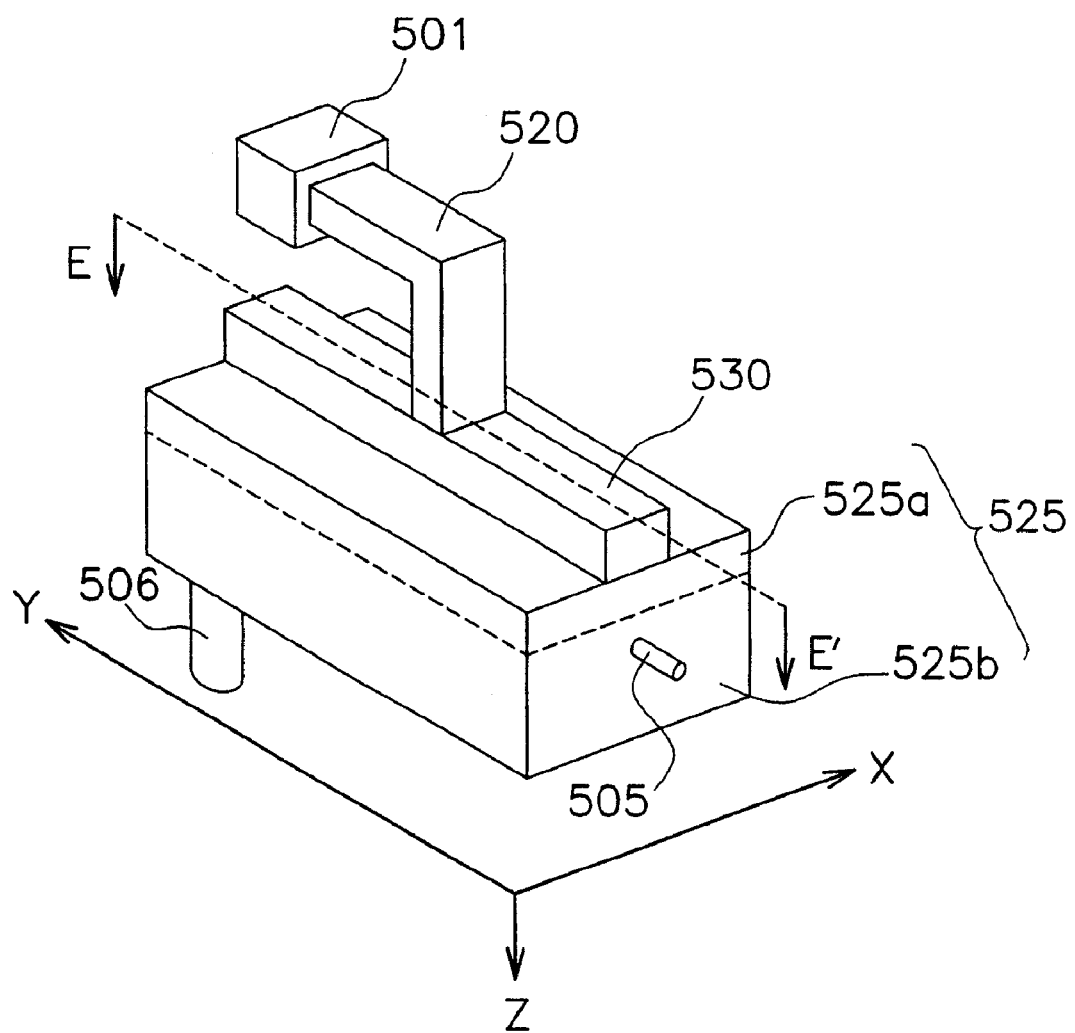
FIG. 25 shows the external appearance of a plasma oxidizing and nitriding apparatus of a sixth embodiment of the present invention.
Figure 26:
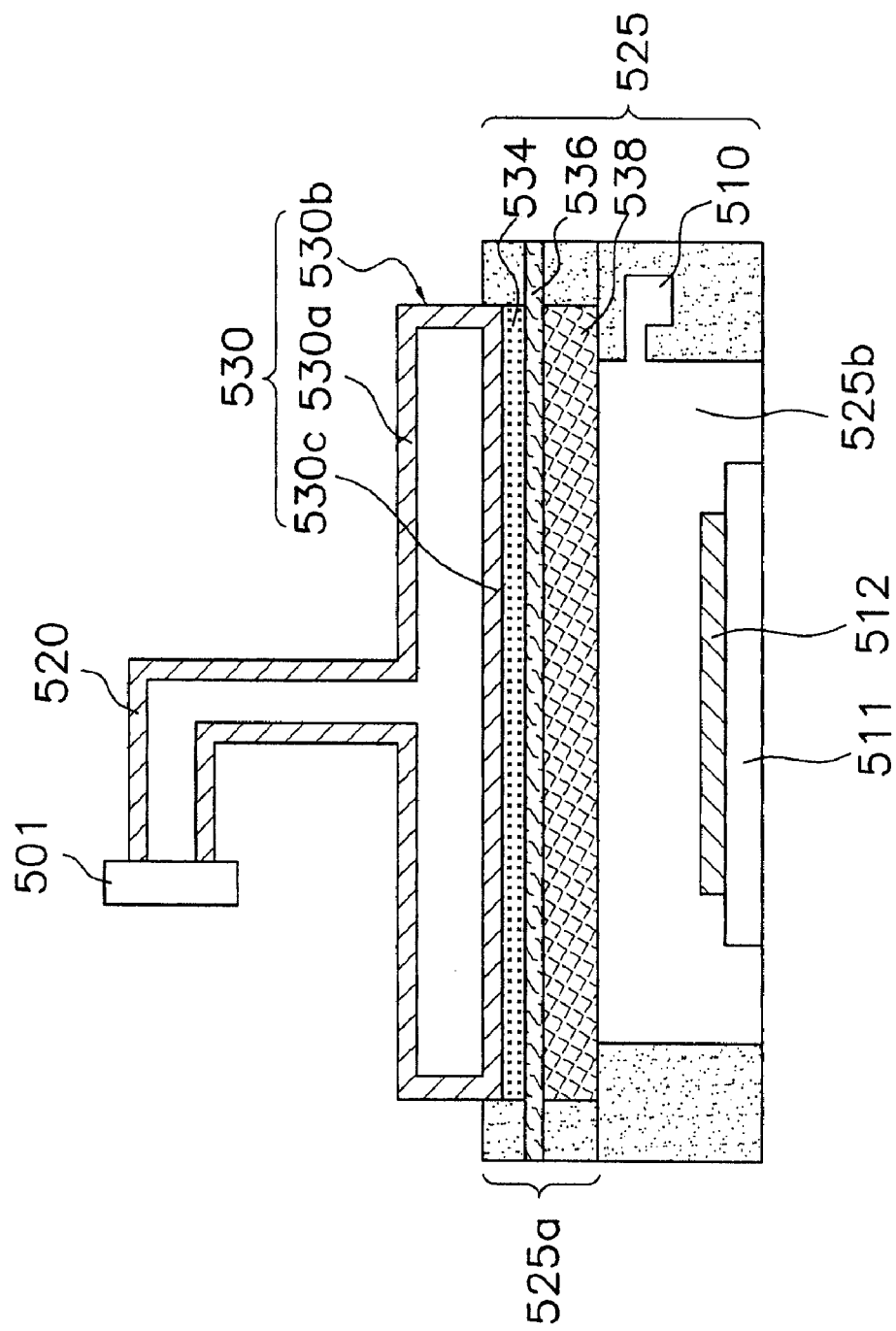
FIG. 26 shows a cross-section of the apparatus of FIG. 25 taken along line E–E' of FIG. 25 and perpendicular to the X axis in FIG. 25.
Figure 27:
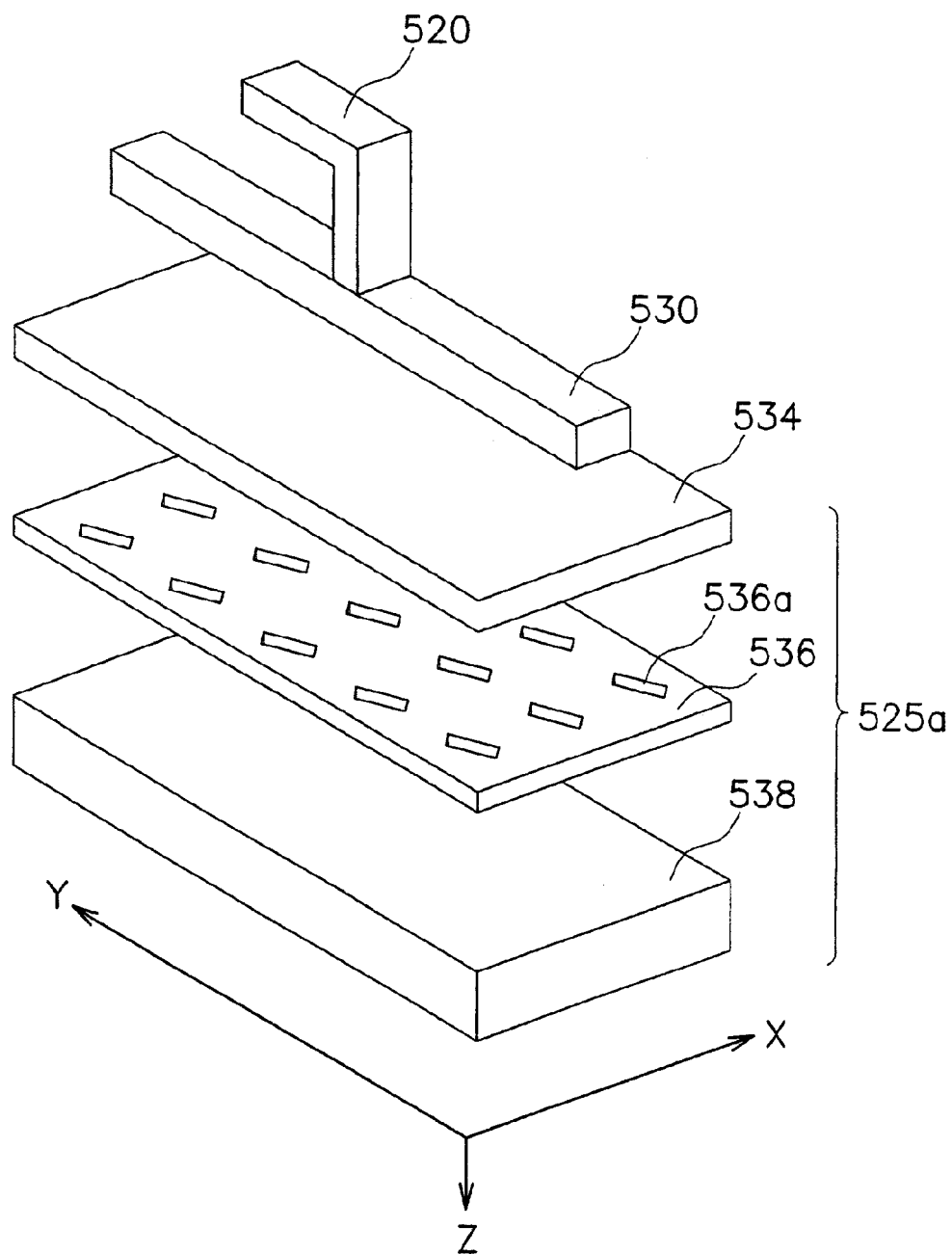
FIG. 27 is an exploded perspective view of portions of the plasma oxidizing and nitriding apparatus shown in FIG. 25.
Figure 28:
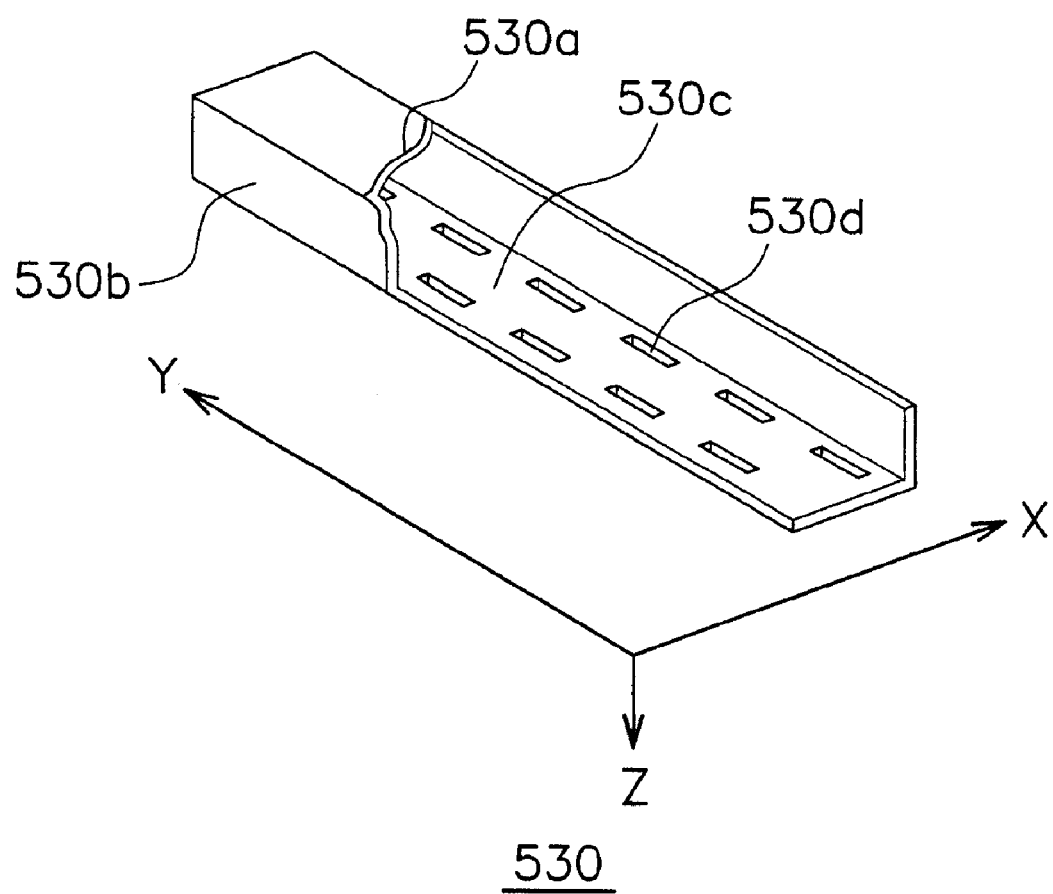
FIG. 28 shows the slot shape of an H-plane slot antenna.

The plasma oxidizing and nitriding apparatus according to a sixth embodiment of the present invention will be described more specifically with reference to FIGS. 25 to 29. FIG. 25 showing the external appearance of the plasma oxidizing and nitriding apparatus of the first example. FIG. 26 is a cross-sectional view of the apparatus of FIG. 25 taken along line E–E' of FIG. 25 and perpendicular to the X axis in FIG. 25. FIG. 27 is an exploded perspective view of portions of the plasma oxidizing and nitriding apparatus shown in FIG. 25. FIG. 28 shows the slot shape of an H-plane slot antenna. FIG. 25 to FIG. 28 corresponds to FIG. 19. to FIG. 22, respectively.

Figure 29:
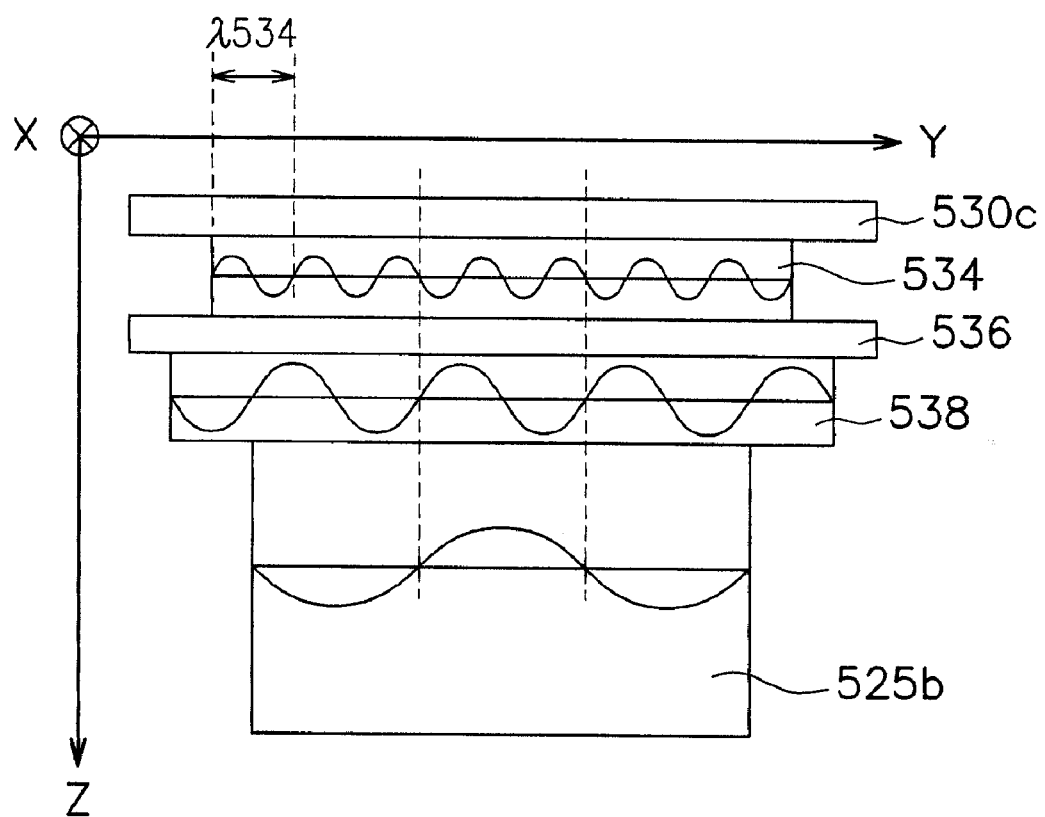
FIG. 29 is a diagram showing the relationship between the portions of the plasma oxidizing and nitriding apparatus shown in FIG. 26 and the wavelength of the microwaves in the microwave propagation regions.

FIG. 29 shows the relationship between the relevant parts of the plasma oxidizing and nitriding apparatus of FIG. 26 and the wavelengths in the Y direction of the microwaves in the microwave propagation region. Note that with the sections of a rectangular antenna dielectric 534, a rectangular sealing dielectric 538, and a rectangular processing chamber 525*b* that extend along the surface of a sample 512 to be processed and shown in FIGS. 25 and 26, the directions that are the same as those of two pairs of two opposing and parallel sides of these members are respectively assumed to be the X direction and the Y direction, and the direction perpendicular to the X and Y directions is assumed to be the Z direction. Furthermore, as shown in FIG. 28, the rectangular slots 530*d* of the H-plane slot antenna 530 are provided along the Y direction.

Here, the sections of the H-plane slot antenna 530, the rectangular antenna dielectric 534, the rectangular sealing dielectric 538, and the rectangular processing chamber 525*b* along the surface of the sample 512 to be processed are, for example, rectangular or square.

The length $L_{534X}$ in the X direction of the rectangular antenna dielectric 534 of this example and the length $L_{538X}$ in the X direction and/or the length $L_{538Y}$ in the Y direction of the rectangular sealing dielectric 538 are set to a multiple of half ($\lambda/2$) of the wavelength $\lambda$ of the microwaves propagating in the respective microwave propagation regions. In other words, the length in each Y direction is set so as to substantially satisfy Equations 42, 43 and/or 44.

$$L_{534X} = n_{534X} \times (\lambda_{534}/2) \quad \text{Equation 42}$$

$$L_{538X} = n_{538X} \times (\lambda/2) \quad \text{Equation 43}$$

$$L_{538Y} = n_{538Y} \times (\lambda_{538}/2) \quad \text{Equation 44}$$

where $\lambda_{534}$ is the wavelength of the microwaves in the rectangular antenna dielectric 534, $\lambda_{538}$ is the wavelength of the microwaves in the rectangular sealing dielectric 538, $n_{534X}$, $n_{538X}$ and $n_{538Y}$ are integers of 1 or more. The wavelength $\lambda_{534}$ and the wavelength $\lambda_{538}$ in Equations 42 to 44 are substantially the same wavelength in all directions, such as the X and Y directions, when the lengths of the rectangular antenna dielectric 534 and the rectangular sealing dielectric 538 in the X and Y directions are sufficiently larger than the respective wavelength $\lambda_{534}$ and $\lambda_{538}$, and expressed by Equations 45 and 46 below.

$$\lambda_{434} = \frac{\lambda}{\sqrt{\varepsilon_{r434}}} \quad \text{Equation 45}$$

$$\lambda_{438} = \frac{\lambda}{\sqrt{\varepsilon_{r438}}} \quad \text{Equation 46}$$

where $\lambda$ represents the free space wavelength, $\in_{r534}$ represents the dielectric constant of the rectangular antenna dielectric 534, and $\in_{r538}$ represents the dielectric constant of the rectangular sealing dielectric 538.

For the design of the dielectric, the lengths in the X and/or Y directions are set by considering the components of the microwaves in the propagating direction in the rectangular antenna dielectric 534 and the rectangular sealing dielectric 538. Furthermore, it is preferable to set the length of the Z direction in the same manner.

Each portion of the plasma oxidizing and nitriding apparatus of this embodiment will be described in greater detail below.

When the rectangular antenna dielectric 534 has two pairs of two opposing sides that are parallel, for example, like a rectangle or a square, the electric field strength distribution of the microwaves can be uniform. Furthermore, for the rectangular antenna dielectric 534, the rectangular slot plate 536 provided between the rectangular antenna dielectric 534 and the rectangular processing chamber 525*b* prevents the microwaves in the rectangular antenna dielectric 534 from being coupled to the microwaves reflected by the plasma in the rectangular processing chamber 525*b*. Therefore, the microwaves propagating in the rectangular antenna dielectric 534 will rarely be susceptible to the effects of the plasma so that the electric field strength distribution of the microwaves easily can become uniform. Furthermore, if the length in the X direction and/or the Y direction of the rectangular antenna dielectric 534 is set so as to satisfy the standing wave condition of the microwaves, the microwaves in the rectangular antenna dielectric 534 will be stabilized. Thus, the electric field strength distribution of the microwaves will become uniform.

When the rectangular sealing dielectric 538 has two pairs of two opposing sides that are parallel, for example, like a rectangle or a square, an electric field for generating a plasma can be formed in the rectangular processing chamber 525*b* below the rectangular sealing dielectric 538 while retaining or further enhancing the uniformity of the electric field strength distribution of the microwaves introduced from the rectangular slot plate 536. Furthermore, the rectangular sealing dielectric 538 isolates the rectangular processing chamber 525*b* (which is a vacuum) from the air and keeps it clean. Furthermore, if the length of the rectangular sealing dielectric 538 in the X direction and/or the Y direction is set so as to satisfy the standing wave condition of the microwaves, the microwaves in the rectangular sealing dielectric 538 will be stabilized. Thus, the electric field strength distribution of the microwaves will become uniform.

In general, the rectangular processing chamber 525*b* is not a region in which microwaves propagate because the microwaves are reflected or absorbed by the plasma. Therefore, it is not necessary that the section of the rectangular processing chamber 525*b* along the surface of the sample 512 to be processed be rectangular or square. However, there are microwaves that have not been reflected or absorbed, and propagate in the rectangular processing chamber 525*b*. Therefore, in order to reduce the effect of multiple reflection of the microwaves propagating in the rectangular processing chamber 525*b* on the plasma, it is preferable to set the length in the Y direction of the rectangular processing chamber 525*b* as above. By doing this, the uniformity of the plasma can be enhanced further, so that a more uniform thin film can be formed, and the process margins needed to obtain a uniform plasma can be increased.

Furthermore, like with the rectangular antenna dielectric 534 and the rectangular sealing dielectric 538, it is preferable to set the length of the rectangular processing chamber 525*b* in the X direction and/or the Y direction so as to substantially satisfies a multiple of a half-wavelength of the wavelength of the microwaves in the rectangular processing chamber 525*b*. Since there are microwaves in the rectangular processing chamber 525*b*, as described above, in order to reduce the effect of multiple reflection of the microwaves propagating in the rectangular processing chamber 525*b* on the plasma, it is preferable to set the length of the rectangular processing chamber 525*b* in the Y direction as above. By doing this, the uniformity of the plasma can be enhanced further, so that a more uniform thin film can be formed, and the process margins needed to obtain a uniform plasma can be increased.

The rectangular slot plate 536 retains or further enhances the uniformity of the electric field strength distribution of the microwaves introduced from the rectangular antenna dielectric 534 with the slots 536*a*. The angle of inclination of the slots 536*a* of the rectangular slot plate 536 can be changed depending on the microwave distribution in the rectangular sealing dielectric 538. In other words, the angle of inclination of the slots 536*a* is changed in consideration of the ratio of the propagation component in the X direction and the propagation component in the Y direction of the microwaves in the rectangular sealing dielectric 538, depending on the processing method of the sample 512 or the processing conditions of the apparatus.

By setting the lengths in the Y direction of the rectangular antenna dielectric 534 and the rectangular sealing dielectric 538 as described above, in the direction along the surface of the sample 512 to be processed in each dielectric, the standing wave condition of the microwaves is satisfied and the microwaves in the rectangular antenna dielectric 534 and the rectangular sealing dielectric 538 will be stabilized. Therefore, wave cancellation due to multiple reflection at the wall faces of the microwave propagation region can be reduced, and a uniform plasma can be generated efficiently. Thus, a thin film can be formed uniformly in a wafer having a large diameter.

The wavelength λ of the microwaves in each dielectric is changed with the dielectric constant ∈$_r$ in a chamber having a large diameter, so that it is preferable that the rectangular antenna dielectric 534 and the rectangular sealing dielectric 538 are formed of the same material or materials having about the same dielectric constant. When the dielectric constant ∈$_r$ is about the same, the wavelengths λ$_{534}$ and ∈$_{538}$ are about the same, so that the lengths in the X direction and/or the Y direction of the rectangular antenna dielectric 534 and the rectangular sealing dielectric 538 can be matched, and therefore a more realistic design can be achieved.

In addition to the fact that the lengths in the Y direction of the rectangular antenna dielectric 534 and rectangular sealing dielectric 538 satisfy the standing wave condition of the microwaves propagating in the respective dielectrics, it is preferable that the positions of the phases of the microwaves in the rectangular antenna dielectric 534 and the rectangular sealing dielectric 538 are matched to each other as shown in FIG. 29. With this, the phases of the rectangular antenna dielectric 534 and the rectangular sealing dielectric 538 can be matched to each other, so that a plasma can be excited uniformly. For the same reason, it is more preferable that the positions of all the microwaves propagating in the rectangular antenna dielectric 534, the rectangular sealing dielectric 538 and the rectangular processing chamber 525b are at least partially matched to each other.

Seventh Embodiment

Figure 30:
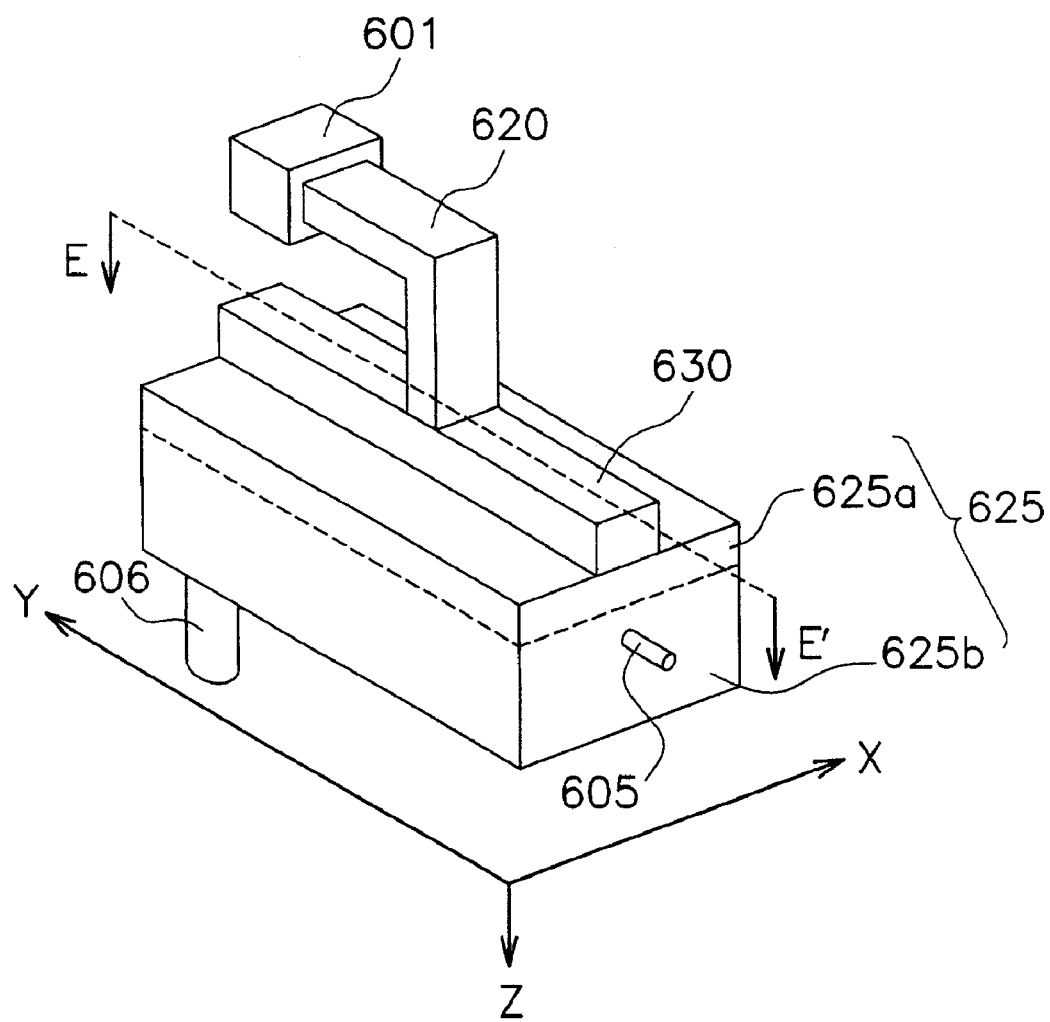
FIG. 30 shows the external appearance of a plasma oxidizing and nitriding apparatus according to a seventh embodiment of the present invention.
Figure 31:
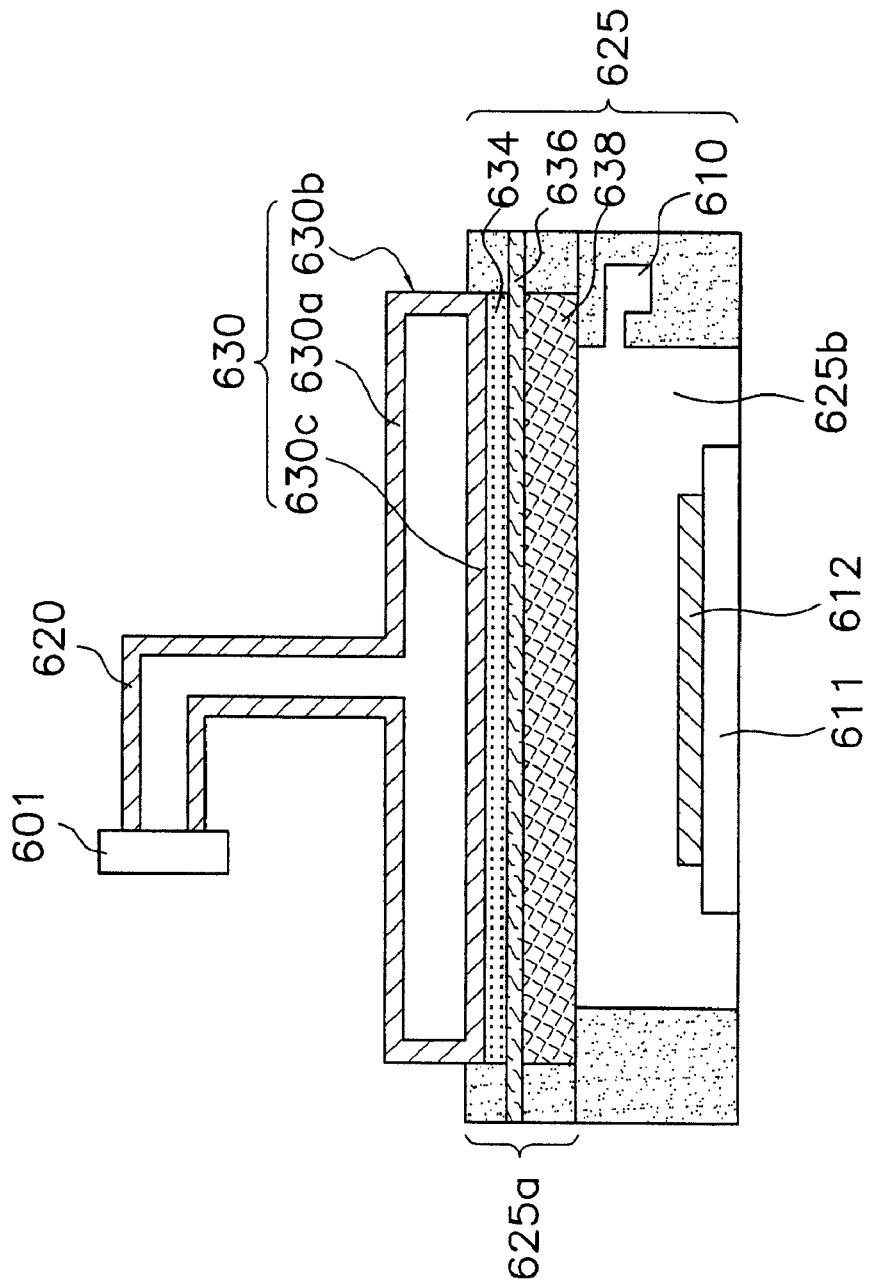
FIG. 31 shows a cross-section of the apparatus of FIG. 30 taken along line E–E' of FIG. 30 and perpendicular to the X axis in FIG. 30.
Figure 32:
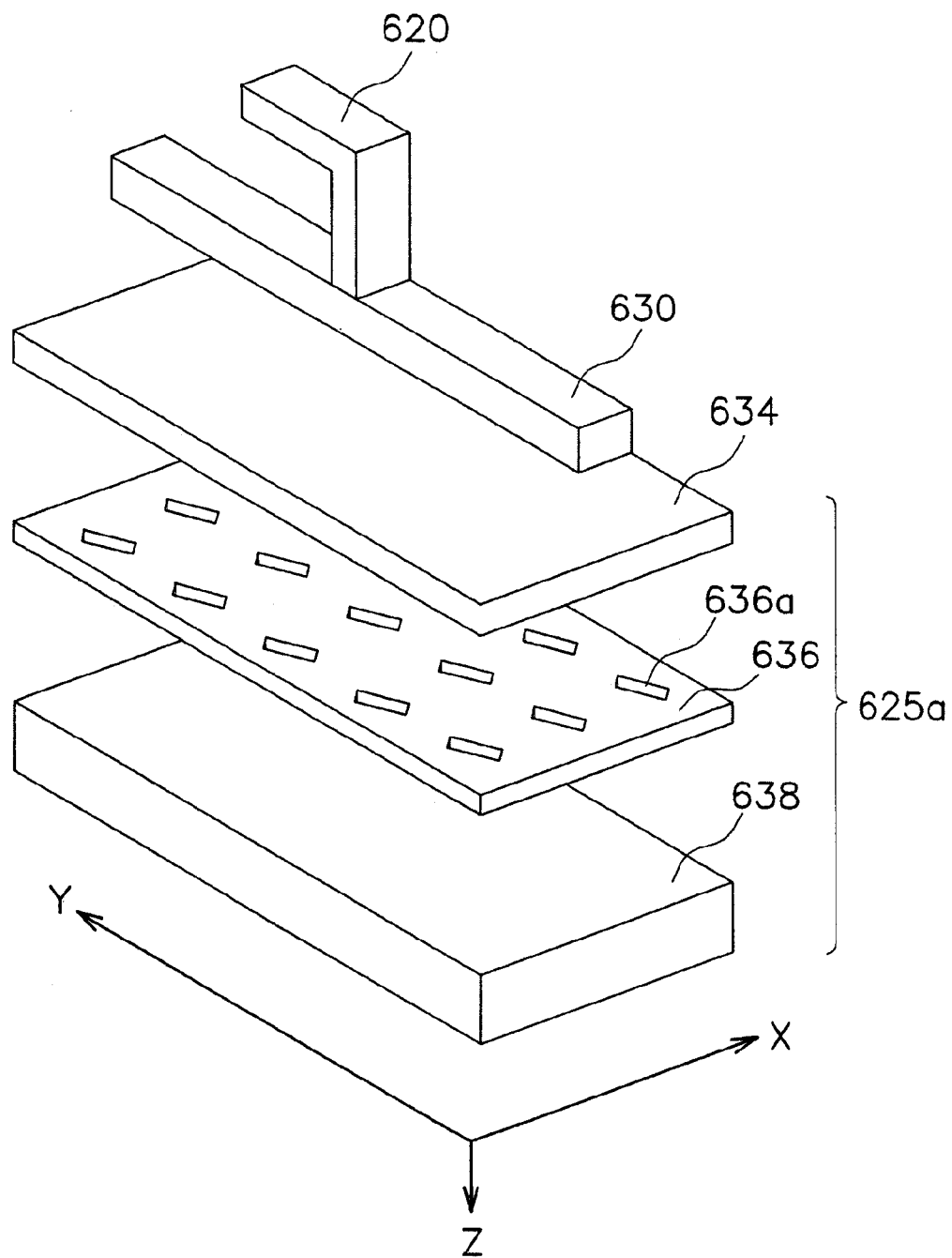
FIG. 32 is an exploded perspective view of portions of the plasma oxidizing and nitriding apparatus shown in FIG. 30.
Figure 33:
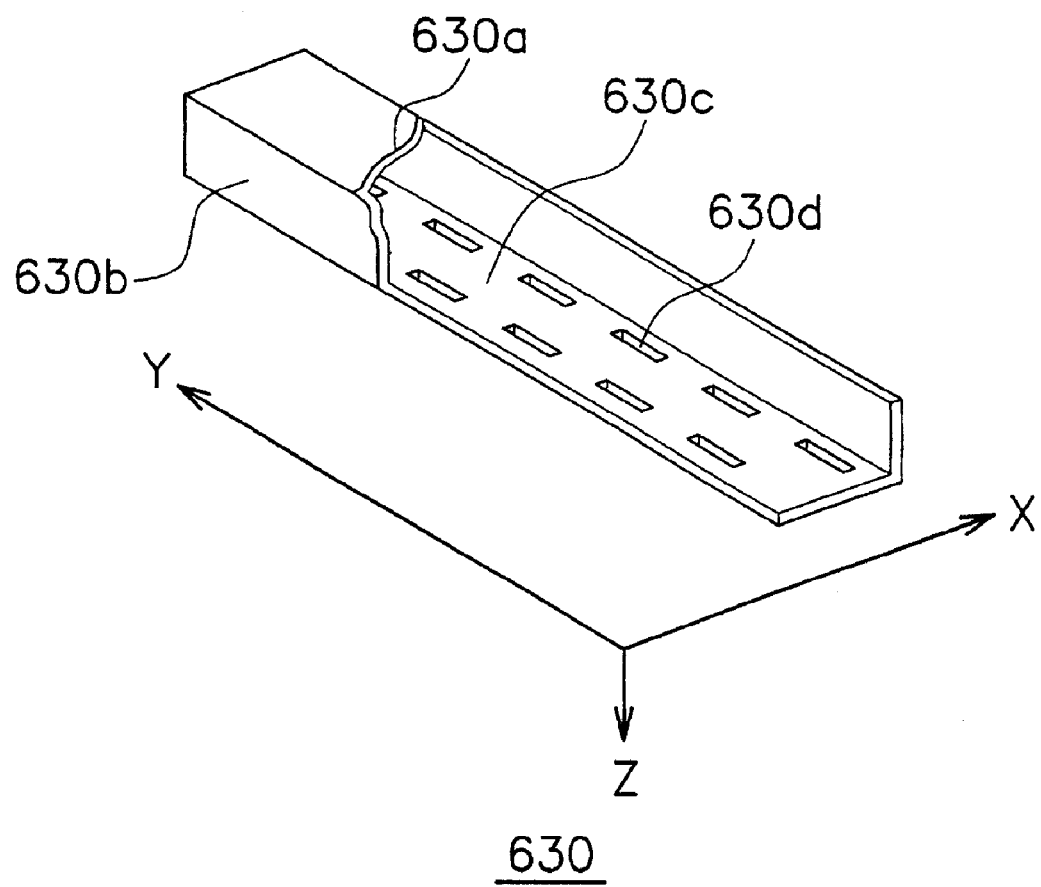
FIG. 33 shows the slot shape of an H-plane slot antenna.

A plasma oxidizing and nitriding apparatus according to a seventh embodiment of the present invention will be described more specifically with reference to FIGS. 30 to 35. FIG. 30 shows the external appearance of the plasma oxidizing and nitriding apparatus of the seventh embodiment. FIG. 31 is a cross-sectional view of the apparatus of FIG. 30 taken along line E–E' of FIG. 30 and perpendicular to the X axis in FIG. 30. FIG. 32 is an exploded perspective view of portions of the plasma oxidizing and nitriding apparatus shown in FIG. 30. FIG. 33 shows the slot shape of an H-plane slot antenna. FIGS. 30 to 33 correspond to FIGS. 19 to 22 respectively.

Figure 34A:
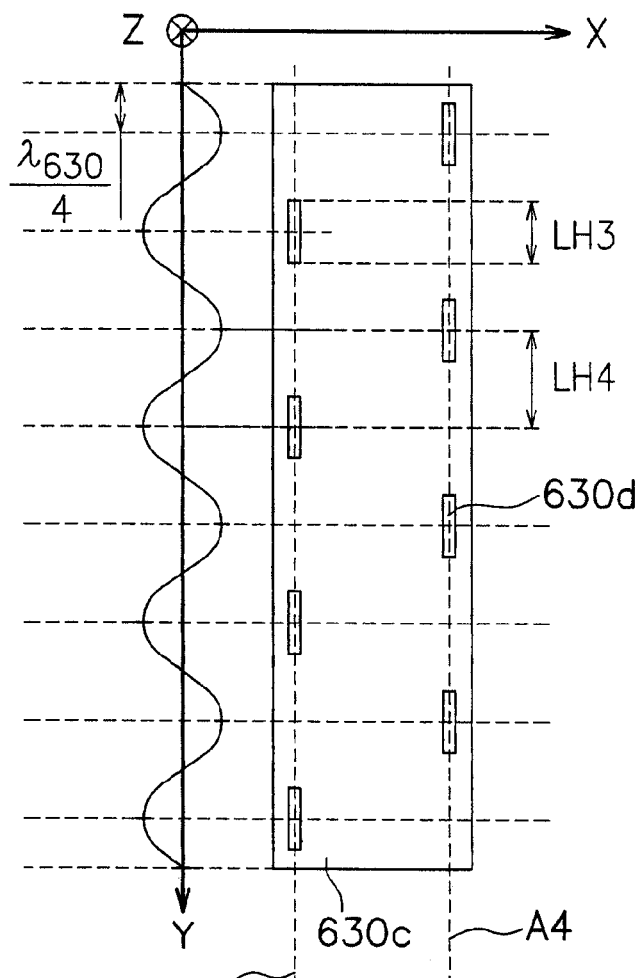
FIG. 34A shows the relationship between the position of the slots 630d and the wavelength of the microwaves in the H-plane slot antenna 630 of the plasma oxidizing and nitriding apparatus of FIG. 30.
Figure 34B:
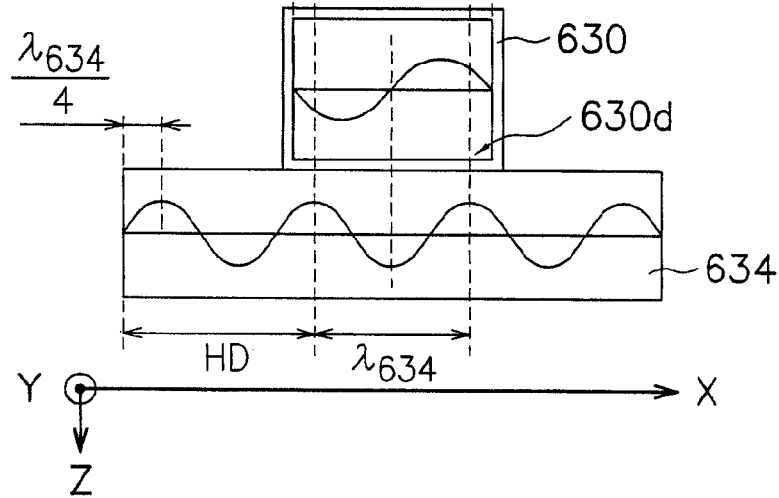
FIG. 34B shows the relationship of the wavelength of the microwaves between the H-plane slot antenna and the rectangular antenna dielectric in the section perpendicular to the Y direction of the plasma oxidizing and nitriding apparatus of FIG. 30.
Figure 35A:
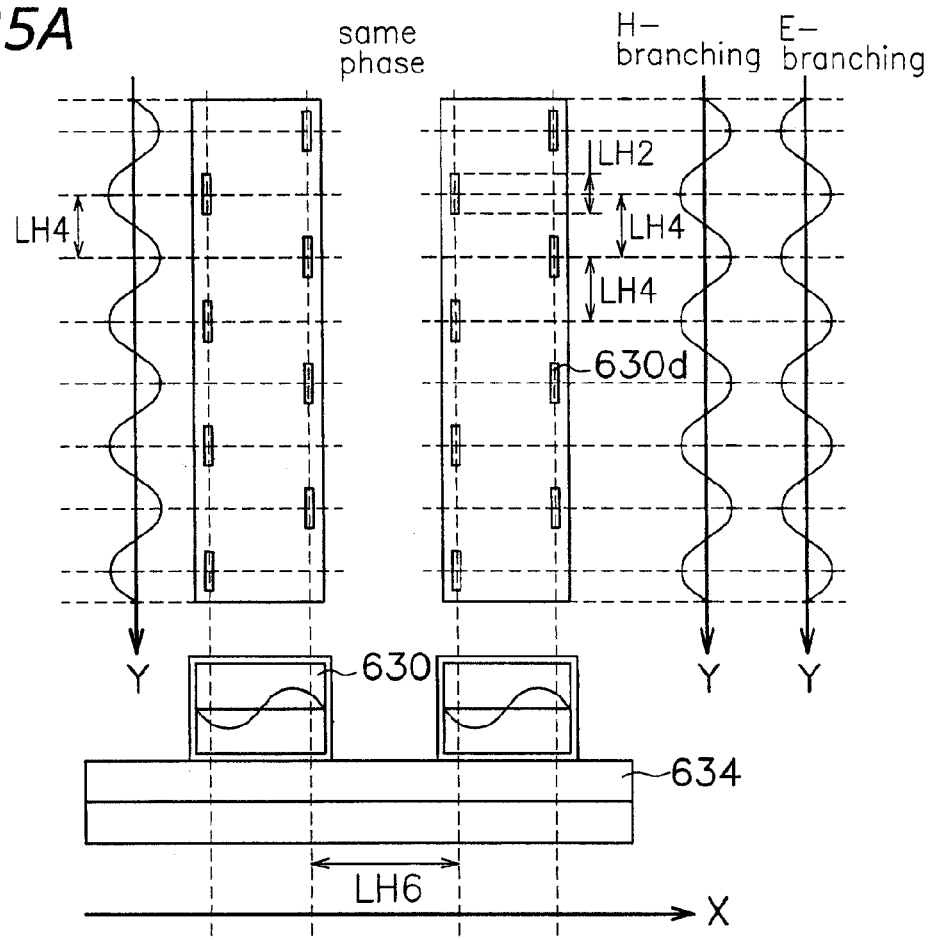
FIG. 35A is a diagram showing arrangement (1) of the slots 630d in the two H-plane slot antennas.
Figure 35B:
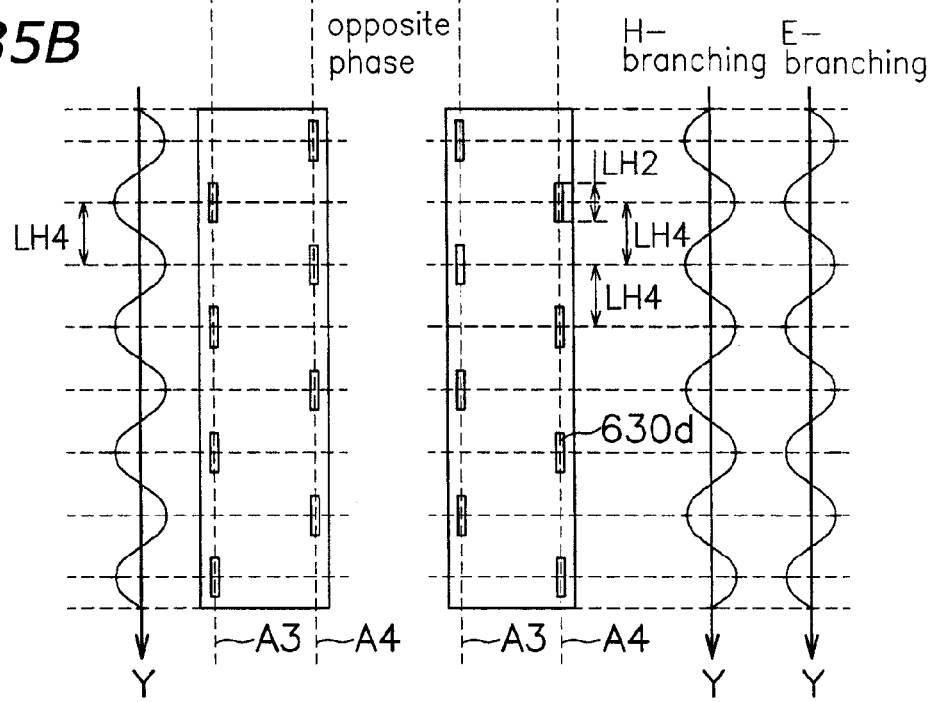
FIG. 35B is a diagram showing arrangement (2) of the slots 630d in the two H-plane slot antennas.

FIG. 34A shows the relationship between the position of the slots 630d in the bottom portion 630c of the H-plane slot antenna 630 and the wavelength of the microwaves in the H-plane slot antenna 630 of the plasma oxidizing and nitriding apparatus of FIG. 30. FIG. 34B shows the relationship of the wavelength of the microwaves between the H-plane slot antenna 630 and the rectangular antenna dielectric 634 in the section perpendicular to the Y direction of the plasma oxidizing and nitriding apparatus of FIG. 30. FIGS. 35A and 35B are diagrams showing the arrangement of the slots 630d in the two H-plane slot antennas. Note that with the sections of a rectangular antenna dielectric 634, a rectangular sealing dielectric 638, and a rectangular processing chamber 625b that extend along the surface of a sample 612 to be processed and shown in FIGS. 30 and 31, the directions that are the same as those of two pairs of two opposing and parallel sides of these members are respectively assumed to be the X direction and the Y direction, and the direction perpendicular to the X and Y directions is assumed to be the Z direction. Here, the sections of the H-plane slot antenna 630, the rectangular antenna dielectric 634, the rectangular sealing dielectric 638, and the rectangular processing chamber 625b that extend along the surface to be processed of the sample 612 are, for example, rectangular or square.

As shown in FIG. 30, the H-plane slot antenna 630 whose section along the surface to be processed of the sample 612 is rectangular or square is mounted on the rectangular antenna dielectric 634 such that the two opposing sides of the rectangular antenna dielectric 634 are oriented to the same direction as the two opposing sides of the H-plane slot antenna 630. This H-plane slot antenna 630 introduces microwaves from the rectangular waveguide 620 to the rectangular antenna dielectric 634.

In the plasma oxidizing and nitriding apparatus of this embodiment, the arrangement position of the slots 630d and the relationship of the wavelength of the microwaves between the H-plane slot antenna 630 and the rectangular antenna dielectric 634 are set. First, the arrangement position of the slots 630d will be described.

First, the rectangular slots 630d are alternately arranged on the axes A3 and A4 extending in the Y direction on the bottom portion 630c, as shown in FIG. 34A. Here, the distance L$_{H5}$ between the axes A3 and A4 shown in FIGS. 34A and 34B are set so as to substantially satisfy Equation 47 below.

$$L_{H5}=n_{LH5}(\lambda_{634}/2) \qquad \text{Equation 47}$$

where λ$_{634}$ is the wavelength of the microwaves in the rectangular antenna dielectric 634 and n$_{LH5}$ is an integer of 1 or more. By setting the distance L$_{H5}$ between the axes A3 and A4, as shown in FIG. 34B, the phase relationship of the microwaves in the rectangular antenna dielectric 634 in the X direction of the bottom portion 630c can be matched in the positions of the slots 630d on the axes A3 and A4. Therefore, interference such as the canceling of the microwaves introduced from the slots 630d on the two axes to the rectangular antenna dielectric 634 can be reduced, and a low loss and uniform microwave distribution can be obtained.

Furthermore, it is preferable to set the length L$_{H3}$ in the Y direction of the slots 630d and/or the distance L$_{H4}$ between the central positions in the Y direction of the slots 630d alternately arranged on the axes A3 and A4 so as to substantially satisfy Equations 48 and/or 49 below.

$$L_{H3}=n_{LH3}(\lambda_{630}/2) \qquad \text{Equation 48}$$

$$L_{H4}=n_{LH4}(\lambda_{630}/2) \qquad \text{Equation 49}$$

where λ$_{630}$ is the wavelength of the microwaves in the H-plane slot antenna 630, and n$_{LH3}$ and n$_{LH4}$ are integers of 1 or more. By setting as above, L$_{H3}$ becomes the resonance length of the microwaves in the H-plane slot antenna 630, and the degree of coupling between the microwaves introduced from the H-plane slot antenna 630 to the rectangular antenna dielectric 634 and the microwaves in the rectangular antenna dielectric 634 can be increased. Furthermore, by setting L$_{H4}$ as above, the phase and the degree of coupling of the microwaves introduced from the slots 630d alternately arranged on the two axes to the rectangular antenna dielectric 634 can be matched to each other.

Furthermore, as shown in FIG. 34A, it is preferable that the central position of the slots 630d is matched to the position of the antinodes of the microwave propagating in the Y direction in the H-plane slot antenna, because the degree of coupling can be increased further.

Furthermore, it is preferable to set the axes A3 and A4 so as to be linearly symmetrical with respect to the central axis in the Y direction of the H-plane slot antenna 630, and to arrange the slots 630d on these axes. By arranging the slots 630d in this manner, the degree of coupling between the microwaves introduced from slots 630d and the microwaves in the rectangular antenna dielectric 634 becomes substantially the same, which makes it easy to achieve uniform microwaves.

It is preferable that the width $W_2$ in the X direction of the H-plane slot antenna 630 is set so as to substantially satisfy Equation 50 below.

$$W_2 \simeq L_{H5} \qquad \text{Equation 50}$$

By setting the width $W_2$ and the $L_{H5}$ to be substantially the same, the degree of coupling between the microwaves introduced from slots 630d and the microwaves in the rectangular antenna dielectric 634 can be increased.

Secondly, the axes A3 and A4 are set such that the distance HD between the end face along the Y direction of the rectangular antenna dielectric 634 and each of the axes A3 and A4 substantially satisfies Equation 51, and the slots 630d are arranged on these axes.

$$HD = n_{HD}(\tfrac{1}{4})\lambda_{634} \qquad \text{Equation 51}$$

where $\lambda_{634}$ is the wavelength of the microwaves in the rectangular antenna dielectric 634, and $n_{HD}$ is an integer of 1 or more. By setting HD as above, the degree of coupling between the microwaves introduced from slots 630d and the microwaves in the rectangular antenna dielectric 634 can be increased and anomalous discharge can be suppressed. In other words, for example, a coupled portion of the rectangular antenna dielectric 634 and the H-plane slot antenna 630 has a relationship opposite to choke, so that an even higher degree of coupling therebetween can be obtained. In order to increase the degree of coupling, for example, an odd number is selected as the $n_{HD}$, and in order to suppress anomalous discharge, an even number is selected as the $n_{HD}$.

Next, the relationship between the wavelength $\lambda_{630}$ of the microwaves in the H-plane slot antenna 630 and the wavelength $\lambda_{634}$ of the microwaves in the rectangular antenna dielectric 634 will be described.

When the microwaves introduced from the axis A3 to the rectangular antenna dielectric 634 are in the same phase as those from the axis A4, setting is performed so as to satisfy Equation 52. When in the opposite phase, setting is performed so as to satisfy Equation 53.

$$\lambda_{630}/2 = 2m(\tfrac{1}{2})\lambda_{634} \qquad \text{Equation 52}$$

$$\lambda_{630}/2 = (2m+1)(\tfrac{1}{2})\lambda_{634} \qquad \text{Equation 53}$$

where m is an integer of 1 or more. The shape or the structure of the H-plane slot antenna 630 can be changed so as to satisfy the relationship of Equation 52 or 53. By setting as above, the phase position of the microwaves in the H-plane slot antenna 630 is matched to that in the rectangular antenna dielectric 634, and the standing wave condition can be satisfied at the same time. For this reason, the microwaves propagating in the respective propagation regions interfere with each other, so that disturbance of the standing wave condition can be reduced. Therefore, the dampening of the microwaves can be suppressed, which facilitates generation of uniform microwaves and the formation of a uniform thin film by a uniform plasma.

In the above, only the H-plane slot antenna 630 alone is used, but it is possible that the rectangular waveguide is branched and connected to a plurality of H-plane slot antennas 630 to introduce microwaves to the rectangular antenna dielectric 634. As a branching method, for example, in the case of branching it into two, H-branching in which the microwaves in two H-plane slot antennas 630 have the same phases, or E-branching in which the phases are opposite can be used.

FIGS. 35A and 35B show the arrangement position of the slots 630d in the bottom portion 630c of the H-plane slot antenna 630 and the waveforms of the microwaves in the Y direction in the H-plane slot antenna 630, when the rectangular waveguide 620 is H-branched or E-branched, and then microwaves are introduced to the rectangular antenna dielectric 634 via two H-plane slot antennas 630. The slots 630d positioned in the axes A3 and A4 in the H-plane slot antenna 630 in FIGS. 35A and 35B are arranged in the same manner as in FIGS. 34A and 34B.

FIG. 35A is a plan view of two H-plane slot antennas 630 that are identical and in which the slots 630d are arranged in the same positions. FIG. 35B is a plan view of two H-plane slot antennas 630 that are identical and in which the slots 630d are arranged in a linearly symmetrical manner with respect to the Y direction. Here, as shown in FIG. 35A, when the arrangement positions of the slots 630d in the two H-plane slot antennas 630 are the same will be referred to as the same phase arrangement position, and as shown in FIG. 35B, when the structure is linearly symmetrical and the arrangement positions are symmetrical with each other will be referred to as the opposite phase arrangement position. As shown in FIG. 35, the distance in the X direction between the adjacent slots 630d in the H-plane slot antenna 630 is assumed to be $L_{H6}$. In FIGS. 35A and 35B, the waveform on the left side shows the microwaves on the left side in the H-plane slot antenna 630, and the waveform on the right side shows the microwaves on the right side in the H-plane slot antenna 630 after H-branching and E-branching.

Furthermore, Table 1 below shows the relationship of the distance $L_{H6}$ when H-branching or E-branching is combined with the arrangement position of the same phase or the arrangement position of the opposite phase. Here, the distance $L_{H6}$ is set such that the phases of the microwaves in the rectangular antenna dielectric 634 in the central positions of the slots 630d of the two H-plane slot antennas 630 are matched to each other.

TABLE 1

| phase relationship of H-plane slot antenna | Distance $L_{H6}$ | |
|---|---|---|
| | branching | |
| | H-branching | E-branching |
| same phase | $\dfrac{\lambda_{634}}{2}(2n_{LH6})$ | $\dfrac{\lambda_{634}}{2}(2n_{LH6}+1)$ |
| opposite phase | $\dfrac{\lambda_{634}}{2}(2n_{LH6}+1)$ | $\dfrac{\lambda_{634}}{2}(2n_{LH6})$ |

By setting the distance $L_{H6}$ as above, the phases of the microwaves introduced from the slots 630d to the rectangular antenna dielectric 634 are matched to each other, so that interference such as wave cancellation can be reduced.

Furthermore, a shape that allows a single mode operation is preferable, because interference of the microwaves in the H-plane slot antenna 630 or the like can be reduced. The length $L_Y$, for example, in the Y direction of the H-plane slot antenna 630 that allows a single mode operation can be derived from Equation 54 below.

$$\lambda_{630} = \frac{1}{\sqrt{\left(\frac{1}{\lambda}\right)^2 - \left(\frac{1}{2L_Y}\right)^2}}$$

where $\lambda_{630}$ is the wavelength of the microwaves in the H-plane slot antenna 630, and $\lambda$ is the free space wavelength.

Furthermore, in place of the H-plane slot antenna 630, an E-plane slot antenna, a round waveguide, a coaxial antenna or other coupling devices than slots can be used.

In the plasma oxidizing and nitriding apparatus of this embodiment, by setting the arrangement positions of the slots 630d and the relationship of the wavelength of the microwaves between the H-plane slot antenna 630 and the rectangular antenna dielectric 634 as above, a thin film can be formed uniformly. Furthermore, in this embodiment, since the sections of the rectangular antenna dielectric 634, the rectangular processing chamber 625b, the rectangular waveguide 620 and the like that extend along the surface of the sample 612 to be processed are rectangular, the electric field strength distribution of the microwaves will rarely concentrate on one portion, and the process margins of the flow rate or the composition ratio of the gas or the like can be increased.

However, in general, the rectangular processing chamber 625b is not a region in which microwaves propagate, because the microwaves are absorbed by a plasma generated therein. Therefore, it is not necessary that the section of the rectangular processing chamber 625b that extends along the surface of the sample 612 to be processed be rectangular. However, since the microwaves are not completely absorbed and propagate in the rectangular processing chamber 625b, it is preferable that the section of the rectangular processing chamber 625b along the surface of the sample 612 to be processed be rectangular so that the uniformity of the plasma is not disturbed by non-uniform microwaves. By doing this, the uniformity of the plasma can be enhanced further and a more uniform thin film can be formed. Moreover, the process margins required to obtain a uniform plasma can be increased.

Furthermore, the H-plane slot antenna 630, the rectangular antenna dielectric 634, the rectangular processing chamber 625b, the rectangular chamber lid 625a and the like can be formed in a shape other than a rectangle or a square. It is preferable that they are formed in a rectangular shape in which two pairs of two opposing sides are parallel, because there is less concentration of the microwaves on one portion.

Eighth Embodiment

Figure 36:
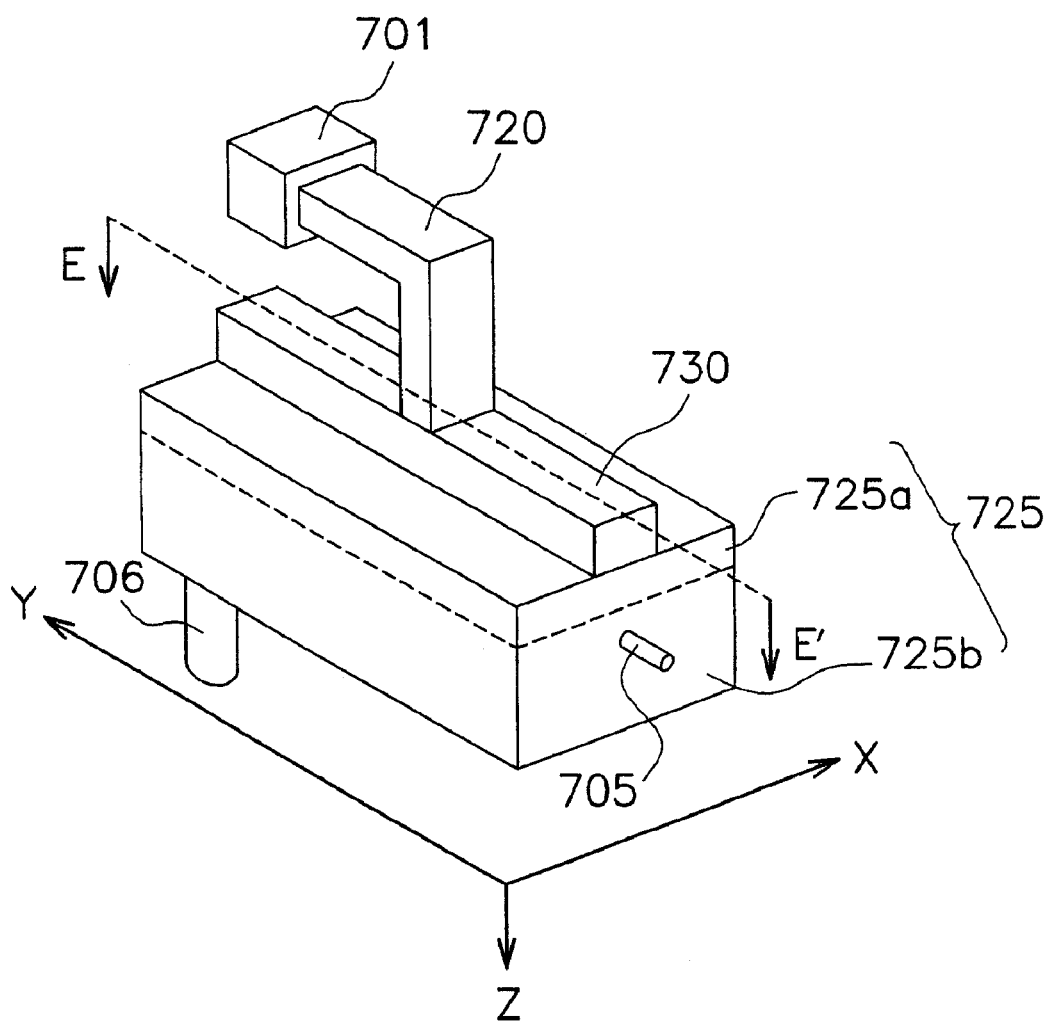
FIG. 36 shows the external appearance of a plasma oxidizing and nitriding apparatus according to a eighth embodiment of the present invention.
Figure 37:
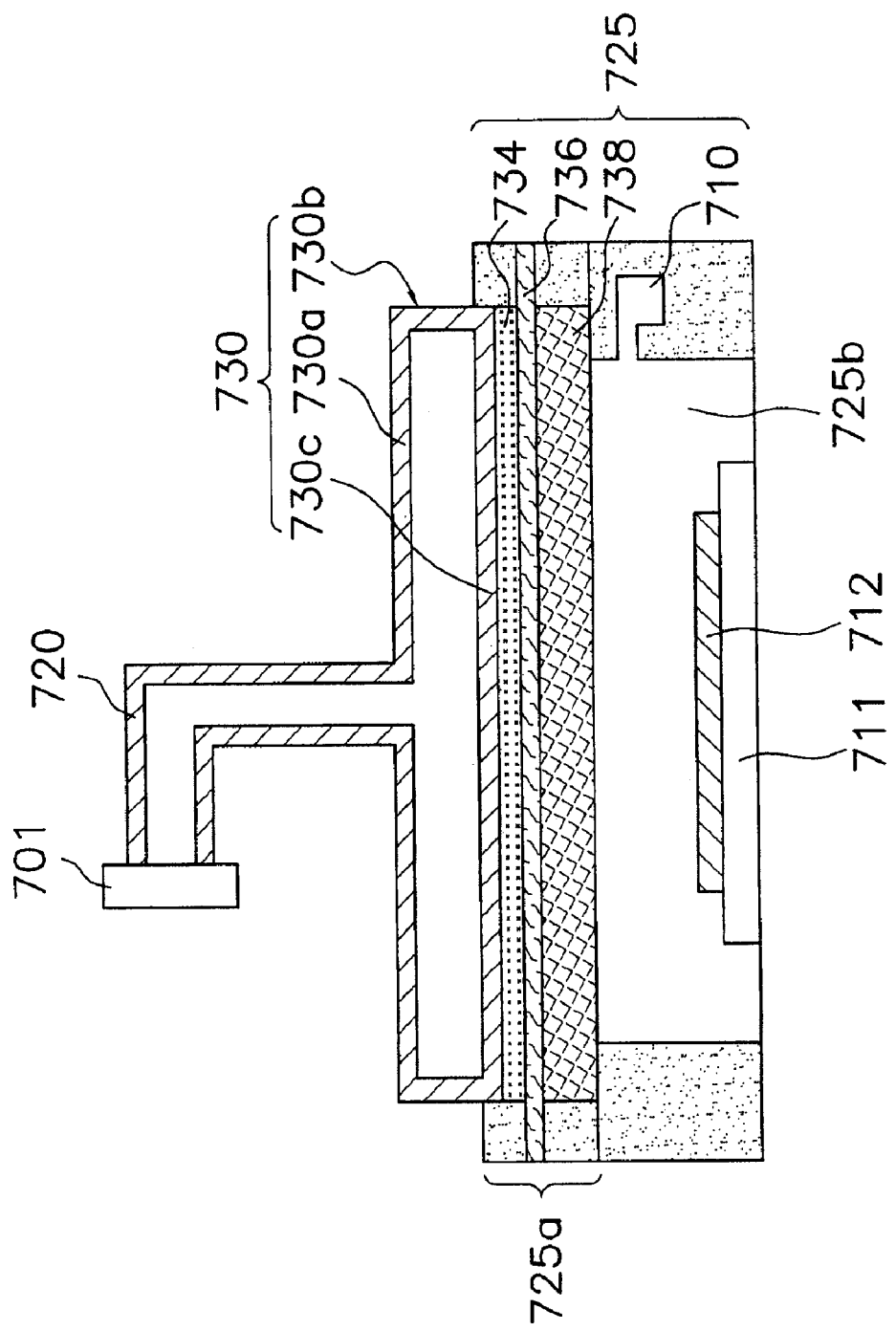
FIG. 37 is a cross-section of the apparatus of FIG. 36 taken along line E–E' of FIG. 36 and perpendicular to the X axis in FIG. 36.
Figure 38:
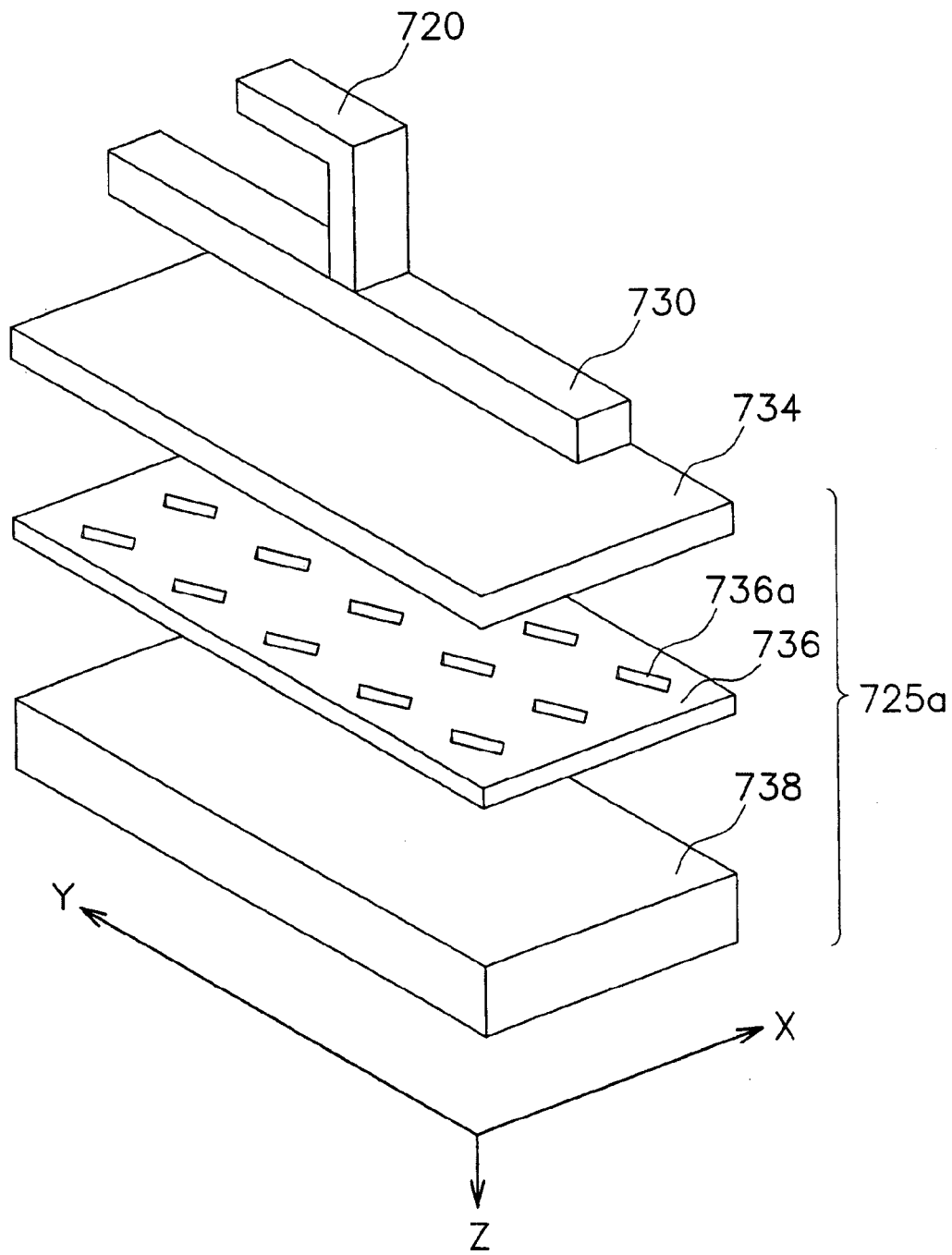
FIG. 38 is an exploded perspective view of portions of the plasma oxidizing and nitriding apparatus shown in FIG. 36.
Figure 39:
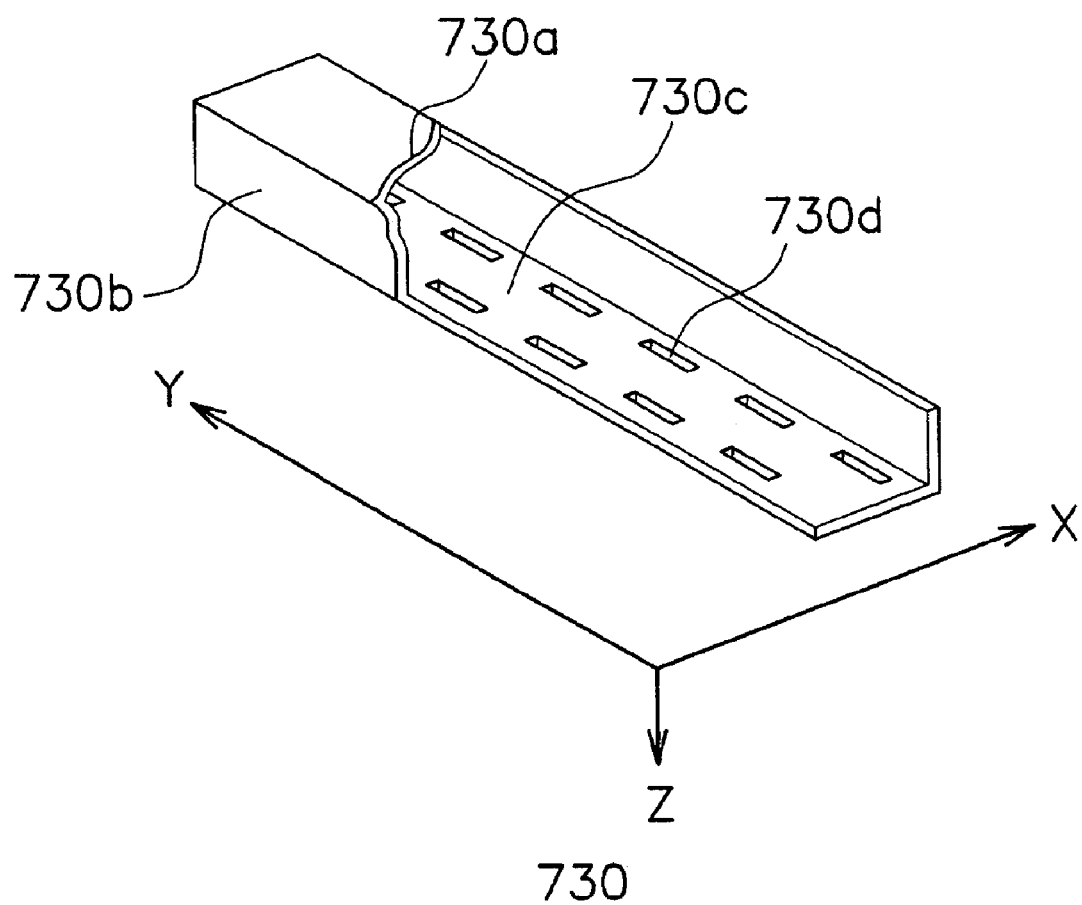
FIG. 39 shows the slot shape of an H-plane slot antenna.

The plasma oxidizing and nitriding apparatus according to an eighth embodiment of the present invention will be described in greater detail with reference to FIGS. 36 to 40. FIG. 36 shows the external appearance of the plasma oxidizing and nitriding apparatus of the eighth embodiment. FIG. 37 is a cross-sectional view of the apparatus of FIG. 36 taken along line E–E' of FIG. 36 and perpendicular to the X axis in FIG. 36. FIG. 38 is an exploded perspective view of portions of the plasma oxidizing and nitriding apparatus shown in FIG. 36. FIG. 39 shows the slot shape of an H-plane slot antenna. FIGS. 36 to 39 correspond to FIGS. 19 to 22, respectively.

Figure 40:
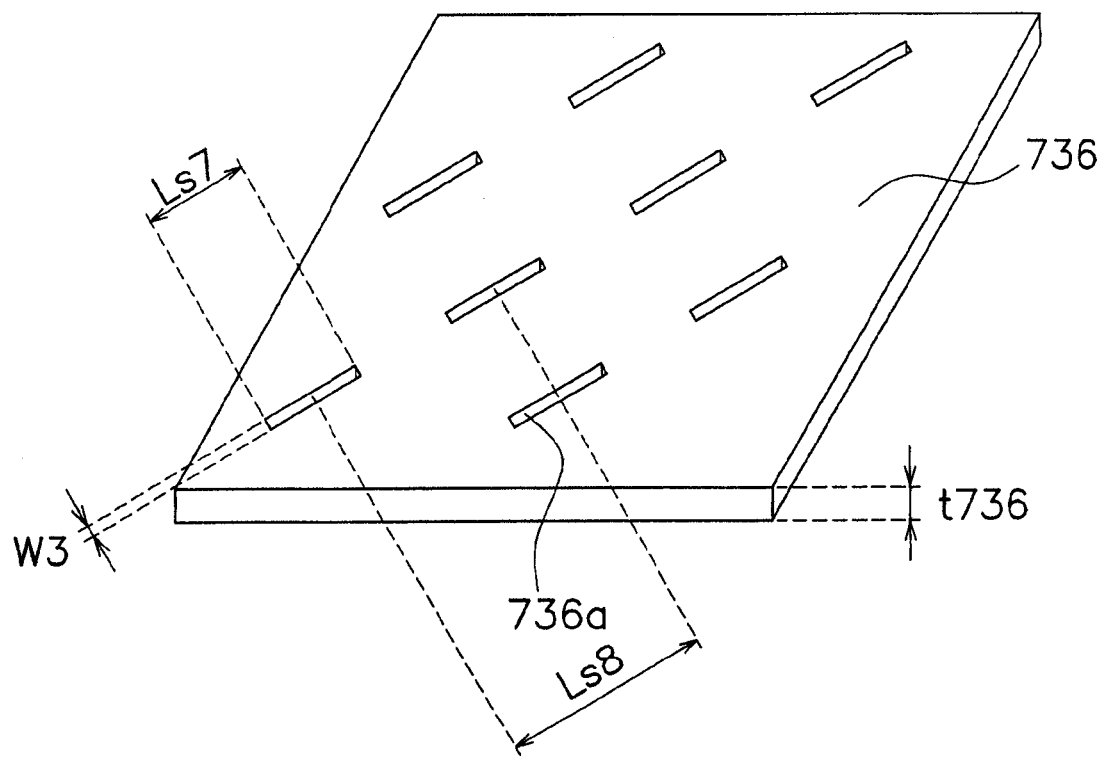

FIG. 40 is a perspective view of a rectangular slot plate 736 having a plurality of slots 736a. The thickness $t_{736}$ of the rectangular slot plate 736 is preferably at least 1 mm in terms of its stiffness or the heat dissipation characteristics. When the thickness of the rectangular slot plate 736 is at least 1 mm, the stiffness thereof and its ability to dissipate heat generated when plasma is produced is improved, and the microwaves introduced from the slot 736a are reduced, so that problems such as electric sparks or anomalous discharge can be reduced. It is preferable that the thickness $t_{736}$ is 3 mm or more, because the above-described problems can be reduced.

Furthermore, the slot length $Ls_7$ in the longer side direction of the rectangular slots 736a is set so as to preferably satisfy $Ls_7 \geq (3/8)\lambda_{734}$, and more preferably satisfy $Ls_7 \geq (1/2)\lambda_{734}$. By setting the slot length $Ls_7$ as above, even if the thickness $t_{736}$ of the slot plate is large, the dampening of the microwaves due to the slots 736a can be easily prevented and the degree of coupling between the microwaves in the rectangular antenna dielectric 734 that have passed through the rectangular slot plate 736 and the microwaves in the rectangular sealing dielectric 738 can be satisfactory. Even more preferably, the slot length $Ls_7$ is set to satisfy $Ls_7 = (1/2)\lambda_{734}$. By doing this, the slot length $Ls_7$ becomes substantially the resonance length of the wavelength $\lambda_{734}$, so that even with the rectangular slot plate 736 having a thickness $t_{736}$ of 1 mm or more, or even if the length $W_3$ in the shorter side direction of the slots 736a is small, sufficient transmission of the microwaves to the rectangular sealing dielectric 738 can be obtained, and the dampening of the microwaves due to the rectangular slot plate 736 can be prevented.

Furthermore, a high degree of coupling between the microwaves introduced from the rectangular antenna dielectric 734 to the rectangular sealing dielectric 738 via the rectangular slot plate 736 and the microwaves in the rectangular sealing dielectric 738 can be obtained. Thus, a higher degree of coupling can be obtained while generation of non-uniform microwaves due to deformation of the slot plate or anomalous discharge, dampening of microwaves or the like is reduced. Therefore, a uniform plasma is formed efficiently, and a thin film can be formed uniformly in a wafer having a large diameter.

It is preferable that the distance $Ls_8$ in the longer side direction between the centers of adjacent slots 736a shown in FIG. 40 is substantially $Ls_8 = \lambda_{734}$, because the phases of the microwaves introduced from each slot 736a to the rectangular sealing dielectric 738 are matched to each other. Furthermore, it is preferable that the dielectric constant in the slot 736a is about the same as that in the rectangular antenna dielectric 734, because reflection of the microwaves when passing through the slots 736a can be reduced.

Note that the relationships between the thickness $t_{736}$ of the rectangular slot plate 736 and the slot length $Ls_7$ of the slots 736a and the transmission and distortion due to heat deformation are same as the experiment results shown in FIG. 14 and FIG. 15.

The relationship between the thickness $t_{736}$ of the rectangular slot plate 736 and the heat deformation distortion should be determined depending on the characteristics of the plasma oxidizing and nitriding apparatus, because it is an inverse relationship to the relationship between the thickness $t_{736}$ and the transmission.

Ninth Embodiment

Figure 41:
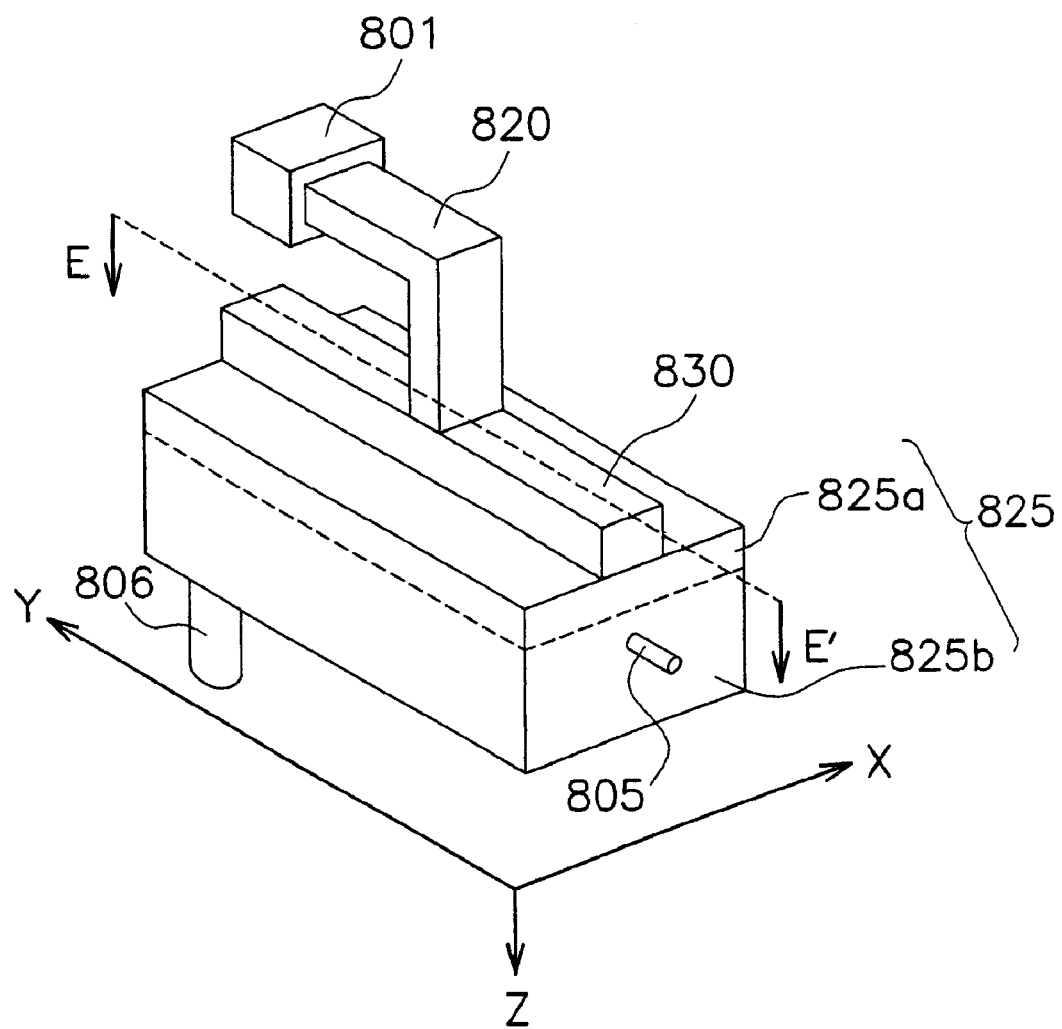
FIG. 41 shows the external appearance of a plasma oxidizing and nitriding apparatus according to a ninth embodiment of the present invention.
Figure 42:
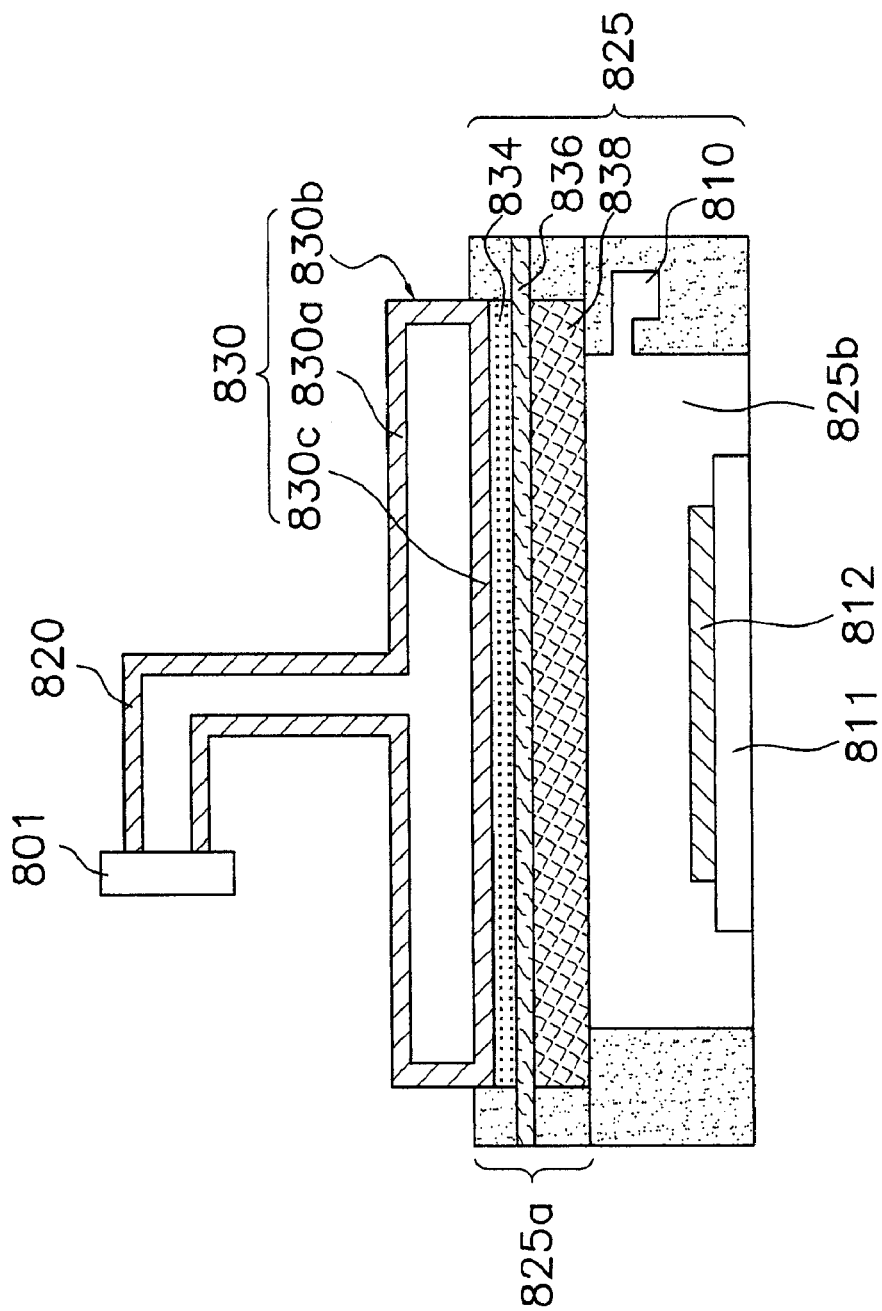
FIG. 42 is a cross-section of the apparatus of FIG. 41 taken along line E–E' of FIG. 41 and perpendicular to the X axis in FIG. 41.

Next, a plasma oxidizing and nitriding apparatus according to a ninth embodiment of the present invention will be described with reference to FIG. 41 to 45. FIG. 41 shows the external appearance of the plasma oxidizing and nitriding apparatus of the ninth embodiment. FIG. 42 is a cross-sectional view of the apparatus of FIG. 41 taken along line E–E' of FIG. 41 and perpendicular to the X axis in FIG. 41.

Figure 43:
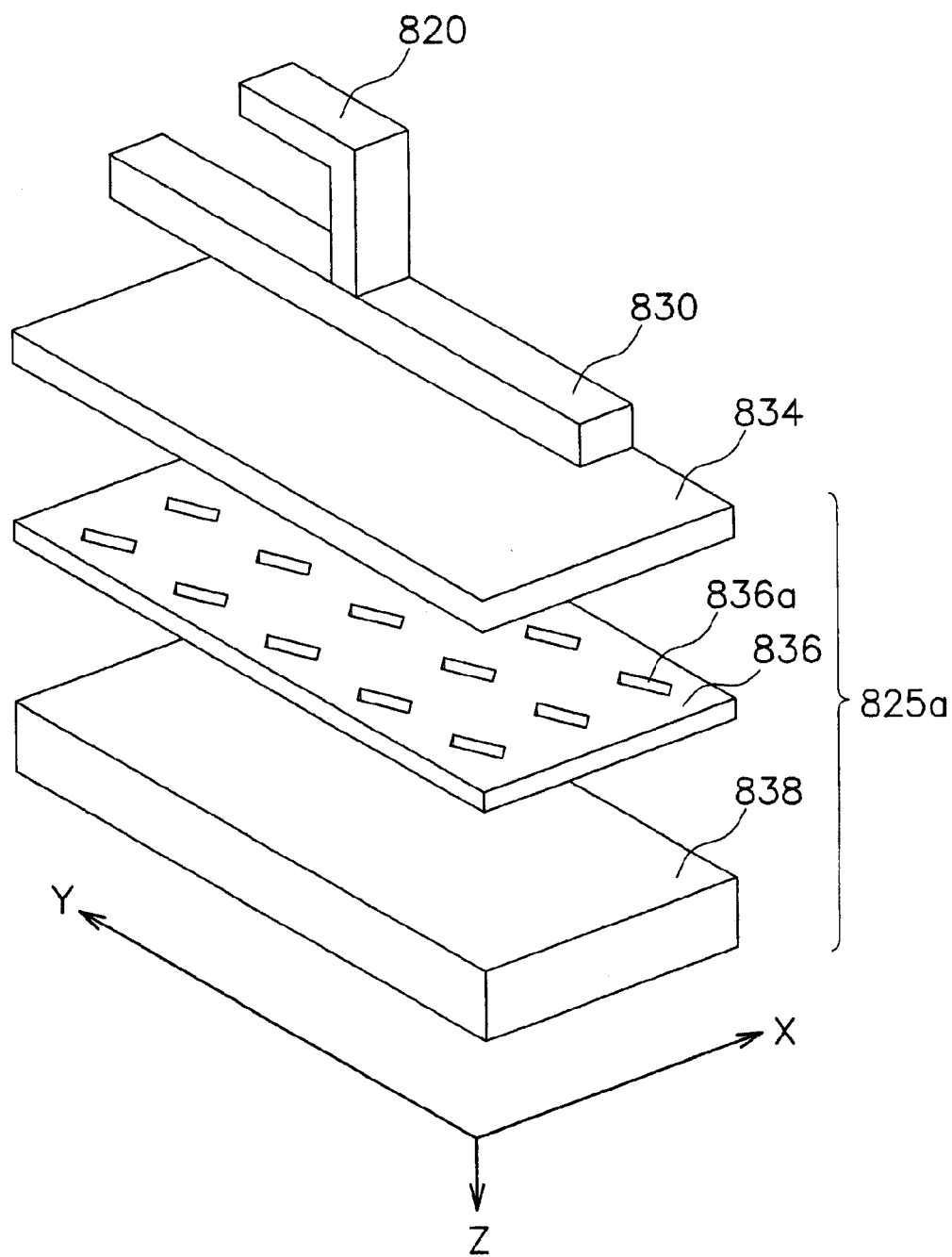
FIG. 43 is an exploded perspective view of portions of the plasma oxidizing and nitriding apparatus shown in FIG. 41.
Figure 44:
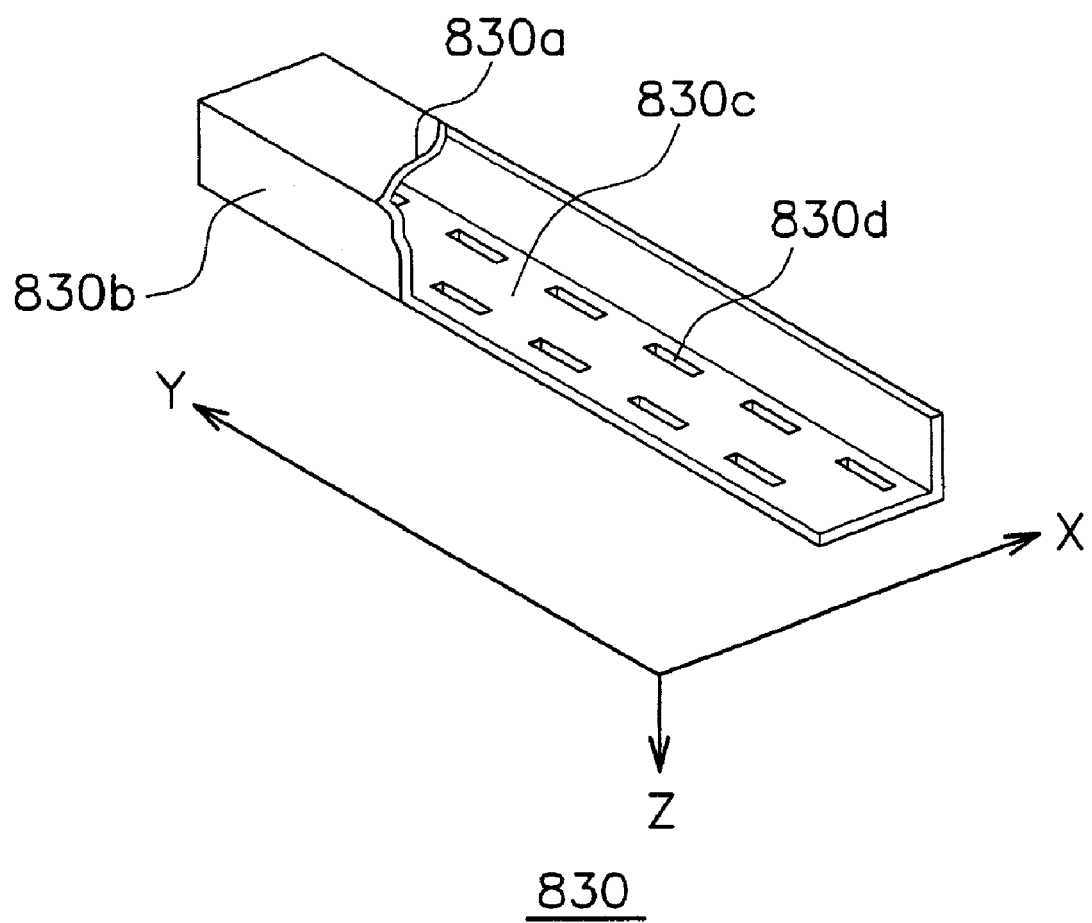
FIG. 44 shows the slot shape of an H-plane slot antenna.
Figure 45:
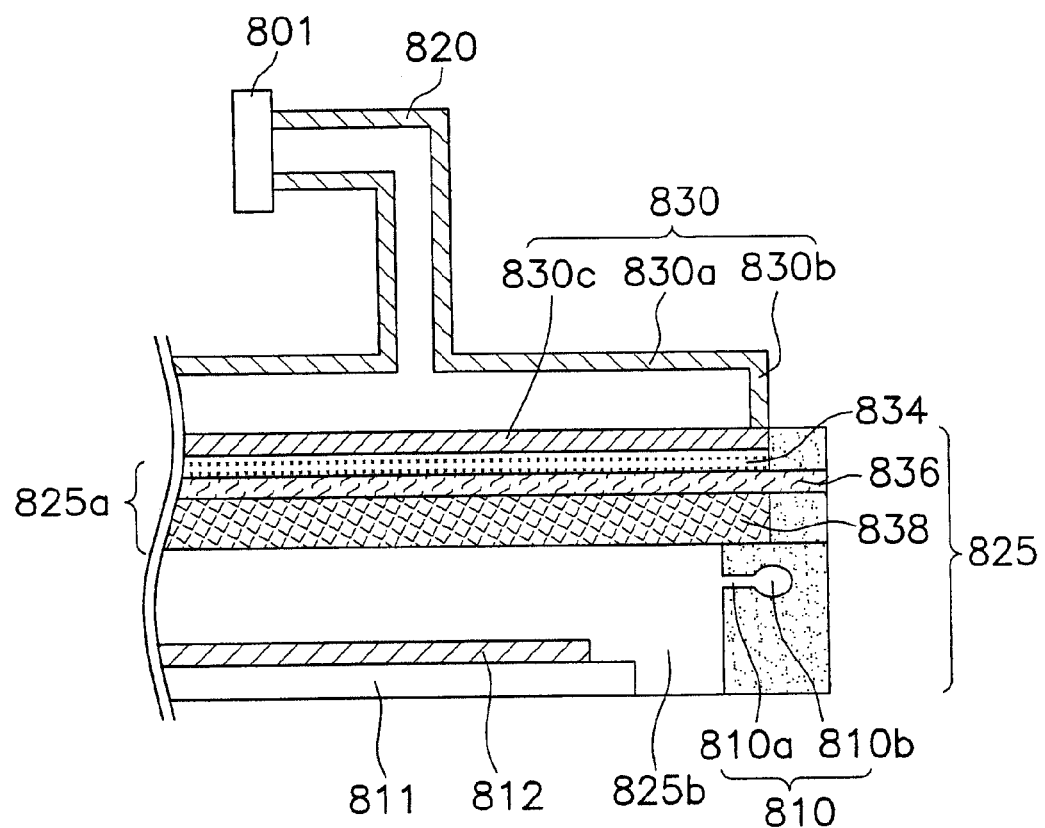
FIG. 45 is a cross-sectional view of the portions shown in FIG. 42.
Figure 46:
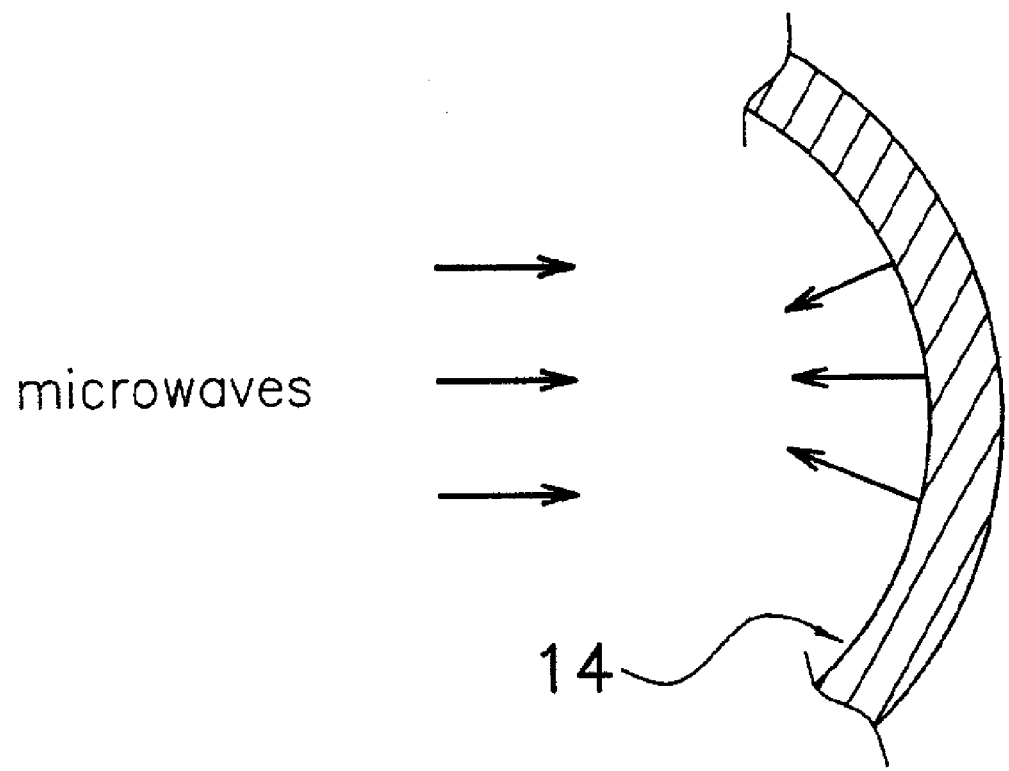
FIG. 46 is a diagram showing the direction in which microwaves travel to and from a cylindrical wall surface.
Figure 47:
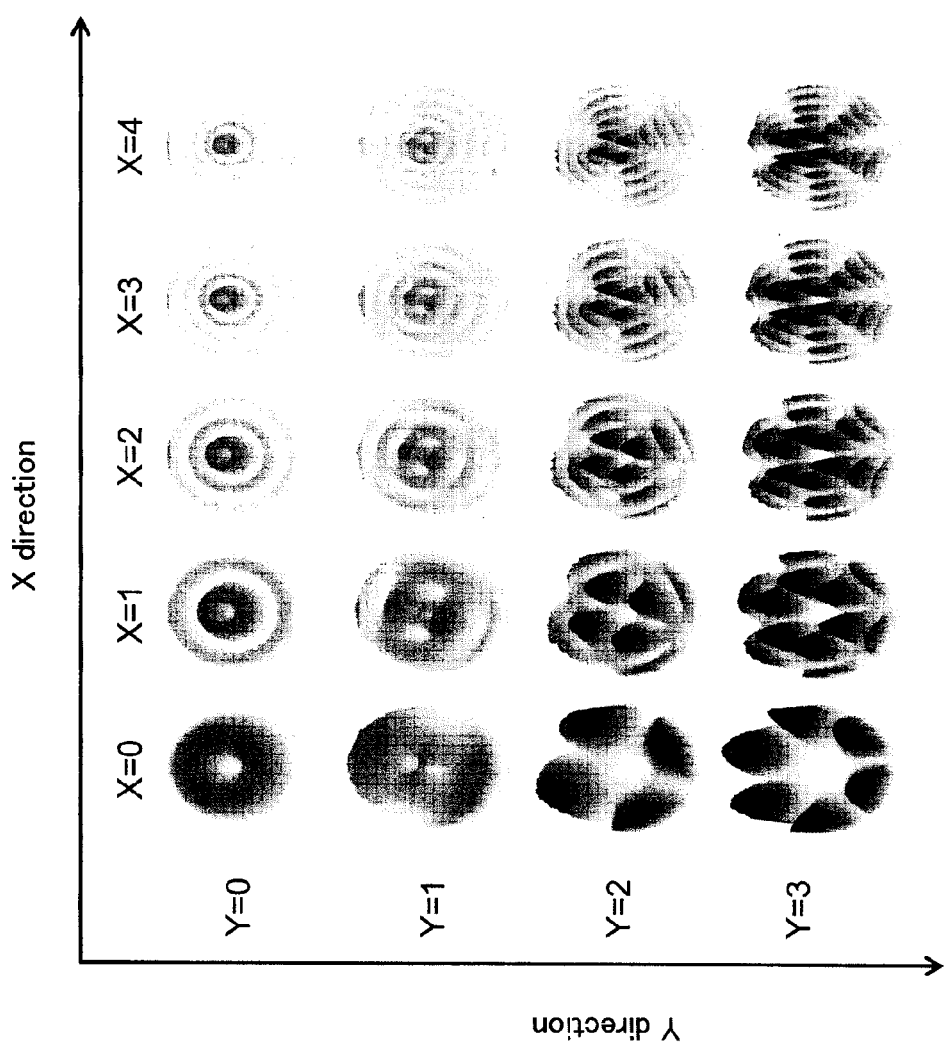
FIG. 47 shows an electric field strength distribution of microwaves in a cylindrical propagation region.

FIG. 43 is an exploded perspective view of portions of the plasma oxidizing and nitriding apparatus shown in FIG. 41. FIG. 44 shows the slot shape of an H-plane slot antenna. FIGS. 41 to 44 correspond to FIGS. 19 to 22, respectively. FIG. 45 is a cross-sectional view of the plasma oxidizing and nitriding apparatus that includes a gas introduction portion 810.

The structure of the gas introduction portion 810 will be described in greater detail. The gas introduction portion 810 is connected to a gas inlet port 805 in order to supply gas such as film-forming gas or the like to the rectangular processing chamber 825b, and has a gas introduction channel 810b and 80 gas introduction nozzles 810a provided in the gas introduction channel 810b. The partial perspective view of the gas introduction portion 810 is the same as shown in FIG. 18. Referring to FIG. 18, the shape of the gas introduction nozzles 810a is set such that $\alpha_1=5$ mm, $\beta_1=1$ mm, and $Lg_1=10$ mm. The shape of the gas introduction channel 810b is set such that $\alpha_2=20$ mm, $\beta_2=20$ mm, and $Lg_2=500$ mm. By setting these as above, the transmission T of the microwaves in the gas introduction nozzles 810a is 0.19%, which is the result from Equation 55 below that has been described above.

$$L_{g1} \geq -\frac{\ln T}{2\pi\sqrt{\left(\frac{1}{2\alpha_1}\right)^2 - \left(\frac{1}{\lambda_{825}}\right)^2}}$$ Equation 55

$\lambda_{825}$: wavelength of microwaves in the rectangular processing chamber 825b, and lnT: the natural logarithm of T.

Furthermore, in a pressure region from 1 to 1000 Torr, the conductance ratio ($C_2/C_1$) is 110 or more. For this reason, in the plasma generating apparatus, the transmission T is substantially smaller than 1%, and the microwaves are substantially blocked from entering the gas introduction portion 810 so that anomalous discharge or abnormal growth of films can be reduced. In addition, the conductance ratio is sufficiently larger than 80, which is the number of gas introduction nozzle 810a, so that the gas can be supplied uniformly to the rectangular processing chamber 825b. Thus, a uniform thin film can be formed.

Furthermore, in the plasma oxidizing and nitriding apparatus of this embodiment, the regions in which microwaves propagate in the planar direction along the surface of a sample 812 to be processed, i.e., the rectangular antenna dielectric 834 and the rectangular sealing dielectric 838, have a rectangular shape, and thus the electric field strength distribution of the microwaves will become uniform, as a whole, along the surface of the sample to be processed. A plasma is generated uniformly by the uniform microwaves, and a uniform thin film can be formed by gas molecules excited and activated by this plasma, and thus a uniform thin film can be formed. Furthermore, even if changes in process conditions such as the flow rate or the composition ratio of the gas or changes in the process conditions due to maintenance or the like occur, the electric field strength distribution will rarely concentrate on one portion because the region in which the microwaves propagate is rectangular. Therefore, the process margins can be increased.

The microwaves whose electric field strength distribution is made uniform by the rectangular antenna dielectric 834 are introduced to the rectangular sealing dielectric 838 uniformly via the rectangular slot plate 836, and the uniformity is enhanced further by the rectangular sealing dielectric 838, which makes it easy to maintain the uniformity of the microwaves.

Other Embodiments (A) The present invention can be applied to compounds other than silicon processes, FPD (flat panel display) processes or the like. Furthermore, the present invention can be applied to microwave irradiation devices, microwave heating devices, or the like that do not use plasma.

(B) The above-described embodiments can be used in combination with each other as required.

Any terms of degree used herein, such as substantially, about and approximately, mean a reasonable amount of deviation of the modified term such that the end result is not significantly changed. These terms should be construed as including a deviation of at least ±5% of the modified term if this deviation would not negate the meaning of the word it modifies.

This application claims priority to Japanese Patent Application Nos. 2003-022073, 2003-022074, 2003-022075, 2003-022076 and 2003-022072. The entire disclosure of Japanese Patent Application Nos. 2003-022073, 2003-022074, 2003-022075, 2003-022076, and 2003-022072 are hereby incorporated herein by reference.

While only selected embodiments have been chosen to illustrate the present invention, it will be apparent to those skilled in the art from this disclosure that various changes and modifications can be made herein without departing from the scope of the invention as defined in the appended claims. Furthermore, the foregoing description of the embodiments according to the present invention are provided for illustration only, and not for the purpose of limiting the invention as defined by the appended claims and their equivalents.

What is claimed is:

1. A plasma processing apparatus for performing plasma processing with respect to a sample to be processed in a reaction vessel, comprising:

microwave generating means that generates microwaves;

a first dielectric that is connected to the microwave generating means, the first dielectric having a rectangular section that extends along the surface of the sample to be processed, and which makes an electric field strength distribution of the microwaves generated from the microwave generating means substantially uniform along the surface to be processed of the sample;

a slot plate that is provided between the reaction vessel and the first dielectric and having a plurality of first slots formed therein, the slot plate maintaining or further enhancing the uniformity of the electric field strength distribution of the microwaves in the first dielectric;

a second dielectric that is provided between the slot plate and the reaction vessel and which maintains or further enhances the uniformity of the electric field strength distribution of the microwaves supplied from the slot plate; and processing means that processes the sample using plasma generated in the reaction vessel by the microwaves.

2. The plasma processing apparatus according to claim 1, wherein a section of the second dielectric that extends along the surface of the sample to be processed is rectangular.

3. The plasma processing apparatus according to claim 1, wherein the reaction vessel is formed such that a section thereof that extends along the surface of the sample to be processed is rectangular.

4. The plasma processing apparatus according to claim 1, wherein the microwave generating means include an antenna in which a section that extends along the surface of the sample to be processed is rectangular, and the antenna is in contact with the first dielectric.

5. The plasma processing apparatus according to claim 1, wherein the size and shape of the first slots are substantially the same and are arranged in substantially the same direction, and a distance $L_1$ between centers of adjacent first slots substantially satisfies the equation $L_1 = n_{L1} \lambda_1$, in which $\lambda_1$ represents the wavelength of microwaves in the first dielectric and $n_{L1}$ represents an integer of 1 or more.

6. The plasma processing apparatus according to claim 1, wherein the first slots have substantially the same size and the same shape, and are arranged in a linearly symmetrical manner with respect to either one of two axes that extend along the slot plate and orthogonal to each other, and a distance $L_2$ between centers of adjacent first slots substantially satisfies the equation $L_2 = n_{L2}(\lambda_1/2)$, in which $\lambda_1$ represents the wavelength of microwaves in the first dielectric and $n_{L2}$ represents an integer of 1 or more.

7. The plasma processing apparatus according to claim 1, wherein two opposing sides of the first dielectric are parallel in a direction that extends along the surface of the sample to be processed, and a distance $L_{d1}$ between the two opposing sides of the first dielectric substantially satisfies the equation $L_{d1} = n_{d1}(\lambda_1/2)$, in which $\lambda_1$ represents the wavelength of microwaves in the first dielectric and $n_{d1}$ represents an integer of 1 or more.

8. The plasma processing apparatus according to claim 2, wherein two opposing sides of the second dielectric are parallel in a direction that extends along the surface of the sample to be processed, and a distance $L_{d2}$ between the two opposing sides of the second dielectric substantially satisfies the equation $L_{d2} = n_{d2}(\lambda_2/2)$, in which $\lambda_2$ represents the wavelength of microwaves in the second dielectric and $n_{d2}$ represents an integer of 1 or more.

9. The plasma processing apparatus according to claim 7, wherein a dielectric constant of the first dielectric is substantially the same as that of the second dielectric.

10. The plasma processing apparatus according to claim 3, wherein two opposing sides of the reaction vessel are parallel in a direction that extends along the surface of the sample to be processed, and a length $L_{p1}$ of the two opposing sides of the reaction vessel substantially satisfies the equation $L_{p1} = n_{p1}(\lambda_p/2)$, in which $\lambda_p$ represents the wavelength of microwaves in the reaction vessel and $n_{p1}$ represents an integer of 1 or more.

11. The plasma processing apparatus according to claim 2, wherein two opposing sides of an introduction surface that is in contact with the first dielectric of the microwave generating means are parallel, a plurality of second slots through which the microwaves are introduced from the microwave generating means to the first dielectric are provided in the introduction surface, the central positions of the second slots are alternately arranged on two axes along the two opposing sides of the introduction surface, and a distance $L_5$ between the two axes substantially satisfies the equation $L_5 = n_{L5}(\lambda_1/2)$, in which $\lambda_1$ represents the wavelength of microwaves in the first dielectric and $n_{L5}$ represents an integer of 1 or more.

12. The plasma processing apparatus according to claim 11, wherein a distance $L_4$ in an axial direction between centers of the second slots alternately arranged on the two axes substantially satisfies the equation $L_4 = n_{L4}(\lambda_1/2)$, in which $\lambda_1$ is the wavelength of microwaves in the first dielectric and $n_{L4}$ is an integer of 1 or more.

13. The plasma processing apparatus according to claim 11, wherein a distance D1 between end faces that extend along the two opposing sides of the introduction surface of the first dielectric and the two axes substantially satisfies the equation $D1 = n_{D1}(\frac{1}{4})\lambda_1$, in which $\lambda_1$ represents the wavelength of microwaves in the first dielectric and $n_{D1}$ represents an integer of 1 or more.

14. The plasma processing apparatus according to claim 1, wherein a thickness of the slot plate is 1 mm or more.

15. The plasma processing apparatus according to claim 14, wherein a thickness of the slot plate is 3 mm or more.

16. The plasma processing apparatus according to claim 14, wherein the first slots of the slot plate are rectangular, and a length $L_7$ of longer sides of the first slots substantially satisfies the equation $L_7 \geq (\frac{3}{8})\lambda_1$, in which $\lambda_1$ represents the wavelength of microwaves in the first dielectric.

17. The plasma processing apparatus according to claim 16, wherein the length $L_7$ of the longer sides of the first slots substantially satisfies the equation $L_7 \geq (\frac{1}{2})\lambda_1$ represents the wavelength of microwaves introduced to the slot plate.

18. The plasma processing apparatus according to claim 17, wherein the length $L_7$ of the longer sides of the first slots substantially satisfies the equation $L_7 \geq (\frac{1}{2})\lambda_1$, in which $\lambda_1$ represents the wavelength of microwaves introduced to the slot plate.

19. A plasma processing apparatus for performing plasma processing with respect to a sample to be processed in a reaction vessel, comprising:

microwave generating means for generating microwaves;

a first dielectric that is connected to the microwave generating means, the first dielectric having a section that is a rectangular shape in which two opposing sides thereof are parallel to each other, and extends along a surface of a sample to be processed and makes an electric field strength distribution of microwaves generated from the microwave generating means substantially uniform along a surface of the sample to be processed; and processing means that processes the sample using plasma generated in the reaction vessel by the microwaves;

wherein a distance $L_{d11}$ between the two opposing sides of the first dielectric in a direction along the surface of the sample to be processed substantially satisfies the equation $L_{d11} = n_{d11}(\lambda_1/2)$, in which $\lambda_1$ represents the wavelength of microwaves in the first dielectric and $n_{d11}$ represents an integer of 1 or more.

20. The plasma processing apparatus according to claim 19, further comprising:
- a slot plate that is provided between the reaction vessel and the first dielectric and in which at least one slot is formed, the slot plate maintaining or further enhancing uniformity of the electric field strength distribution of microwaves in the first dielectric; and
- a second dielectric that is provided between the slot plate and the reaction vessel, the second dielectric having a section that is a rectangular shape in which two opposing sides are parallel to each other, extends along a surface of a sample to be processed, and maintains or further enhances uniformity of the electric field strength distribution of microwaves supplied from the slot plate;
- wherein a distance $L_{d22}$ between the two opposing sides of the second dielectric in a direction that extends along the surface of the sample to be processed substantially satisfies the equation $L_{d22}=n_{d22}(\lambda_2/2)$, wherein $\lambda_2$ represents the wavelength of microwaves in the second dielectric and $n_{d22}$ represents an integer of 1 or more.

21. The plasma processing apparatus according to claim 19, wherein
- a section of the reaction vessel is a rectangular shape that extends along a surface of the sample to be processed and in which two opposing sides of the reaction vessel are parallel to each other, and a length $L_{p2}$ of the two opposing sides of the reaction vessel substantially satisfies the equation $L_{p2}=n_{p2}(\lambda_p/2)$, in which $\lambda_2$ represents the wavelength of microwaves in the reaction vessel and $n_{p2}$ represents an integer of 1 or more.

22. The plasma processing apparatus according to claim 20, wherein
- a dielectric constant of the first dielectric is substantially the same as that of the second dielectric.

23. The plasma processing apparatus according to claim 20, wherein
- a wavelength $\lambda_1$ of microwaves in the first dielectric and a wavelength $\lambda_2$ of microwaves in the second dielectric substantially satisfy the equation $\lambda_1/2=m(\frac{1}{2})\lambda_2$, in which $\lambda_1$ represents the wavelength of microwaves in the first dielectric, $\lambda_2$ represents the wavelength of a microwave in the second dielectric, and m represents an integer of 1 or more.

24. The plasma processing apparatus according to claim 20, wherein
- a wavelength $\lambda_1$ of microwaves in the first dielectric, a wavelength $\lambda_2$ of microwaves in the second dielectric, and a wavelength $\lambda_p$ of microwaves in the reaction vessel substantially satisfy the equations $\lambda_1/2=m(\frac{1}{2})\lambda_2$ and $\lambda_1/2=k(\frac{1}{2})\lambda_p$, in which $\lambda_1$ represents the wavelength of microwaves in the first dielectric, $\lambda_2$ represents the wavelength of microwaves in the second dielectric, $\lambda_p$ represents the wavelength of microwaves in the reaction vessel, and m, k represent an integer of 1 or more.

25. A plasma processing apparatus for performing plasma processing with respect to a sample to be processed in a reaction vessel, comprising:
- microwave generating means for generating microwaves;
- a dielectric that is connected to the microwave generating means, is formed into a plate-like shape that extends along a surface of the sample to be processed, and makes an electric field strength distribution of the microwaves generated from the microwave generating means substantially uniform along a surface of the sample to be processed; and
- processing means that processes the sample using plasma generated in the reaction vessel by the microwaves;
- wherein a plurality of introduction portions through which the microwaves are introduced from the microwave generating means to the dielectric are provided in an introduction surface that is in contact with the dielectric, and the central positions of the introduction portions are arranged on a plurality of axes on the introduction surface that extend in the same direction; and
- the dielectric is formed such that a section thereof that extends along the surface of the sample to be processed is rectangular, and a distance $L_8$ between the axes substantially satisfies the equation $L_8=n_{L8}(\lambda_1/2)$, in which $\lambda_1$ represents the wavelength of microwaves in the dielectric and $n_{L8}$ represents an integer of 1 or more.

26. The plasma processing apparatus according to claim 25, wherein
- the dielectric is formed such that a section that extends along the surface of the sample to be processed is rectangular or square, and the axes extend in a direction along two opposing sides of the dielectric.

27. The plasma processing apparatus according to claim 26, wherein
- the introduction surface is formed into a rectangular or square shape, and the axes are linearly symmetrical with respect to a central axis that extends toward the sides of the introduction surface.

28. The plasma processing apparatus according to claim 27, wherein
- a distance D2 between end faces of the dielectric and the axes substantially satisfies the equation $D2=n_{D2}(\frac{1}{4})\lambda_1$, wherein $\lambda_1$ represents the wavelength of microwaves in the dielectric and $n_{D2}$ represents an integer of 1 or more.

29. The plasma processing apparatus according to claim 26, wherein
- a section of the dielectric that extends along the surface of the sample to be processed is rectangular, the introduction portions are alternately arranged on the two axes, and a distance $L_9$ in an axial direction between the centers of the introduction portions alternately arranged on the two axes substantially satisfies the equation $L_9=n_{L9}(\lambda_1/2)$, in which $\lambda_1$ represents the wavelength of microwaves in the dielectric and $n_{L9}$ represents an integer of 1 or more.

30. The plasma processing apparatus according to claim 25, wherein
- an H-branched waveguide is further provided between the microwave generating means and the dielectric, and the introduction surface is divided into at least two.

31. The plasma processing apparatus according to claim 30, wherein
- when the microwaves introduced from each of the at least two divided introduction surfaces to the dielectric have a phase identical to the other introduction surfaces, a distance $L_{10}$ between the introduction portions in adjacent introduction surfaces substantially satisfies the equation $L_{10}=2n_{L10}(\lambda_1/2)$, in which $\lambda_1$ represents the wavelength of microwaves in the dielectric and $n_{L10}$ represents an integer of 1 or more.

32. The plasma processing apparatus according to claim 30, wherein
- when the microwaves introduced from each of the at least two divided introduction surfaces to the dielectric have opposite phases, a distance $L_{10}$ between the introduction portions in adjacent introduction surfaces substantially satisfies the equation $L_{10}=(2n_{L10}+1)(\lambda_1/2)$, in which $\lambda_1$ represents the wavelength of microwaves in the dielectric and $n_{L10}$ represents an integer of 1 or more.

33. The plasma processing apparatus according to claim 25, wherein
an E-branched waveguide is further provided between the microwave generating means and the dielectric, and the introduction surface is divided into at least two.

34. The plasma processing apparatus according to claim 33, wherein
when the microwaves introduced from each of the at least two divided introduction surfaces to the dielectric have identical phases, a distance $L_{10}$ between the introduction portions in adjacent introduction surfaces substantially satisfies the equation $L_{10}=(2n_{10}+1)(\lambda_1/2)$, in which $\lambda_1$ represents the wavelength of microwaves in the dielectric and $n_{L10}$ represents an integer of 1 or more.

35. The plasma processing apparatus according to claim 33, wherein
when the microwaves introduced from each of the at least two divided introduction surfaces to the dielectric have opposite phases, a distance $L_{10}$ between the introduction portions in adjacent introduction surfaces substantially satisfies the equation $L_{10}=2n_{L10}(\lambda_1/2)$, in which $\lambda_1$ represents the wavelength of microwaves in the dielectric and $n_{L10}$ represents an integer of 1 or more.

36. The plasma processing apparatus according to claim 25, wherein the antinodes or nodes of the microwaves in the dielectric are positioned at each position of the axes.

37. A plasma processing apparatus for performing plasma processing with respect to a sample to be processed in a reaction vessel, comprising:
microwave generating means for generating microwaves;
a slot plate that is provided between the microwave generating means and the reaction vessel and in which a plurality of slots are formed, and that makes an electric field strength distribution of the microwaves generated from the microwave generating means substantially uniform along the surface of the sample to be processed;
a first dielectric that is provided between the slot plate and the reaction vessel, and maintains or further enhances uniformity of the electric field strength distribution of the microwaves supplied from the slot plate
a second dielectric that is provided between the microwave generating means and the slot plate; and
processing means that processes the sample using plasma generated in the reaction vessel by the microwaves.
wherein a thickness of the slot plate is 1 mm or more.

38. The plasma processing apparatus according to claim 37, wherein
a thickness of the slot plate is 3 mm or more.

39. The plasma processing apparatus according to claim 37, wherein
the slots of the slot plate are rectangular, and a length $L_{11}$ of longer sides of the slots substantially satisfies the equation $L_{11} \geq (3/8)\lambda_A$, in which $\lambda_A$ represents the wavelength of microwaves introduced to the slot plate.

40. The plasma processing apparatus according to claim 39, wherein
the length $L_{11}$ of the longer sides of the slots substantially satisfies the equation $L_{11} \geq (1/2)\lambda_A$, in which $\lambda_A$ represents the wavelength of microwaves introduced to the slot plate.

41. The plasma processing apparatus according to claim 40, wherein
the length $L_{11}$ of the longer sides of the slots substantially satisfies the equation $L_{11}=(1/2)\lambda_{A, \text{ in which }} \lambda_A$ represents the wavelength of microwaves introduced to the slot plate.

42. The plasma processing apparatus according to claim 37, wherein
sections along the surface to be processed of the sample of the first dielectric and the second dielectric are rectangular.

43. The plasma processing apparatus according to claim 42, wherein
the slots have substantially a same size and a same shape and are arranged in substantially the same direction, and a distance $L_{13}$ between centers of adjacent slots substantially satisfies the equation $L_{13}=n_{L13}\lambda_2$, wherein $\lambda_1$ represents the wavelength of microwaves in the second dielectric, and $n_{L13}$ represents an integer of 1 or more.

44. The plasma processing apparatus according to claim 42, wherein
the slots have substantially the same size and same shape and are arranged in a linearly symmetrical manner with respect to either one of the axes that extend along the slot plate and orthogonal to each other, and a distance $L_{14}$ between centers of adjacent slots substantially satisfies the equation $L_{14}=n_{L14}(\lambda_2/2)$, in which $\lambda_2$ represents the wavelength of microwaves in the second dielectric, and $n_{L14}$ represents an integer of 1 or more.

45. A plasma processing apparatus comprising:
microwave generating means;
a reaction vessel that is connected to the microwave generating means, in which a plasma is generated by microwaves generated from the microwave generating means;
an introduction channel through which a gas is supplied to the reaction vessel; and
at least one nozzle connecting the reaction vessel and the introduction channel,
wherein a transmission T of the microwaves from the reaction vessel to the nozzle substantially satisfies the equation $$L_{g1} \geq -\frac{\ln T}{2\pi\sqrt{\left(\frac{1}{2\alpha_1}\right)^2 - \left(\frac{1}{\lambda_{308}}\right)^2}}$$

wherein $L_{g1}$ represents the length of a nozzle in a direction in which gas therein travels, $\alpha_1$ represents an outer diameter of the nozzle in a direction perpendicular to the direction in which the gas therein travels, lnT represents the natural logarithm of T, and $\lambda$ represents the wavelength of microwaves in the reaction vessel.

46. The plasma processing apparatus according to claim 45, wherein
a ratio of a conductance $C_1$ of a gas in the nozzle and a conductance $C_2$ of a gas in the introduction channel substantially satisfies the equation $$\frac{C_2}{C_1} \geq X$$

wherein X is the number of the nozzles connected to the introduction channel.

47. The plasma processing apparatus according to claim 46, wherein the transmission T is 1% or less.

48. The plasma processing apparatus according to claim 45, further comprising:
a first dielectric that is connected to the microwave generating means, the first dielectric section having a rectangular section that extends along a surface of the sample to be processed and that makes an electric field strength distribution of the microwaves generated from the microwave generating means substantially uniform along the surface to be processed of the sample that is to be subjected to plasma processing in the reaction vessel; and processing means that processes the sample using the plasma.

49. The plasma processing apparatus according to claim 48, further comprising:

a slot plate that is provided below the first dielectric and in which at least one slot is formed, and that retains or further enhances the uniformity of the electric field strength distribution of the microwaves in the first dielectric; and a second dielectric having a rectangular section that extends along a surface of the sample to be processed, is provided between the slot plate and the reaction vessel, and which maintains or further enhances the uniformity of the electric field strength distribution of the microwaves supplied from the slot plate.

* * * * *

UNITED STATES PATENT AND TRADEMARK OFFICE
CERTIFICATE OF CORRECTION

PATENT NO. : 6,998,565 B2
APPLICATION NO. : 10/707989
DATED : February 14, 2006
INVENTOR(S) : Toshikuni Shinohara It is certified that error appears in the above-identified patent and that said Letters Patent is hereby corrected as shown below:

In column 44, line 38, please insert --, in which $\lambda_1$-- between "$L_7 \geq (1/2) \lambda_1$" and "represents".

In column 44, line 43, please change "$\geq$" to --=--.

In column 46, line 34, please change "26" to --25--.

In column 47, line 12, please change "$(2n_{10}+1)$" to --$(2n_{L10}+1)$--.

In column 47, line 45, please change the period after the word "microwave" to a comma --,--.

In column 47, line 65, please change the subscripted ", in which λA" to regular style font as --, in which $\lambda_A$--.

In column 48, line 12, please change "$\lambda_1$" to --$\lambda_2$--.

In column 48, line 38, please change the equation from

" $$L_{g1} \geq -\frac{\ell nT}{2\pi\sqrt{(\frac{1}{2\alpha_1})^2 - (\frac{1}{\lambda\,308})^2}}$$ " to -- $$L_{g1} \geq -\frac{\ell nT}{2\pi\sqrt{(\frac{1}{2\alpha_1})^2 - (\frac{1}{\lambda})^2}}$$ --.

Signed and Sealed this

Seventeenth Day of October, 2006

JON W. DUDAS
*Director of the United States Patent and Trademark Office*